(12) United States Patent
Shinohara et al.

(10) Patent No.: US 9,831,799 B2
(45) Date of Patent: Nov. 28, 2017

(54) POWER CONVERTER DEVICE HAVING COOLANT FLOW PATHS

(75) Inventors: Shuichi Shinohara, Hitachinaka (JP); Kenichiro Nakajima, Hitachinaka (JP); Kaname Sasaki, Abiko (JP)

(73) Assignee: Hitachi Automotive-Systems, Ltd., Hitachinaka-shi (JP)

( * ) Notice: Subject to any disclaimer, the term of this patent is extended or adjusted under 35 U.S.C. 154(b) by 1377 days.

(21) Appl. No.: 13/805,590

(22) PCT Filed: Jun. 21, 2011

(86) PCT No.: PCT/JP2011/064138
§ 371 (c)(1),
(2), (4) Date: Jan. 31, 2013

(87) PCT Pub. No.: WO2011/162241
PCT Pub. Date: Dec. 29, 2011

(65) Prior Publication Data
US 2013/0128643 A1 May 23, 2013

(30) Foreign Application Priority Data

Jun. 21, 2010 (JP) ................................. 2010-140724

(51) Int. Cl.
*H05K 5/04* (2006.01)
*H05K 7/20* (2006.01)
(Continued)

(52) U.S. Cl.
CPC ............ *H02M 7/537* (2013.01); *H01L 24/36* (2013.01); *H01L 24/40* (2013.01); *H02M 7/003* (2013.01);
(Continued)

(58) Field of Classification Search
CPC . H02M 7/537; H02M 7/003; H02M 2001/327
(Continued)

(56) References Cited

U.S. PATENT DOCUMENTS 5,901,036 A * 5/1999 Arz ..................... H05K 7/20254
165/80.4
6,865,080 B2 3/2005 Radosevich et al.
(Continued)

FOREIGN PATENT DOCUMENTS

JP 2005-516570 A 6/2005
JP 2006-202899 A 8/2006
(Continued)

OTHER PUBLICATIONS

International Search Report dated Sep. 13, 2011 w/ English translation (seven (7) pages).

*Primary Examiner* — Adolf Berhane
*Assistant Examiner* — Nusrat Quddus
(74) *Attorney, Agent, or Firm* — Crowell & Moring LLP

(57) ABSTRACT

A power converter device includes first through third semiconductor modules provided for phases of a three-phase inverter circuit, and incorporating upper and lower arms series circuit, and a flow path forming cabinet in a rectangular prism shape having an electric equipment containing space and a coolant flow path formed to surround the electric equipment containing space, the coolant flow path includes a first flow path provided along a first side face of the flow path forming cabinet, a second flow path provided along a second side face contiguous to one side of the first side face and connected to one end of the first flow path, and a third flow path provided along a third side face contiguous to other side of the first side face and connected to other end of the first flow path.

8 Claims, 41 Drawing Sheets

(51) Int. Cl.
  *H02M 7/537* (2006.01)
  *H02M 7/00* (2006.01)
  *H01L 23/00* (2006.01)
  *H02M 1/32* (2007.01)

(52) U.S. Cl.
  CPC .......... *H05K 7/20927* (2013.01); *H01L 2224/40137* (2013.01); *H01L 2924/13055* (2013.01); *H01L 2924/13091* (2013.01); *H01L 2924/181* (2013.01); *H02M 2001/327* (2013.01)

(58) Field of Classification Search
  USPC ......... 180/41, 54.1; 361/676, 690, 704, 707, 361/710; 363/131–133, 141, 307
  See application file for complete search history.

(56) References Cited

U.S. PATENT DOCUMENTS

| | | | | |
|---|---|---|---|---|
| 7,400,487 | B1* | 7/2008 | Bitar | F41H 11/12 361/230 |
| 7,456,602 | B2* | 11/2008 | Hampo | B60L 11/1868 318/105 |
| 7,567,446 | B2* | 7/2009 | Sugino | H02M 7/003 363/34 |
| 7,800,921 | B2* | 9/2010 | Zhu | H02M 3/33507 361/730 |
| 7,839,641 | B2* | 11/2010 | Baba | H01L 23/24 165/104.19 |
| 7,886,811 | B2* | 2/2011 | Higashiyama | B23K 1/0012 165/173 |
| 8,159,823 | B2* | 4/2012 | Murakami | H01L 23/473 180/243 |
| 8,203,839 | B2* | 6/2012 | Dede | F28F 7/02 361/677 |
| 8,400,775 | B2* | 3/2013 | Ward | H02M 7/003 361/763 |
| 2001/0033477 | A1* | 10/2001 | Inoue | H01L 23/4006 361/718 |
| 2002/0195286 | A1* | 12/2002 | Shirakawa | B60L 11/1803 180/65.1 |
| 2003/0063442 | A1* | 4/2003 | Kimoto | H02M 7/003 361/704 |
| 2003/0133318 | A1 | 7/2003 | Radosevich et al. | |
| 2005/0270745 | A1* | 12/2005 | Chen | H01F 27/2804 361/707 |
| 2006/0243422 | A1* | 11/2006 | Sakai | H01L 23/473 165/80.4 |
| 2007/0096278 | A1* | 5/2007 | Nakatsu | H01L 23/473 257/678 |
| 2008/0049476 | A1* | 2/2008 | Azuma | B60L 3/12 363/131 |
| 2008/0066888 | A1* | 3/2008 | Tong | H01L 23/3677 165/80.3 |
| 2008/0186751 | A1* | 8/2008 | Tokuyama | H01L 23/473 363/131 |
| 2009/0231811 | A1* | 9/2009 | Tokuyama | H01L 23/36 361/699 |
| 2010/0108416 | A1* | 5/2010 | Lind | B60K 1/04 180/65.31 |
| 2013/0021749 | A1* | 1/2013 | Nakajima | H02M 7/003 361/689 |
| 2013/0128643 | A1* | 5/2013 | Shinohara | H05K 7/20927 363/131 |
| 2013/0265808 | A1* | 10/2013 | Ishii | H02M 1/12 363/97 |
| 2014/0043765 | A1* | 2/2014 | Gohara | H01L 23/3735 361/699 |
| 2015/0029666 | A1* | 1/2015 | Kosuga | H02M 3/28 361/699 |
| 2015/0163961 | A1* | 6/2015 | Hara | H02M 7/003 361/699 |
| 2015/0195957 | A1* | 7/2015 | Ohoka | H05K 7/20927 361/702 |
| 2015/0382501 | A1* | 12/2015 | Horiuchi | H05K 7/20927 363/131 |
| 2017/0040907 | A1* | 2/2017 | Goto | H02M 3/28 |

FOREIGN PATENT DOCUMENTS

| | | |
|---|---|---|
| JP | 2007-28785 A | 2/2007 |
| JP | 2007-159254 A | 6/2007 |
| JP | 2009-278712 A | 11/2009 |
| JP | 2010-119179 A | 5/2010 |
| JP | 2010-119300 A | 5/2010 |

* cited by examiner

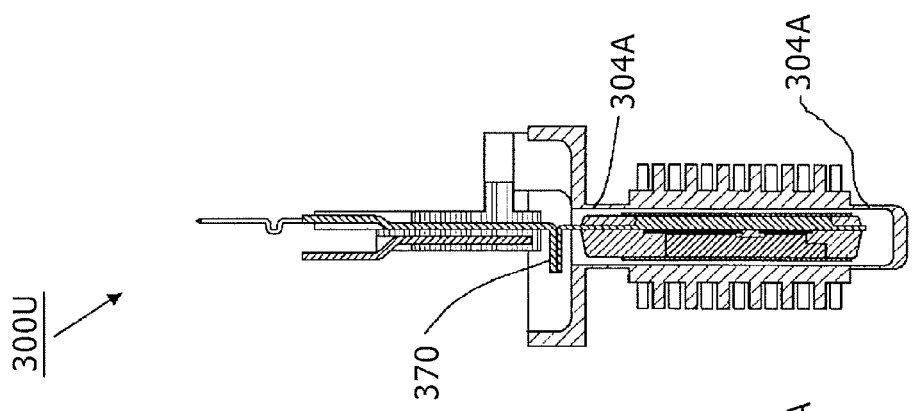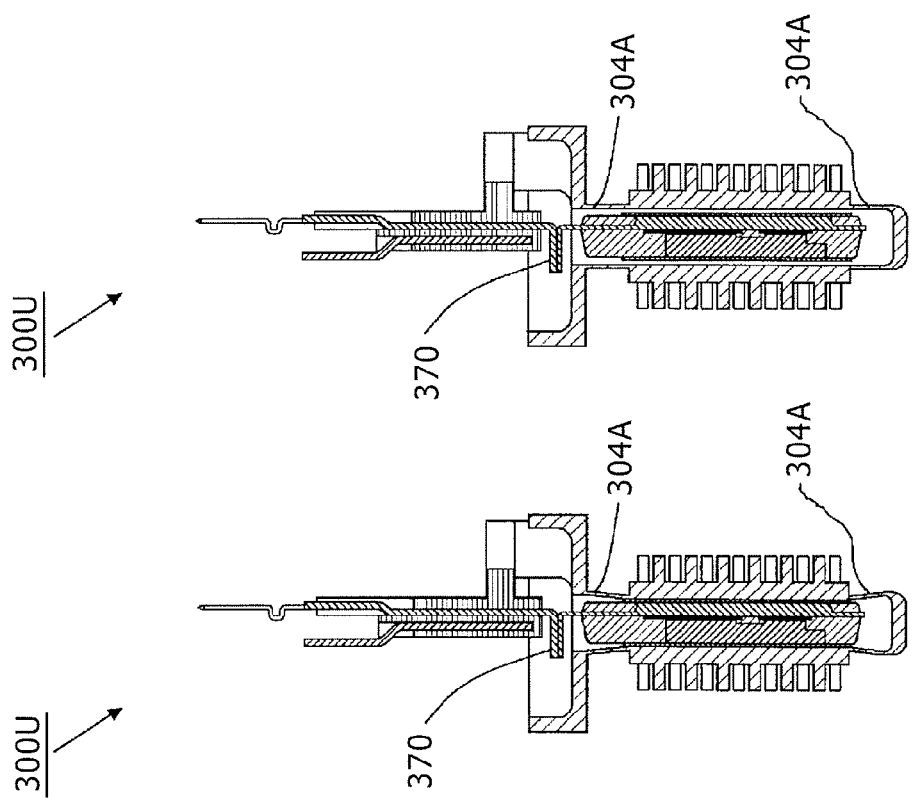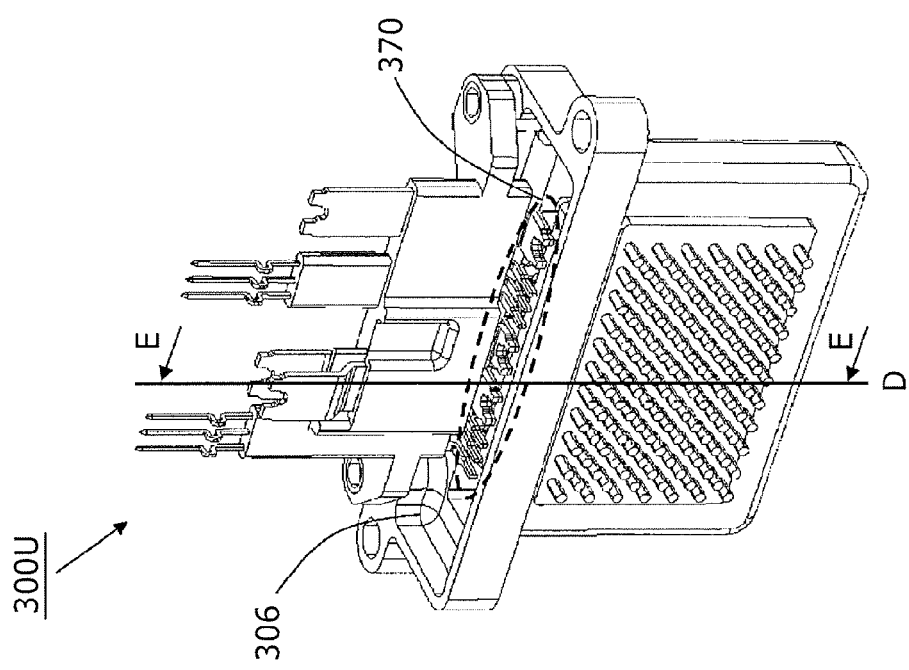

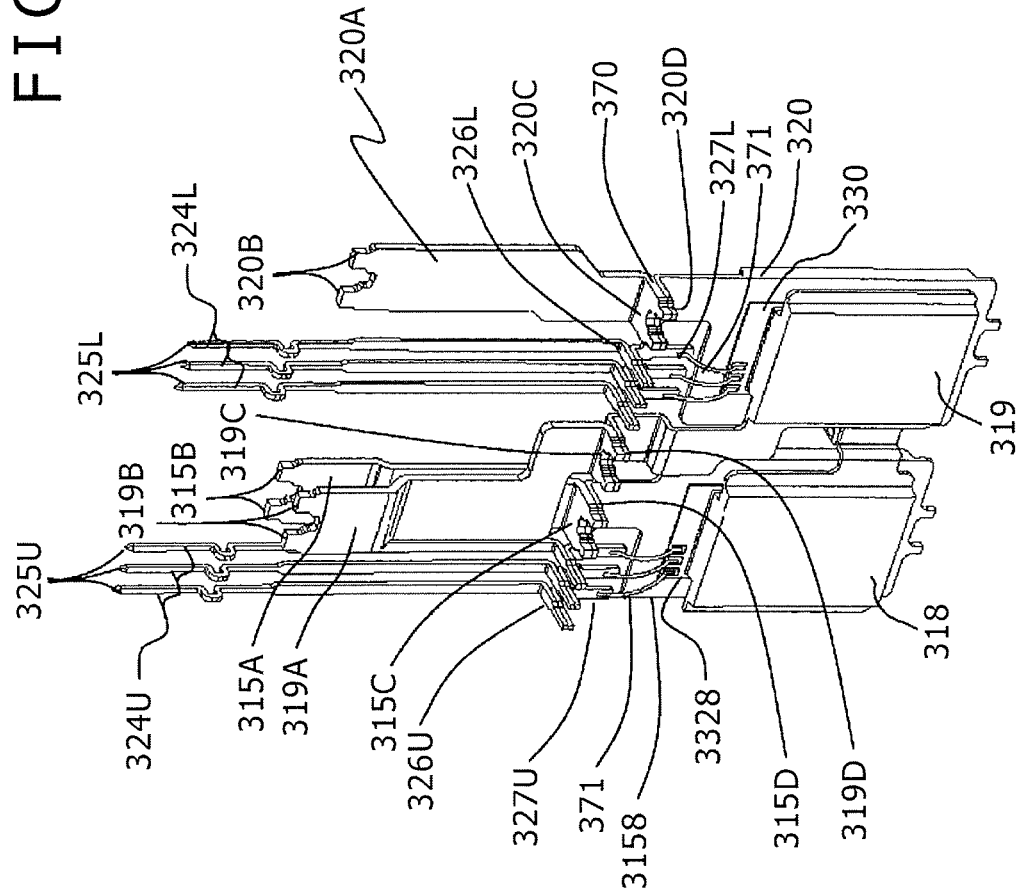

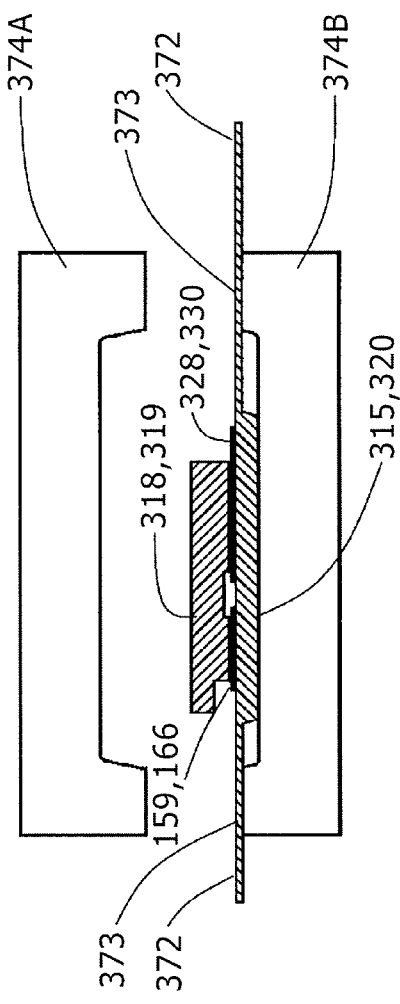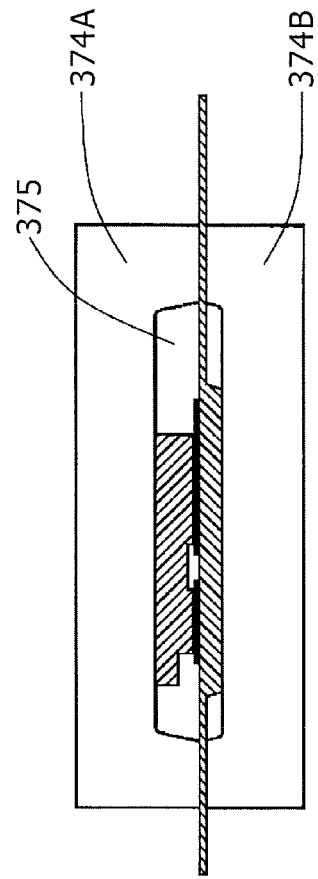
FIG.22A
FIG.22B

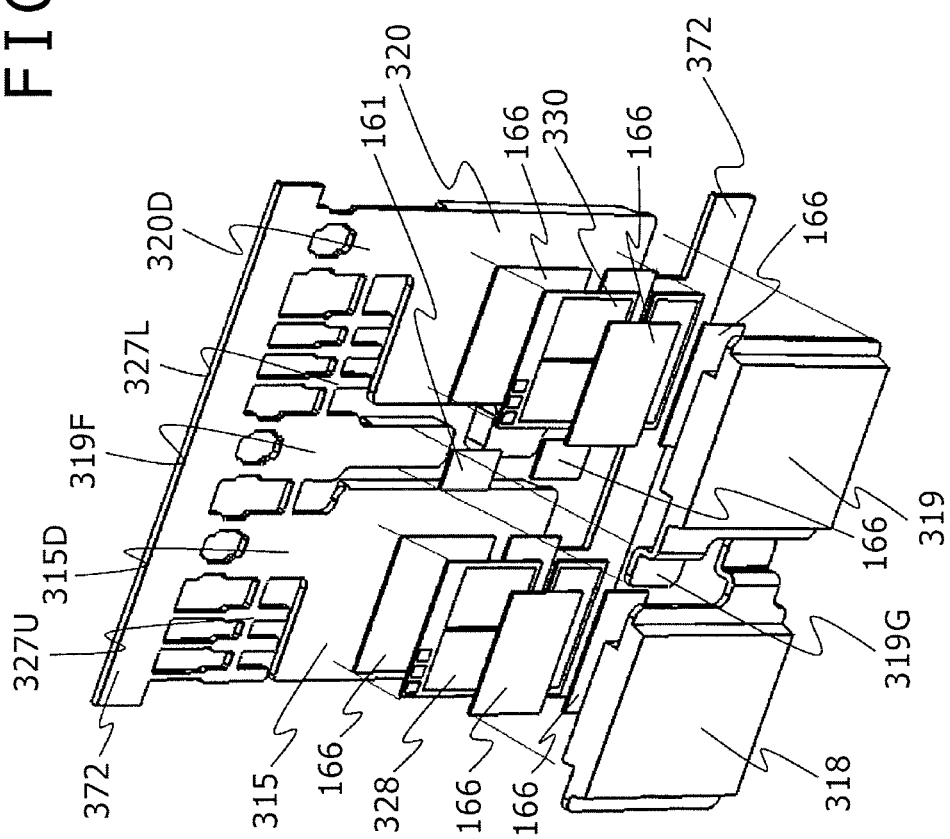

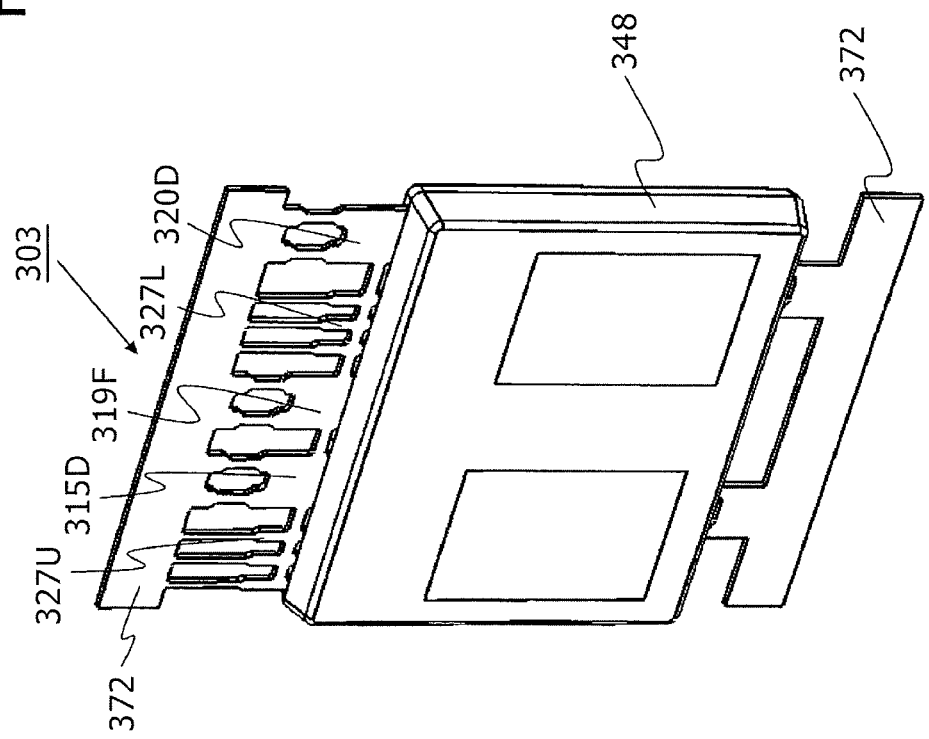

POWER CONVERTER DEVICE HAVING COOLANT FLOW PATHS

TECHNICAL FIELD

The present invention relates to a power converter device including a 3 phase inverter circuit, and particularly to a power converter device suitable for being mounted to a vehicle.

BACKGROUND ART

Japanese Unexamined Patent Application Publication No. 2006-202899 describes a structure of cooling a semiconductor module by inserting the semiconductor module into a coolant flow path. In a power converter device which controls a motor, it is preferable to cool not only a semiconductor module but a part used in the power converter device. However, Japanese Unexamined Patent Application Publication No. 2006-202899 does not mention about cooling not only a semiconductor module but an electronic part used in a power converter device.

For example, in an electric automobile which runs a vehicle by a rotational torque generated by a motor, or a hybrid automobile which runs a vehicle based on outputs of both of an engine and a motor (the present application is applicable to the both type vehicles, and an explanation will be given as follows of a case of applying the present application to a hybrid automobile as a representative example), it is preferable to further efficiently cool not only a semiconductor module but a part used in a power converter device.

CITATION LIST

Patent Literature

Patent Literature 1: Japanese Unexamined Patent Application Publication No. 2006-202899

SUMMARY OF INVENTION

Technical Problem

In a power converter device, it is preferable to further efficiently cool not only a power module but a part used in a power converter device.

It is an object of the present invention to provide a power converter device which can cool not only a power module used in the power converter device but a part used in the power converter device.

Solution to Problem

According to a first mode of the present invention, there is provided a power converter device including first, second, and third semiconductor modules respectively provided for three phases of a 3 phase inverter circuit, and incorporating upper and lower arm series circuits, and a flow path forming cabinet in a rectangular prism shape having an electric equipment containing space and a coolant flow path formed to surround the electric equipment containing space, in which the coolant flow path includes a first flow path provided along a first side face of the flow path forming cabinet, a second flow path provided along a second side face contiguous to one side of the first side face, and connected to one end of the first flow path, and a third flow path provided along a third side face contiguous to the other side of the first side face, and connected to the other end of the first flow path, the first semiconductor module is arranged at the first flow path in parallel with the first side face, the second semiconductor module is arranged at the second flow path in parallel with the second side face, and the third semiconductor module is arranged at the third flow path in parallel with the third side face.

According to a second mode of the present invention, it is preferable to provide the power converter device according to the first mode, further including a coolant flow inlet and a coolant flow outlet formed at a fourth side face of the flow path forming cabinet, a first communicating path communicating the coolant flow inlet and the second flow path, and a second communicating path communicating the coolant flow outlet and the third flow path, in which a coolant supplied from the coolant flow inlet is configured to flow in an order of the second flow path, the first flow path, and the third flow path, and to be discharged from the coolant flow outlet.

According to a third mode of the present invention, it is preferable to provide the power converter device according to the first mode or the second mode, the power converter device being respectively provided with first, second, and third bus bars respectively connected to alternating current output terminals of the first, the second, and the third semiconductor modules, and extended to a side of the fourth side face of the flow path forming cabinet by passing an upper side of the electric equipment containing space.

According to a fourth mode of the present invention, there may be provided the power converter device according to any one of the first mode through the third mode, further including a smoothing capacitor provided on a direct current input side of the 3 phase inverter circuit, in which the smoothing capacitor is arranged at the electric equipment containing space.

According to a fifth mode of the present invention, there may be provided the power converter device according to any one of the first mode through the fourth mode, in which the first flow path is formed such that at least one portion of the first semiconductor module is arranged at an area interposed by the second and the third semiconductor modules.

According to a sixth mode of the present invention, there may be provided the power converter device according to the fifth mode, in which approach sections for adjusting a flow of the coolant are respectively formed on a side of the second flow path of the first communicating path and on a side of the third flow path of the second communicating path, and a dimension of making the first semiconductor module proceed to the area is set in accordance with a length of the first and the second communicating paths such that a ratio of a width dimension of the first and the fourth side faces to a width dimension of the second and the third side faces become a prescribed value.

According to a seventh mode of the present invention, there may be provided the power converter device according to the third mode, in which a connector connecting portion for connecting an alternating current connector to the first, the second, and the third bus bars is arranged on the side of the fourth side face.

According to an eighth mode of the present invention, there may be provided the power converter device according to the seventh mode, further including the alternating current connector having an alternating current wiring connected to the connector connecting portion and extended in a direction of a bottom face of the flow path forming cabinet by passing an interval between the coolant flow inlet and the coolant flow outlet.

According to a ninth mode of the present invention, there may be provided the power converter device according to the third mode, in which first, second, and third current sensors for respectively detecting currents flowing in the first, the second, and the third bus bars are arranged along an extending direction of the fourth side face.

According to a tenth mode of the present invention, it is preferable to provide the power converter device according to the third mode, further including a driver circuit board outputting a drive signal of driving the first, the second, and the third power modules and arranged on upper sides of the first, the second, and the third bus bars, in which the first, the second, and the third power modules include a control terminal portion of transmitting a drive signal of the driver circuit board, and the control terminal portion is extended to the driver circuit board, and connected to the driver circuit board.

According to an eleventh mode of the present invention, there is provided a power converter device including a smoothing capacitor module, a bridge circuit configured by respectively connecting in parallel with a U phase series circuit, a V phase series circuit, and a W phase series circuit including upper and lower arms connected in parallel with the smoothing capacitor module for converting a direct current power to an alternating current power or from the alternating current power to the direct current power, and a cooling flow path forming structure formed with a coolant flow path for making a coolant cooling the bridge circuit flow, in which the cooling flow path forming structure is formed with outputting and inputting ports of the coolant on a side of one side of a quadrangle, and formed with the coolant flow path for making the coolant flow on sides of other three sides of the quadrangle, and ones of the U phase series circuit, the V phase series circuit, and the W phase series circuit are arranged at the respective coolant flow paths disposed on the sides of the respective sides of the other three sides.

According to a twelfth mode of the present invention, there is provided a power converter device including a smoothing capacitor module, a bridge circuit configured by respectively connecting in parallel with a U phase series circuit, a V phase series circuit, and a W phase series circuit including upper and lower arms connected in parallel with the smoothing capacitor module for converting a direct current power to an alternating current power or from the alternating current power to the direct current power, and a cooling flow path forming structure of forming a coolant flow path for making a coolant cooling the bridge circuit flow, in which the smoothing capacitor module is arranged on an inner side of a quadrangle, the cooling flow path forming structure is formed with outputting and inputting ports of the coolant on a side of one side of the quadrangle and the coolant flow path is formed at an outer periphery of the smoothing capacitor module on sides of other three sides of the quadrangle, ones of the U phase series circuit, the V phase series circuit, and the W phase series circuit are respectively arranged at the coolant flow path disposed on sides of respective sides of the other three sides, and the smoothing capacitor module includes plural film capacitors provided at an inner portion of the smoothing capacitor module and connected in parallel with each other, and a U phase terminal, a V phase terminal, and a W phase terminal respectively connected to the U phase series circuit, the V phase series circuit, and the W phase series circuit.

According to a thirteenth mode of the present invention, there is provided a power converter device including a smoothing capacitor module, a bridge circuit configured by respectively connecting in parallel with a U phase series circuit, a V phase series circuit, and a W phase series circuit including upper and lower arms connected in parallel with the smoothing capacitor module for converting a direct current power to an alternating current power or from the alternating current power to the direct current power, and a cooling flow path forming structure of forming a coolant flow path for making a coolant cooling the bridge circuit flow, in which the smoothing capacitor module is arranged on an inner side of a quadrangle, the cooling flow path forming structure is formed with outputting and inputting ports of the coolant on a side of one side of the quadrangle, and the coolant flow paths are respectively formed at an outer periphery of the smoothing capacitor modules on sides of other three sides of the quadrangle at a position deviated to a side opposed to the one side of the quadrangle, ones of the U phase series circuit, the V phase series circuit, and the W phase series circuit are respectively arranged at the respective coolant flow paths disposed at the respective sides, and the smoothing capacitor module includes plural film capacitors provided at an inner portion of the smoothing capacitor module and connected in parallel with each other, a U phase terminal, a V phase terminal, and a W phase terminal respectively connected to the U phase series circuit, the V phase series circuit, and the W phase series circuit, and a power source terminal for being connected to a direct current power source, the U phase terminal, the V phase terminal, and the W phase terminal are respectively arranged at positions deviated to a side opposed to the one side of the quadrangle and the power source terminal is arranged on a side of the one side of the quadrangle.

According to a fourteenth mode of the present invention, there may be provided the power converter device according to any one of the eleventh mode through the thirteenth mode, further being provided with a current sensor of detecting alternating currents outputted from connecting points of the upper and the lower arms respectively included by the U phase series circuit, the V phase series circuit, and the W phase series circuit, in which the current sensor is arranged to be deviated to a side of the one side of the quadrangle.

According to a fifteenth mode of the present invention, it is preferable to provide the power converter device according to any one of the eleventh mode through the fourteenth mode, in which the U phase series circuit, the V phase series circuit, and the W phase series circuit are contained in respective metal cases respectively having cooling faces at both faces of the metal cases, the power converter device being provided with a direct current terminal of a laminated layer structure of connecting the series circuit and the smoothing capacitor module, an alternating current terminal connected to a connecting point of the upper and lower arms and the series circuit, and a control terminal portion for controlling a switching operation of the upper and lower arms, an alternating current output connector outputting 3 phase alternating currents is arranged on a side of the one side of the quadrangle, the power converter device being provided with cooling pipes for taking in or discharging the coolant on the side of the one side of the quadrangle and on both sides of the alternating current output connector.

According to a sixteenth mode of the present invention, it is preferable to provide the power converter device according to the fifteenth mode, in which a protruded length of the control terminal is made to be longer than a protruded length of the direct current terminal of the laminated layer structure protruded from the metal case, a direct current bus bar is arranged at the smoothing capacitor module via a space, a driver board for controlling the upper and lower arms is arranged at the direct current bus bar by providing a space therebetween, and a circuit provided at the driver board and the control circuit are connected.

Advantageous Effects of Invention

According to the present invention, a power module used in a power converter device as well as a part used in the power converter device can efficiently be cooled.

BRIEF DESCRIPTION OF DRAWINGS

FIGS. 13(a) through 12(c) are views showing the power module removing a screw and a second seal resin.

FIG. 15 is a perspective view of the power module further removing a first seal resin and a wiring insulating portion from a state shown in FIGS. 14(a) and 14(b).

FIGS. 22(a) and 22(b) are views for explaining a transfer molding step of the first sealing resin.

FIG. 40 is a view for explaining a step of integrating the module primary sealing member according to the modified example shown in FIG. 38.

FIG. 41 is a view for explaining a step of integrating the module primary sealing member according to the modified example shown in FIG. 38.

DESCRIPTION OF EMBODIMENTS

Figure 1:
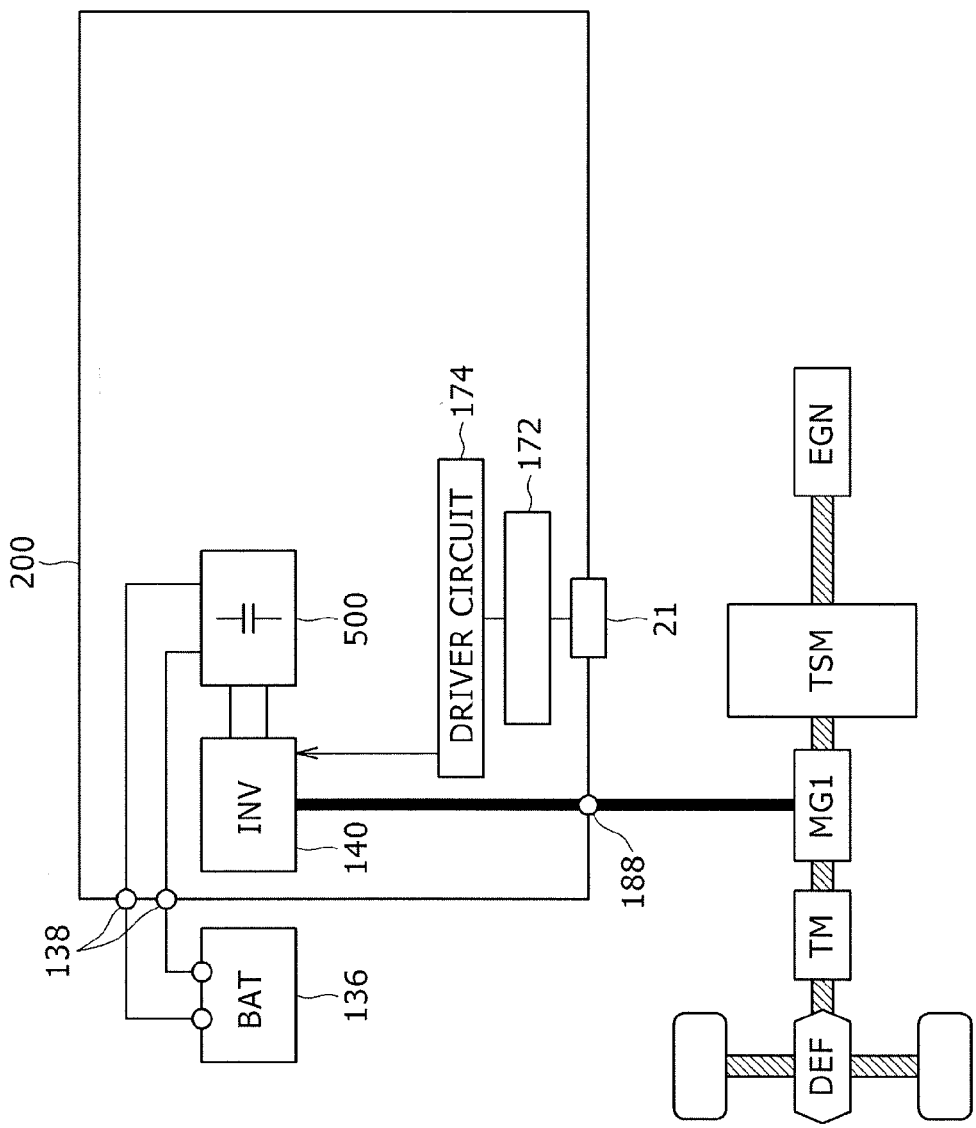
FIG. 1 is a diagram showing a control block of a hybrid automobile in a case where a power converter device according to an embodiment of the present invention is applied.

Embodiments explained below resolve a problem desired to resolve as a product other than the problem described in Technical Problem described above, and also achieve an effect other than the effect described in Advantageous Effects of Invention. A representative problem or effect will be described as follows. The remainder will be described in the embodiments.

<Reduction in Heat Generation Concentration>

In the following embodiments, as shown in, for example, FIG. 30, there are provided a first flow path 19a, a second flow path 19b, and a third flow path 10c at a surrounding of a capacitor module 500, the second flow path 19b and the third flow path 19c are arranged to be opposed to each other, and there are respectively arranged power modules 300V, 300U, and 300W for forming upper and lower arms for supplying respective phase currents of 3 phase alternating currents respectively to the first, the second, and the third flow paths 19a, 19b, and 19c. There is a strong tendency that heat generations of the power modules 300U through 300W are substantially the same by arranging the power modules 300U through 300W in correspondence with the respective phases at the respective flow paths in this way. Therefore, there is a tendency in which the heat generations of the power modules arranged at the respective flow paths of the first through the third flow paths are easy to be substantially the same. Therefore, a state in which the heat generation is concentrated on one flow path is difficult to occur. Therefore, the heat generations at the surrounding of the capacitor module 500 are easy to be made uniform, and there is achieved an effect of restraining concentration of the heat generation on one side of the capacitor module 500. Here, there is achieved an effect of a reduction in inductance as explained below by configuring the respective power modules to contain series circuits of upper and lower arms. There is also achieved an effect of improving the productivity. With regard to the problem of restraining concentration of heat as described above, there can also be configured a structure of containing the upper and the lower arms in different module cases, and connecting the upper arm and the lower arm in series with each other at outside of the module cases. Although according to the structure, external wirings are increased, structures of the respective power modules are simplified, and the productivity of the power module is improved.

<Reduction in Inductance>

Inductances of the respective power modules 300U through 300W can be reduced by providing cooling paths at an outer periphery of the capacitor module and respectively containing the series circuits of the upper and the lower arms in the module cases cooled by the respective cooling paths as explained in the following embodiments. Furthermore, there is achieved an effect of capable of reducing inductances between the capacitor module 500 and the respective power modules 300U through 300W by protruding direct current terminals 504 and 506 of a laminated layer structure for connecting the capacitor module to the respective power modules (refer to FIG. 27).

<Downsizing>

In the following embodiments, there are provided the first flow path 19a, the second flow path 19b, and the third flow path 19c at the surrounding of the capacitor module 500, the second flow path 19b and the third flow path 19c are arranged to be opposed to each other, and the power modules configuring the upper and the lower arms for supplying the respective phase currents of the 3 phase alternating currents to the respective flow paths of the first through the third flow path. There is achieved an effect of capable of arranging various parts to be cooled on inner sides of the flow paths, capable of arranging the power modules along the flow paths, and capable of downsizing a total of the power converter device by such a structure.

Direct current and alternating current bus bars can be arranged at a space above the capacitor module 500, and the total of the power converter device can be downsized. In addition thereto, the productivity is improved. In the following embodiments, the alternating current bus bars can be handled as an assembly by a structure of supporting the alternating current bus bars by a support member, and an operation of attaching the alternating current bus bars is made to be easy, and the productivity is improved. A connecting portion of the alternating current bus bar is directed in an upper direction, connection by welding is easy to be carried out, and the productivity is improved.

<Improvement in Productivity>

As described above, there are adopted various improvements of improving the productivity in the following embodiments. Control terminals of the respective power modules are protruded to be longer than direct current terminals or alternating current terminals, and therefore, a connection to a driver board is made to be easy, and the improvement of the productivity and an effect of downsizing are achieved.

<Improvement in Reliability>

A current sensor 180 (refer to FIG. 2) for detecting an alternating current output current poses a problem that the current sensor is easy to be effected with an influence of heat. However, in the following embodiments, the current sensor 180 is arranged on a face of projecting a flow path forming structure 12. Therefore, a temperature rise of the current sensor 180 is restrained and the reliability is improved.

In the following embodiments, there is adopted a structure in which the connecting terminals 504 and 506 of the capacitor module 500 connected with the power modules and terminals 500g and 500h connected to a power source of the capacitor module are arranged at positions remote from each other, and a number of film capacitor cells contained at an inner portion of the capacitor module 500 are connected in parallel between the terminals 504 and 506 and the terminals 500g and 500h (refer to FIG. 27). Therefore, there is achieved an effect of capable of reducing transmission of noise that is generated in accordance with an operation of switching the power module to the terminals 500g and 500h.

In the following embodiments, various problems are further resolved, and various effects are achieved, which will be explained in the following embodiments.

<Embodiments>

An explanation will be given of embodiments for embodying the present invention in reference to the drawings as follows. FIG. 1 is a diagram showing a control block of a hybrid automobile (hereinafter, described as "HEV") in a case of applying a power converter device according to an embodiment of the present invention. An engine EGN and a motor-generator MG1 generate a running torque of a vehicle. The motor-generator MG1 has a function of not only generating a rotational torque but converting a mechanical energy applied to the motor-generator MG1 from outside into an electric power.

The motor-generator MG1 is, for example, a synchronous machine or an induction machine, and is operated as a motor and a generator as well depending on a driving method as described above. In a case of mounting the motor-generator MG1 to an automobile, it is preferable to achieve a high output despite small-sized configuration, for which a synchronous motor of a permanent magnet type using a magnet of neodymium or the like is suitable. Heat generation of a rotor of a synchronous motor of a permanent magnet type is inconsiderable in comparison with an induction motor, and is excellent for an automobile also in this respect.

An output torque on an output side of the engine EGN is transmitted to the motor-generator MG1 via a power distributing mechanism TSM, and a rotational torque from the power distributing mechanism TSM or a rotational torque generated by the motor-generator MG1 is transmitted to a wheel via a transmission TM and a differential gear DEF. On the other hand, when regenerative braking is operated, a rotational torque is transmitted from the wheel to the motor-generator MG1, and an alternating current power is generated based on the rotational torque supplied. The generated alternating current power is converted into a direct current power by a power converter device 200 as described later to charge a battery 136 for high voltage use and the charged power is used again as a running energy.

Next, an explanation will be given of the power converter device 200 according to the present embodiment. An inverter circuit 140 is electrically connected to the battery 136 via a direct current connector 138, and power is transferred between the battery 136 and the inverter circuit 140. In a case of operating the motor-generator MG1 as a motor, the inverter circuit 140 generates an alternating current power based on a direct current power supplied from the battery 136 via the direct current connector 138 to supply to the motor-generator MG1 via an alternating current terminal 188. A configuration consisting of the motor-generator MG1 and the inverter circuit 140 is operated as a first motor-generator unit.

According to the present embodiment, a vehicle can be driven only by a power of the motor-generator MG1 by operating the first motor-generator unit as a motor unit by the power of the battery 136. Also, according to the present embodiment, the battery 136 can be charged by generating a power by operating the first motor-generator unit as a generator unit by the power of the engine 120 or the power from the wheel.

The battery 136 is used also as a power source for driving a motor for accessories although the motor for accessories is omitted in FIG. 1. As a motor for accessories, there is, for example, a motor for driving a compressor of an air conditioner, or a motor for driving a hydraulic pump for controlling. A direct current power is supplied from the battery 136 to a power module for accessories, and the power module for accessories generates an alternating current power to supply to the motor for accessories. The power module for accessories has a circuit configuration and a function basically similar to those of the inverter circuit 140, and controls a phase, a frequency, and a power of an alternating current supplied to the motor for accessories. The power converter device 200 includes a capacitor module 500 for smoothing the direct current power supplied to the inverter circuit 140.

The power converter device 200 includes a connector 21 for communication for receiving an instruction from an upper control device or transmitting data indicating a state to the upper control device. In the power converter device 200, a control circuit 172 calculates a control amount of the motor-generator MG1 based on an instruction inputted from the connector 21, calculates whether the motor-generator MG1 is driven as a motor or driven as a generator, generates a control pulse based on a calculation result, and supplies the control pulse to a driver circuit 174. The driver circuit 174 generates a drive pulse for controlling the inverter circuit 140 based on the control pulse supplied.

Figure 2:
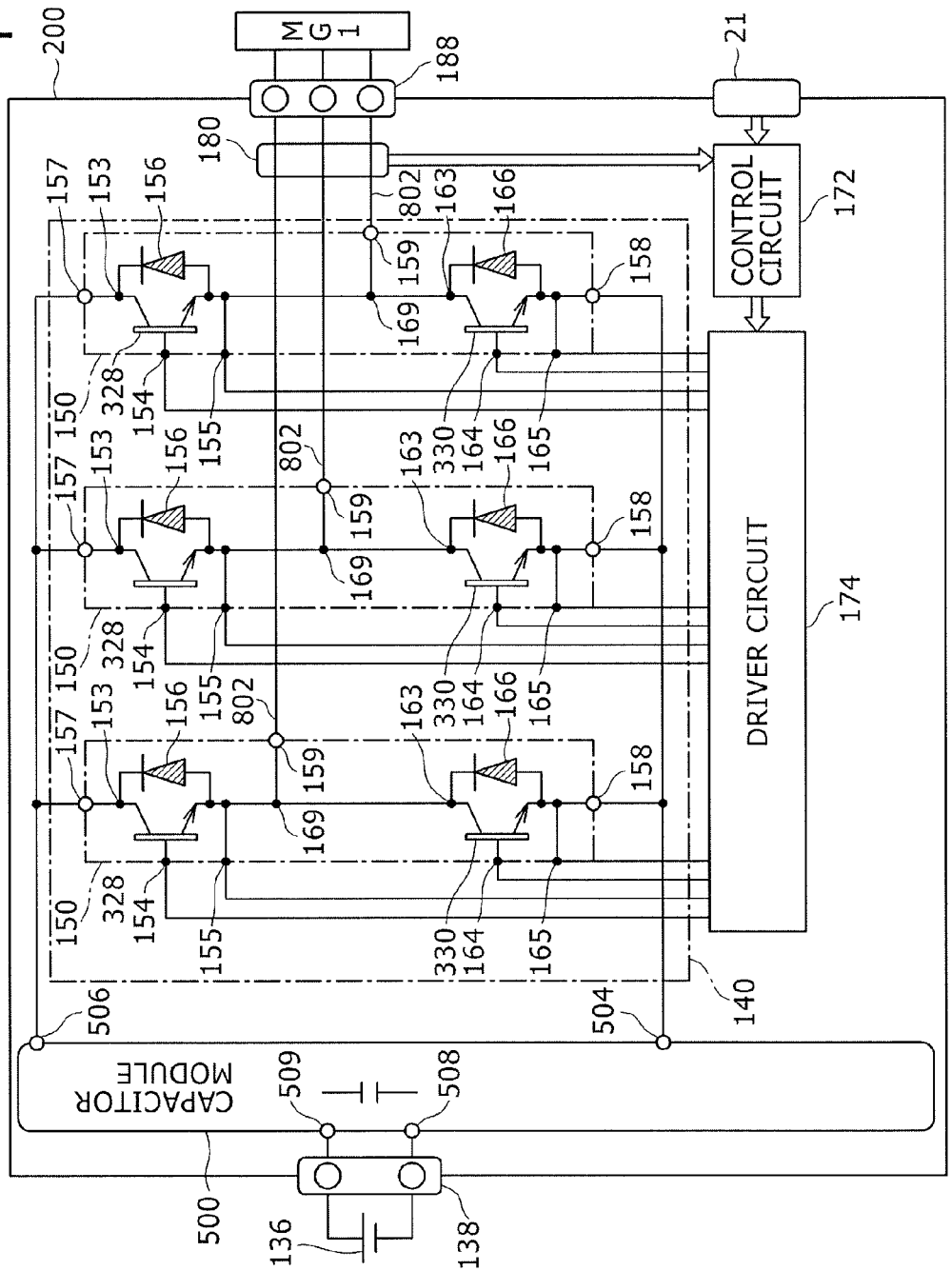
FIG. 2 is a diagram of explaining a configuration of an electric circuit of an inverter circuit shown in FIG. 1.

Next, an explanation will be given of a configuration of an electric circuit of the inverter circuit 140 in reference to FIG. 2. Incidentally, in the following, there is used an insulated gate type bipolar transistor as a semiconductor element, and hereinafter, the transistor is described as IGBT. A series circuit 150 of upper and lower arms is configured by IGBT 328 and a diode 156 which are operated as an upper arm, and IGBT 330 and a diode 166 which are operated as a lower arm. The inverter circuit 140 includes the series circuits 150 in correspondence with 3 phases of U phase, V phase, and W phase of an alternating current power to be outputted.

The 3 phases correspond to respective wirings of 3 phases of armature windings of the motor-generator MG1 according to the present embodiment. The series circuit 150 of the upper and the lower arms of each of 3 phases outputs an alternating current from an intermediate electrode 169 which is a middle point portion of the series circuit. The intermediate electrode 169 is connected to a below-explained alternating current bus bar 802 or 804 which is an alternating current power line to the motor-generator MG1 by passing an alternating current terminal 159 and the alternating current terminal 188.

A collector electrode 153 of IGBT 328 of the upper arm is electrically connected to a capacitor terminal 505 on a positive pole side of the capacitor module 500 via a positive pole terminal 157. Also, an emitter electrode of IGBT 330 of the lower arm is electrically connected to a capacitor terminal 504 on a negative pole side of the capacitor module 500 via a negative pole terminal 158.

As described above, the control circuit 172 receives the control instruction from the upper control device via the connector 21, generates the control pulse which is a control signal for controlling IGBT 328 or IGBT 330 configuring the upper arm or the lower arm of the series circuit 150 of each phase configuring the inverter circuit 140 based thereon, and supplies the control pulse to the driver circuit 174.

The driver circuit 174 supplies a drive pulse for controlling IGBT 328 or IGBT 330 configuring the upper arm or the lower arm of the series circuit 150 of each phase to IGBT 328 or IGBT 330 of each phase. IGBT 328 or IGBT 330 carries out a conducting or breaking operation based on the drive pulse from the driver circuit 174, converts the direct current power supplied from the battery 136 into a 3 phase alternating current power, and supplies the converted power to the motor-generator MG1.

IGBT 328 includes the collector electrode 153, an emitter electrode 155 for signal, and a gate electrode 154. Also, IGBT 330 includes a collector electrode 163, an emitter electrode 165 for signal, and a gate electrode 164. The diode 156 is electrically connected between the collector electrode 153 and the emitter electrode 155. Also, the diode 166 is electrically connected between the collector electrode 163 and the emitter electrode 165.

As a power semiconductor for switching, a metal oxide semiconductor type field effect transistor (hereinafter, abbreviated as MOSFET) may be used. In this case, the diode 156 and the diode 166 are not needed. As the power semiconductor element for switching, IGBT is suitable for a case where a direct current voltage is comparatively high, and MOSFET is suitable for a case where the direct current voltage is comparatively low.

The capacitor module 500 includes the capacitor terminal 506 on the positive pole side and the capacitor terminal 504 on the negative pole side as well as the power source terminal 509 on the positive pole side and the power source terminal 508 on the negative pole side. The direct current voltage at high voltage from the battery 136 is supplied to the power source terminal 509 on the positive pole side and the power source terminal 508 on the negative pole side via the direct current connectors 138, and is supplied from the capacitor terminal 506 and the capacitor terminal 504 on the negative pole side of the capacitor module 500 to the inverter circuit 140.

On the other hand, a direct current power converted from an alternating current power by the inverter circuit 140 is supplied from the capacitor terminal 506 on the positive pole side and the capacitor module 504 on the negative pole side to the capacitor module 500, supplied from the power source terminal 509 on the positive pole side and the power source terminal 508 on the negative pole side to the battery 136 via the direct current connectors 138, and is accumulated in the battery 136.

The control circuit 172 includes a microcomputer (hereinafter, described as "micon") for calculating to process switching timings of IGBT 348 and IGBT 330. As information inputted to micon, there are a target torque value requested to the motor-generator MG1, a value of a current supplied from the series circuit 150 to the motor-generator MG1, and a magnetic pole position of a rotor of the motor-generator MG1.

The target torque value is based on an instruction signal outputted from the upper control device, not illustrated. The current value is detected based on a detecting signal by a current sensor 180. The magnetic pole position is detected based on a detecting signal outputted from a rotating magnetic pole sensor (not illustrated) of a resolver provided at the motor-generator MG1. Although according to the present embodiment, a case of detecting 3 phases of current values is pointed out as an example of the current sensor 180, current values of an amount of 2 phases may be detected, and currents of an amount of 3 phases may be calculated by a calculation.

Micon in the control circuit 172 calculates current instruction values of d axis, q axis of the motor-generator MG1 based on the target torque value, calculates voltage instruction values of d axis, q axis based on differences of the calculated current instruction values of d axis, q axis, and detected current values of d axis, q axis and converts the calculated voltage instruction values of d axis, q axis into voltage instruction values of U phase, V phase, and W phase based on the detected magnetic pole position. Micon generates a pulse-like modulated wave based on a comparison between fundamental waves (sine wave) based on the voltage instruction values of U phase, V phase, and W phase and a carrier wave (triangular wave), and outputs the generated modulated wave to the driver circuit 174 as a PWM (pulse width modulation) signal.

In a case of driving the lower arm, the driver circuit 174 outputs a drive signal obtained by amplifying the PWM signal to the gate electrode of IGBT 330 of the corresponding lower arm. In a case of driving the upper arm, the driver circuit 174 amplifies the PWM signal after shifting a level of a reference potential of the PWM signal to a level of a reference potential of the upper arm, and outputs the amplified PWM signal as the drive signal to the gate electrode of IGBT 328 of the corresponding upper arm.

Micon in the control circuit 172 protects the series circuit 150 by detecting abnormalities (excess current, excess voltage, excess temperature and the like). For such purpose, sensing information is inputted to the control circuit 172. For example, information of currents flowing in the respective emitter electrodes of IGBT 328 and IGBT 330 is inputted from the emitter electrode 155 for signal and the emitter electrode 165 for signal at the respective arms to corresponding drive units (IC). Thereby, the respective drive units (IC) detect the excess current, and protect corresponding IGBT 328 and IGBT 330 from excess currents by stopping the corresponding switching operations of IGBT 328, and IGBT 330 in a case of detecting the excess current.

Information of a temperature of the series circuit 150 is inputted from a temperature sensor (not illustrated) provided at the series circuit 150 to micon. Information of a voltage on the direct current positive pole side of the series circuit 150 is inputted to micon. Micon detects an excess temperature and detects an excess voltage based on the pieces of information, and stops the switching operations of all of IGBT 328 and IGBT 330 in a case of detecting the excess temperature or the excess voltage.

Figure 3:
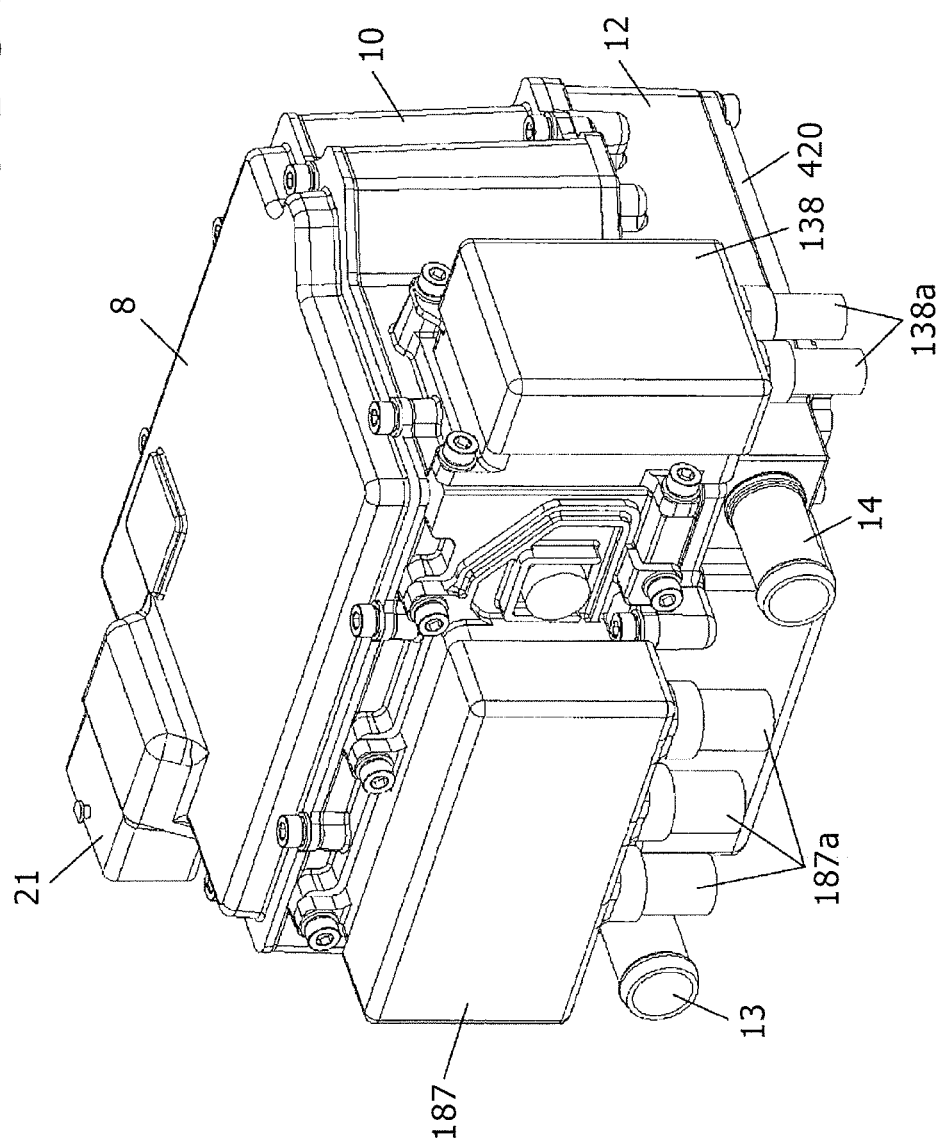
FIG. 3 is a perspective view of an outlook of the power converter device shown in FIG. 1.
Figure 4:
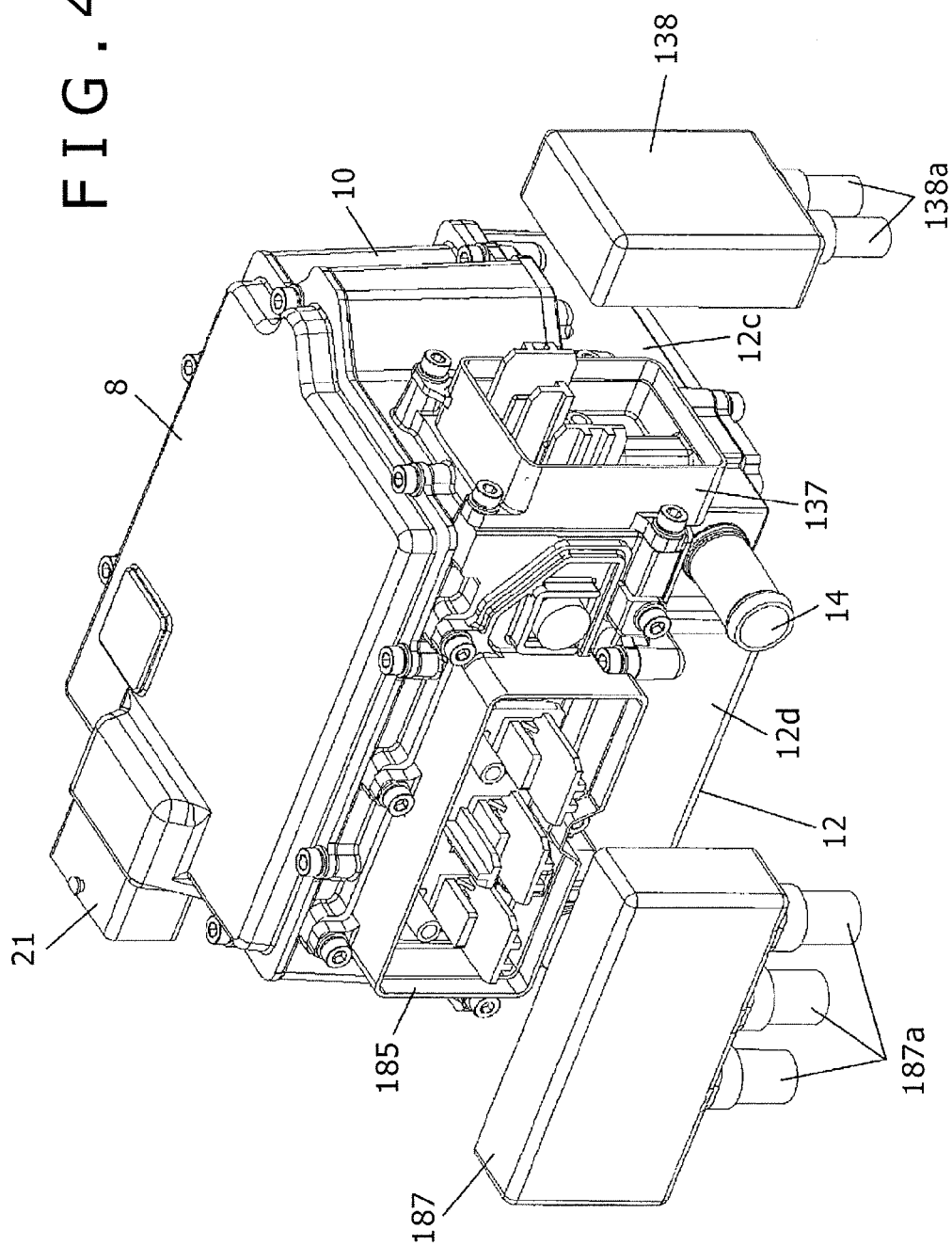
FIG. 4 is a perspective view of an outlook of the power converter device shown in FIG. 1.

FIGS. 3 and 4 are perspective views of outlooks of the power converter device 200 as an embodiment according to the present invention, and FIG. 4 shows a state of removing an alternating current connector 187 and the direct current connector 138. The power converter device 200 according to the present embodiment achieves downsizing by configuring a rectangular prism shape having a plane shape substantially in a square shape, and achieves an effect of being easy to be attached to a vehicle. Numeral 8 designates a lid, numeral 10 designates a housing, numeral 12 designates a flow path forming structure, numeral 13 designates an inlet pipe of a coolant, numeral 14 designates an outlet pipe, and numeral 420 designates a lower cover. The connector 21 is a connector for signal provided for connecting to outside.

The lid 8 is fixed to an upper opening portion of the housing 10 containing circuit parts configuring the power converter device 200. The flow path forming structure 12 fixed to a lower portion of the housing 10 holds the power module 300 and the capacitor module 500 which are described later, and cools the power module 300 and the capacitor module 500 by a coolant. As a coolant, for example, water is frequently used, and in the following, an explanation will be given of the coolant as cooling water. The inlet pipe 13 and the outlet pipe 14 are provided at one side face of the flow path forming structure 12, cooling water supplied from the inlet pipe 13 flows into a flow path 19 described later in the flow path forming structure 12, and is discharged from the outlet pipe 14.

An alternating current interface 185 to be mounted with the alternating current connector 187 and a direct current interface 137 to be mounted with the direct current connector 138 are respectively provided at side faces of the housing 10. The alternating current interface 185 is provided at the side face provided with the pipes 13 and 14, and an alternating current wiring 187a of the alternating current connector 187 mounted to the alternating current interface 185 is extended to a lower side by passing an interval between the pipes 13 and 14. The direct current interface 137 is provided at the side face contiguous to the side face provided with the alternating current interface 185, and also a direct current wiring 138a of the direct current connector 138 to be mounted to the direct current interface 137 is extended to a lower side of the power converter device 200.

In this way, the alternating current interface 185 and the pipes 13 and 14 are arranged on a side of the same side face 12d, the alternating current wiring 187a is extended to a lower side to pass the interval between the pipes 13 and 14, and therefore, a space occupied by the pipes 13 and 14, the alternating current connector 187 and the alternating current wiring 187a can be reduced, and large-sized formation of a total of the device can be reduced. The alternating current wiring 187a is extended to the lower side relative to the pipes 13 and 14, and therefore, the alternating current wiring 187a is made to be easy to be extended around, and the productivity is improved.

Figure 5:
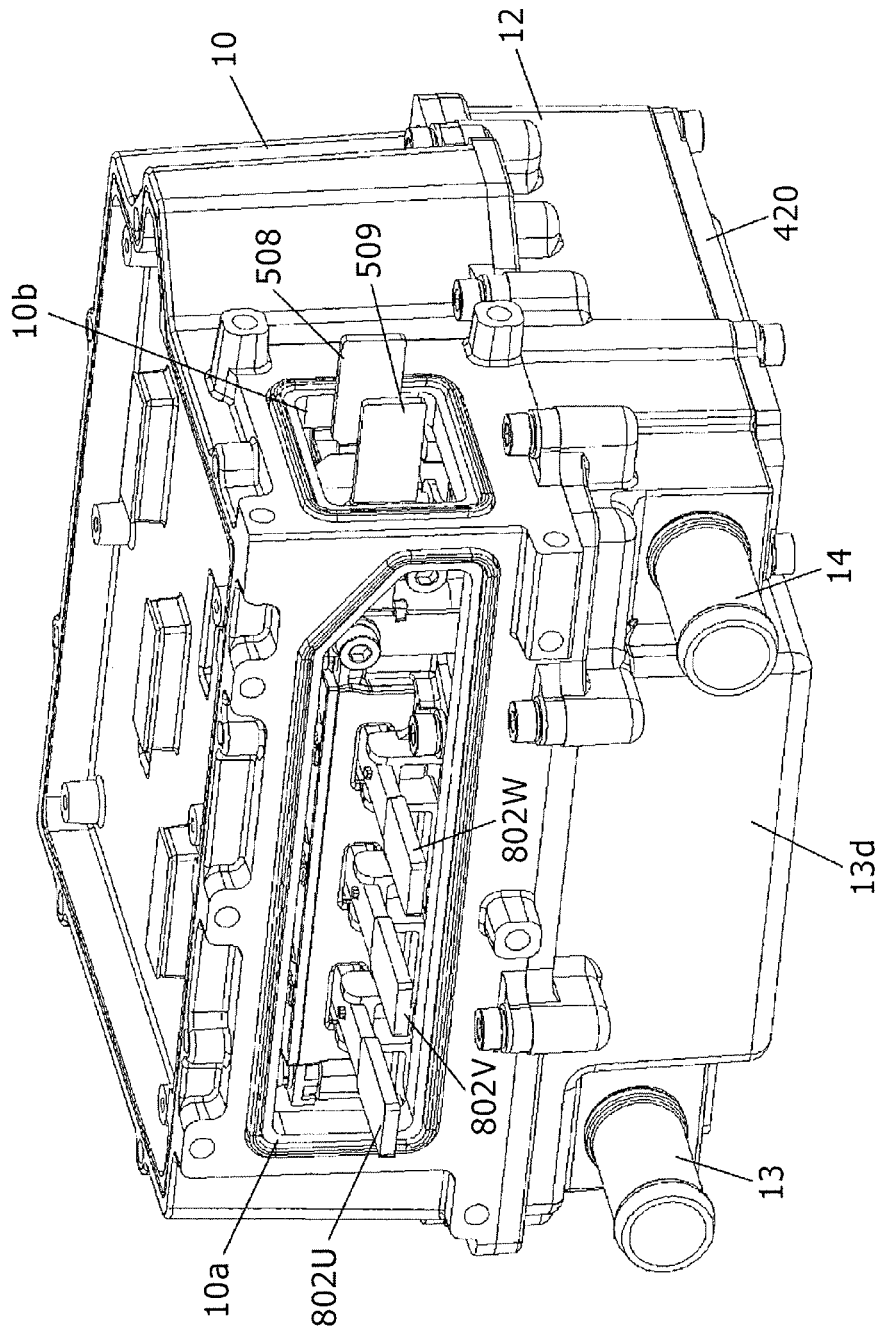
FIG. 5 is a disassembled perspective view of the power converter device shown in FIG. 1.

FIG. 5 is a view showing a state of removing the lid 8, the direct current interface 137, and the alternating current interface 185 from the power converter device 200 shown in FIG. 4. One side face of the housing 10 is formed with an opening 10a to be fixed with the alternating current interface 185, and other contiguous side face is formed with an opening 10b to be fixed with the direct current interface 137. 3 pieces of the alternating current bus bars 802, that is, a U phase alternating current bus bar 802U, a V phase alternating current bus bar 802V, and a W phase alternating current bus bar 802W are protruded from the opening 10a, and the direct current power source terminals 508 and 509 are protruded from the opening 10b.

Figure 6:
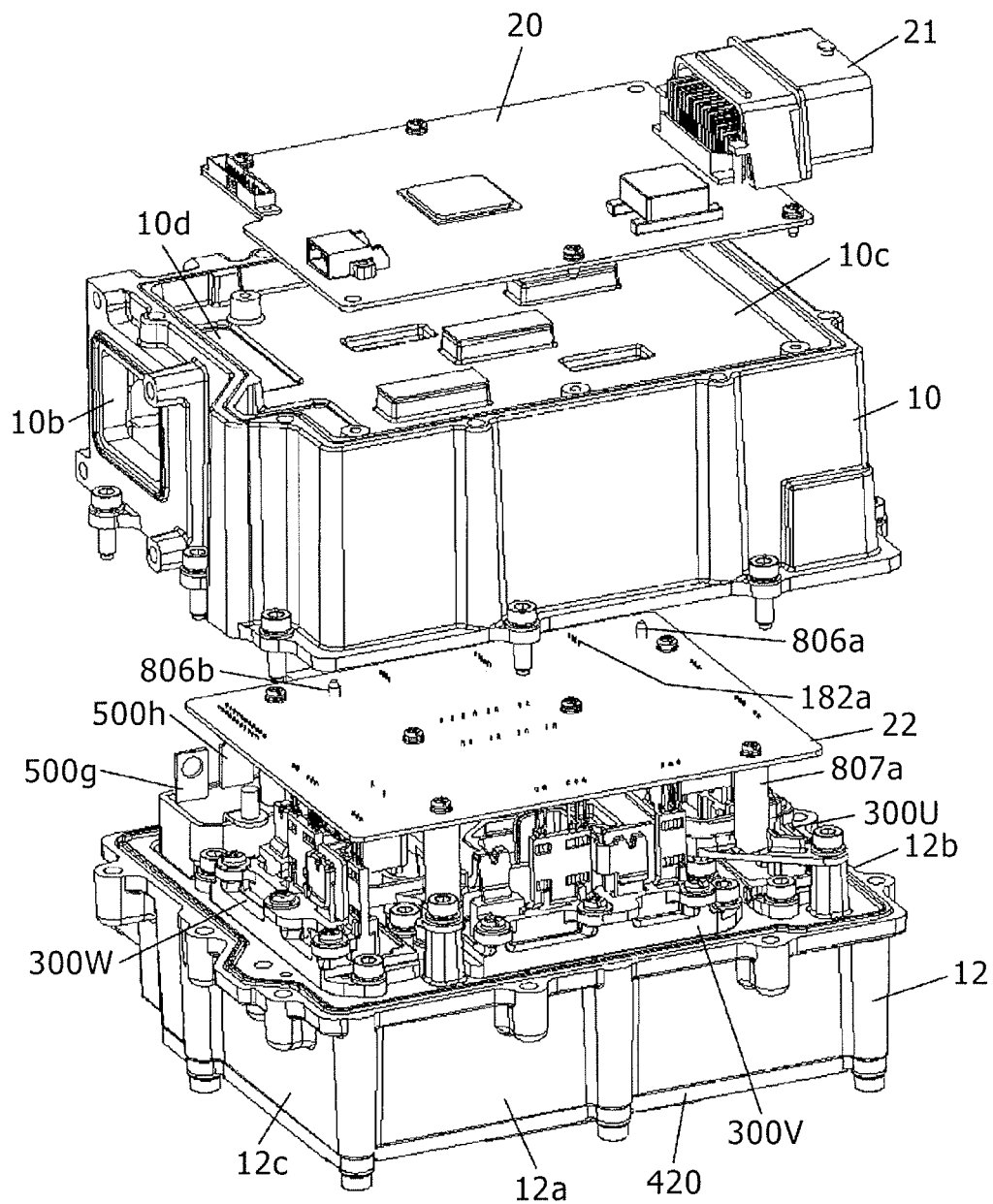
FIG. 6 is a disassembled perspective view of the power converter device shown in FIG. 1.

FIG. 6 is a view showing a state of separating the flow path forming structure 12 and the housing 10 shown in FIG. 5. The housing 10 includes two containing spaces, which are partitioned to an upper containing space and a lower containing space by a partition wall 10c. The upper containing space contains a control circuit board 20 fixed with the connector 21, and the lower containing space contains a driver circuit board 22 and a bus bar assembly 800 described later (refer to FIG. 7). The control circuit board 20 is mounted with the control circuit 172 shown in FIG. 2, and the driver circuit board 22 is mounted with the driver circuit 174. The control circuit board 20 and the driver circuit board 22 are connected by a flat cable (not illustrated) (refer to FIG. 7 described later). The flat cable is extended from the lower containing space to the upper lower space by passing an opening 10d in a slit-like shape formed at the partition wall 10c.

Figure 7:
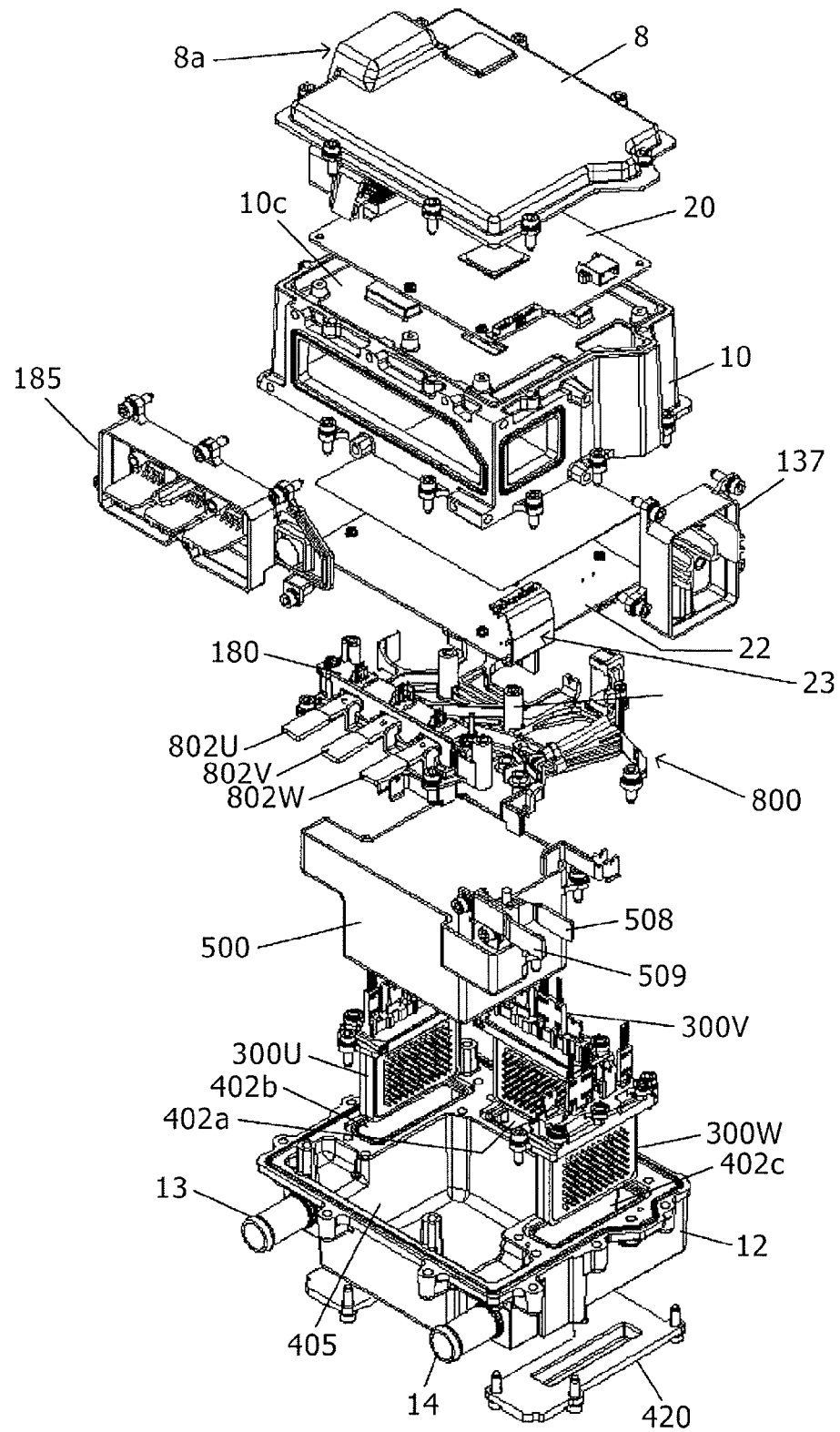
FIG. 7 is a disassembled perspective view of the power converter device shown in FIG. 1.

FIG. 7 is a disassembled perspective view of the power converter device 200. The control circuit board 20 mounted with the control circuit 172 described above is arranged on an inner side of the lid 8, that is, at the upper containing space of the housing 10. The lid 8 is formed with an opening 8a for the connector 21. A direct current power at low voltage for operating the control circuit in the power converter device 200 is supplied from the connector 21.

The flow path forming structure 12 is formed with a flow path in which cooling water which flows in from the inlet pipe 13 flows although details thereof will be described later. The flow path forms a flow path in a channel-like shape to flow along three side faces of the flow path forming structure 12. The cooling water which flows in from the inlet pipe 13 flows into the flow path from one end of the channel-like shape flow path, flows in the flow path, thereafter, flows out from the outlet pipe 14 connected to the other end of the flow path.

An upper face of the flow path is formed with 3 of opening portions 402a through 402c, and the power modules 300V, 300U, and 300W incorporating the series circuits 150 (refer to FIG. 2) are respectively inserted into the flow path from the opening portions 402a through 402c. The power module 300U incorporates the series circuit 150 of U phase, the power module 300V incorporates the series circuit 150 of V phase, and the power module 300W incorporates the series circuit 150 of W phase. The power modules 300U through 300W are constructed by the same configuration, and also outlook shapes thereof are configured by the same shape. The opening portions 402a through 402c are respectively closed by flange portions of the inserted power modules 300V, 300U, and 300W.

The flow path forming structure 12 is formed with a containing space 405 for containing an electric equipment to be surrounded by the flow path in the channel-like shape. According to the present embodiment, the capacitor module 500 is contained in the containing space 405. The capacitor module 500 contained in the containing space 405 is cooled by cooling water flowing in the flow path. An upper side of the capacitor module 500 is arranged with the bus bar assembly 800 mounted with the direct current bus bars 802U through 802W. The bus bar assembly 800 is fixed to an upper face of the flow path forming structure 12. The bus bar assembly 800 is fixed with the current sensor module 180.

The driver circuit board 22 is arranged on an upper side of the bus bar assembly 800 by being fixed to a support member 807a provided at the 'bus bar assembly 800. As described above, the control circuit board 20 and the driver circuit board 22 are connected by the flat cable 23. The flat cable 23 is extended from the lower containing space to the upper containing space by passing the opening 10d in the slit-like shape formed at the partition wall 10c.

In this way, the power modules 300U through 300W, the driver circuit board 22, and the control circuit board 20 are arranged hierarchically in a height direction, and the control circuit board 20 is arranged at a location the remotest from the power modules 300U through 300W of a strong current system. Therefore, mixing of switching noise or the like to the side of the control circuit board 20 can be reduced. The driver circuit board 22 and the control circuit board 20 are arranged at the separate containing spaces partitioned by the partition wall 10c. Therefore, the partition wall 10c is made to function as an electromagnetic shield, and the noise mixed from the driver circuit board 22 to the control circuit board 20 can be reduced. Incidentally, the housing 10 is formed by a metal material of aluminum or the like.

The control circuit board 20 is fixed to the partition wall 10c integrally formed with the housing 10, and therefore, a mechanical resonance frequency of the control circuit board is made to be high against a vibration from outside. Therefore, an influence of a vibration from a vehicle side is difficult to be effected, and the reliability is improved.

Figure 8:
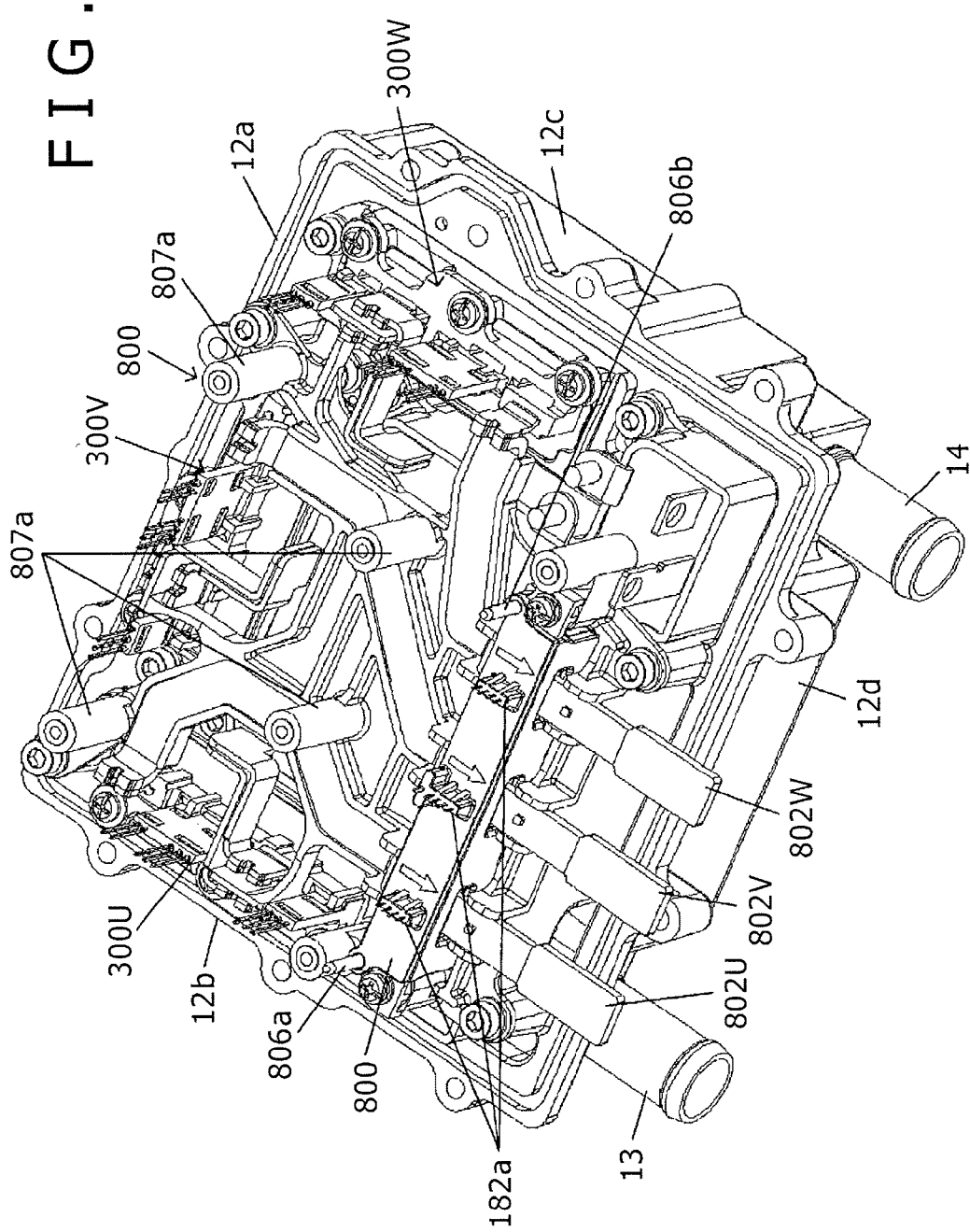
FIG. 8 is a perspective view of an outlook of a flow path forming structure integrated with a power module, a capacitor module, and a bus bar assembly.
Figure 9:
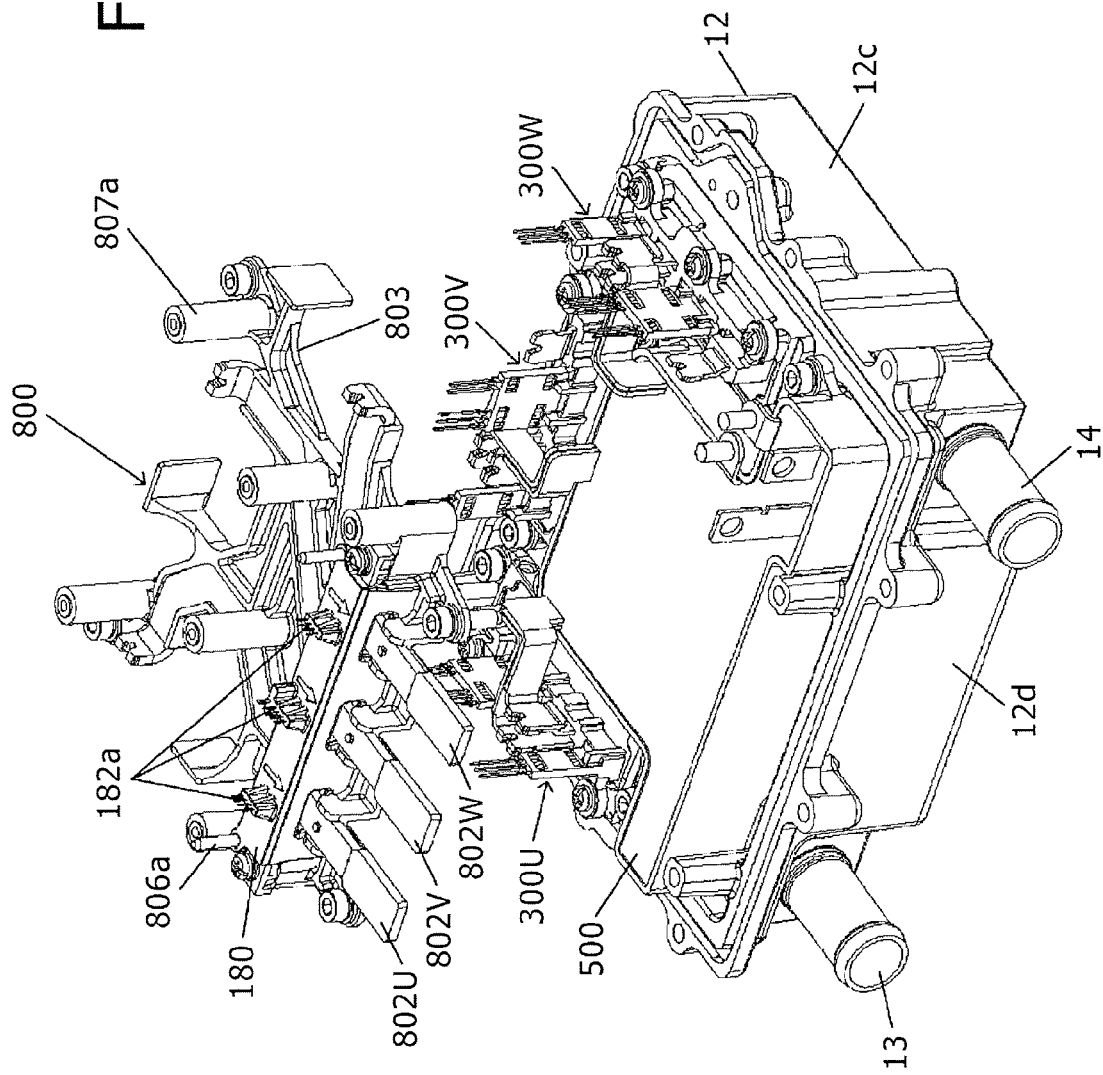
FIG. 9 is a view showing the flow path forming structure in a state of removing the bus bar assembly.

A further detailed explanation will be given as follows of the flow path forming structure 12, the power modules 300U through 300W, the capacitor module 500, and the bus bar assembly 800 which are fixed to the flow path forming structure 12. FIG. 8 is a perspective view of an outlook in which the power modules 300U through 300W, the capacitor module 500, and the bus bar assembly 800 are integrated to the flow path forming structure 12. FIG. 9 shows a state of removing the bus bar assembly 800 from the flow path forming structure 12. The bus bar assembly 800 is fixed to the flow path forming structure 12 by a bolt.

Figure 10:
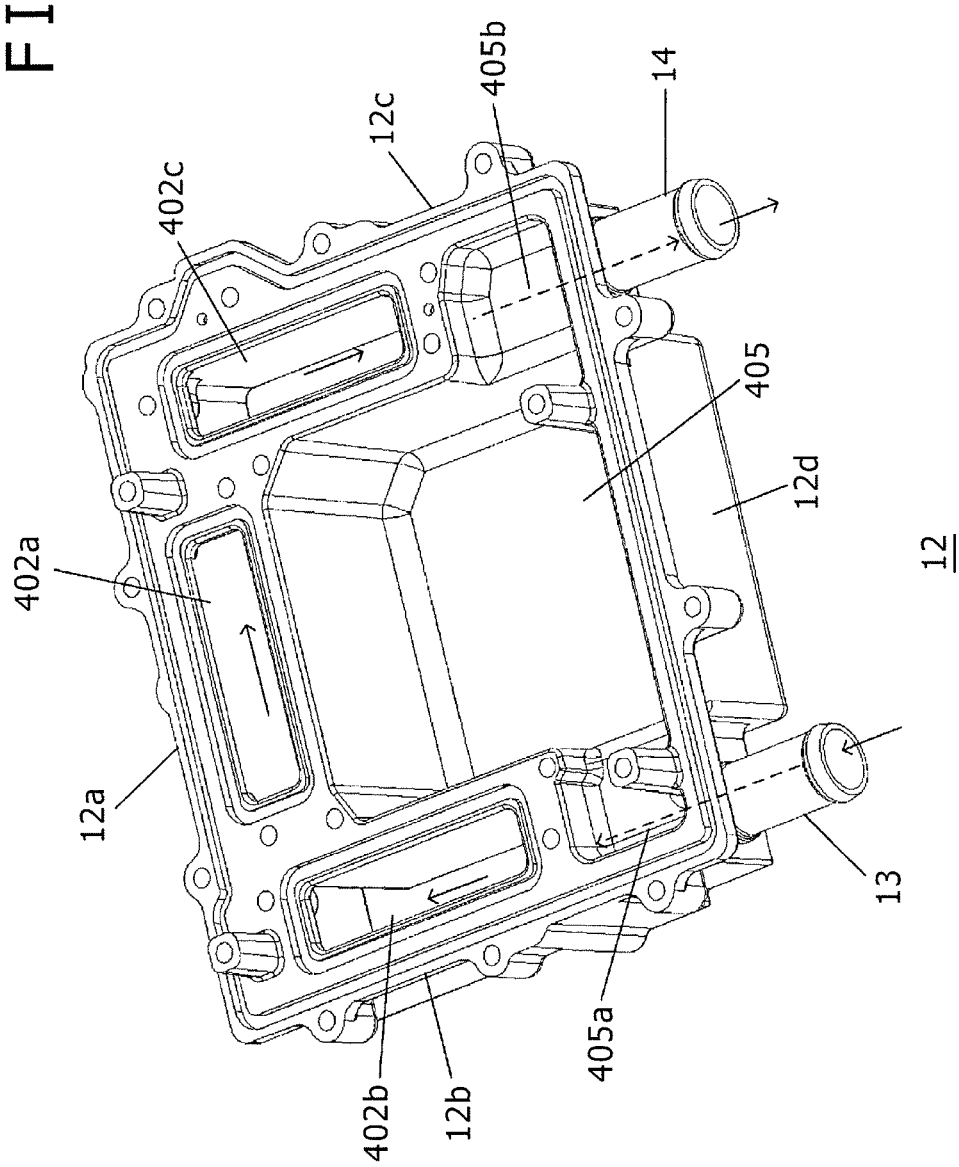
FIG. 10 is a perspective view of the flow path forming structure.
Figure 11:
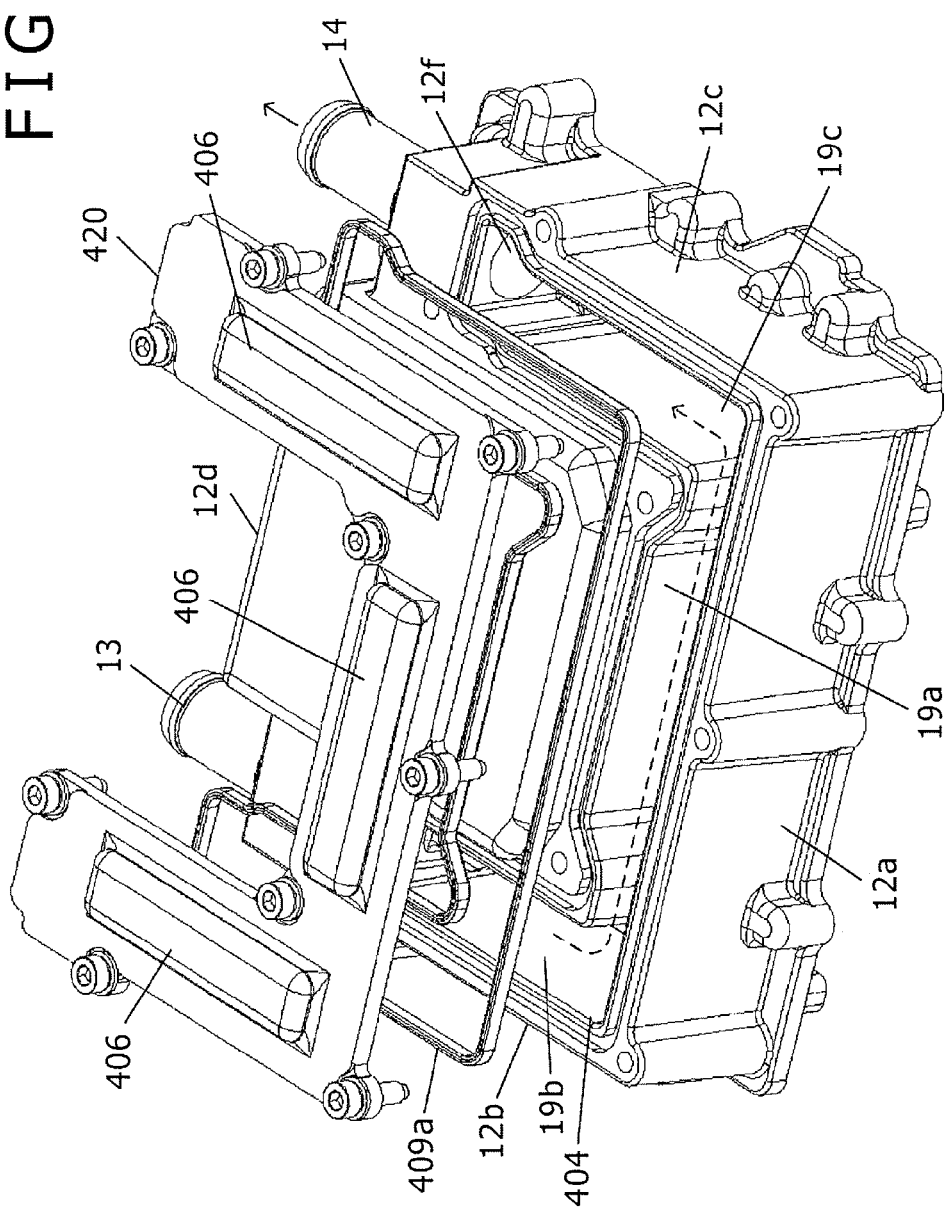
FIG. 11 is a disassembled perspective view viewing the flow path forming structure from a back face side.

First, an explanation will be given of the flow path forming structure 12 in reference to FIGS. 10 and 11. FIG. 10 is a perspective view of the flow path forming structure 12, and FIG. 11 is a disassembled perspective view viewing the flow path forming structure 12 from a back face side. As shown in FIG. 10, the flow path forming structure 12 configures a rectangular prism a plane shape of which is substantially in a square shape, and the side face 12d is provided with the inlet pipe 13 and the outlet pipe 14. Portions of the side face 12d provided with the pipes 13 and 14 are formed in a stepped difference shape. As shown in FIG. 11, the flow path 19 is formed in a channel-like shape to be along 3 of remaining side faces 12a through 12c. The back face side of the flow path forming structure 12 is formed with an opening portion 404 in one communicating-channel-shaped opening portion having a shape substantially the same as a cross-sectional face shape of the flow path 19. The opening portion 404 is closed by the lower cover 420 in the channel-like shape. A seal member 409a is provided between the lower cover 420 and the flow path forming structure 12, and an airtightness is maintained.

The flow path 19 configuring the channel-like shape is divided into 3 of flow path sections 19a, 19b, and 19c depending on a direction in which cooling water flows. The first flow path section 19a is provided along the side face 12a at a position opposed to the side face 12d provided with the pipes 13 and 14, the second flow path section 19b is provided along the side face 12b contiguous to one side of the side face 12a, and the third flow path section 19c is provided along the side face 12c contiguous to other side of the side face 12a. Cooling water flows from the inlet pipe 13 into the flow path section 19b, flows in an order of the flow path section 19b, the flow path section 19a, and the flow path section 19c as shown by a broken line arrow mark, and flows out from the outlet pipe 14 although details thereof will be described later.

As shown in FIG. 10, an upper face side of the flow path forming structure 12 is formed with the opening portion 402a in a rectangular shape in parallel with the side face 12a at a position opposed to the flow path section 19a, the opening portion 402b in a rectangular shape in parallel with the side face 12b is formed at a position opposed to the flow path section 19b, and the opening 402c in a rectangular shape in parallel with the side face 12c is formed at a position opposed to the flow path section 19c. The power modules 300U through 300W are inserted into the flow path 19 by passing the opening portions 402a through 402c.

As shown in FIG. 11, the lower cover 420 is respectively formed with protruded portions 406 protruded to a lower side of the flow path 19 at positions opposed to the opening portions 402a through 402c described above. The protruded portions 406 configure recessed portions in view from a side of the flow path 19, and lower end portions of the power modules 300U through 300W inserted from the opening portions 402a through 402c are brought into the recessed portion. The flow path forming structure 12 is formed such that the opening portions 404 and the opening portions 402a through 402c are opposed to each other, and therefore, the flow path forming structure 12 is constructed by a configuration which is easy to be produced by aluminum casting.

As shown in FIG. 10, the flow path forming structure 12 is provided with the containing space 405 in a rectangular shape 3 sides of which are formed to be surrounded by the flow path 19. The capacitor module 500 is contained in the containing space 405. The containing space 405 surrounded by the flow path 19 is configured by a rectangular prism shape. Therefore, the capacitor module 500 can be configured by the rectangular prism shape, and the productivity of the capacitor module 500 is improved.

Next, an explanation will be given of detailed configurations of the power modules 300U through 300W, and power modules 301U through 301W which are used in the inverter circuit 140 in reference to FIG. 12(a) through FIG. 26(b). All of the power modules 300U through 300W and the power modules 301U through 301W are configured by the same structure, and an explanation will be given of the structure of the power module 300U as a representative. In FIG. 12 through FIG. 26, a signal terminal 325U corresponds to the gate electrode 154 and the emitter electrode 155 for signal disclosed in FIG. 2. A signal terminal 325L corresponds to the gate electrode 164 and the emitter electrode 165 disclosed in FIG. 2. A direct current positive pole terminal 315B is the same as the positive pole terminal 157 disclosed in FIG. 2. A direct current negative terminal 319B is the same as the negative pole terminal 158 disclosed in FIG. 2. An alternating current terminal 320B is the same as the alternating current terminal 159 disclosed in FIG. 2.

Figure 12B:
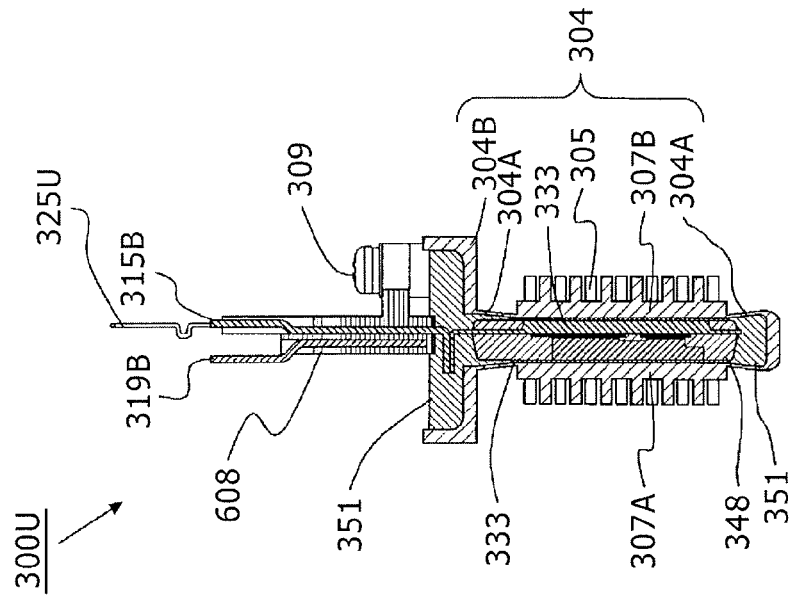
FIGS. 12(a) and 12(b) are views showing the power module.
Figure 12A:
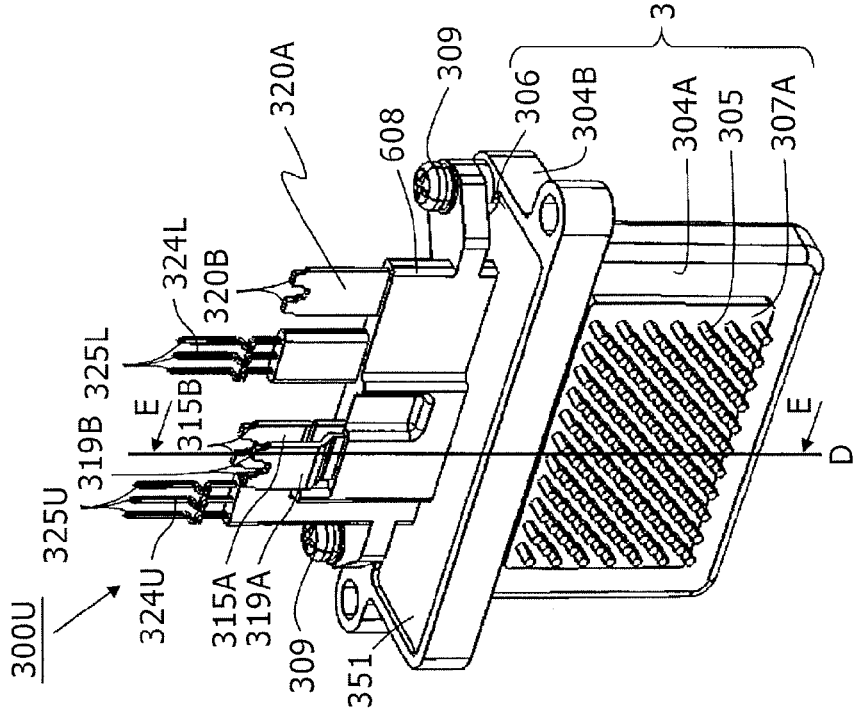

FIG. 12(a) is a perspective view of the power module 300U according to the present embodiment. FIG. 12(b) is a sectional view when the power module 300U of the present embodiment is cut by a section D and viewed from a direction E.

FIGS. 13(a) through 13(c) are views showing the power module 300U removing a screw 309 and a second seal resin 351 from a state shown in FIGS. 12(a) and 12(b) for assisting understanding. FIG. 13(a) is a perspective view, and FIG. 13(b) is a sectional view when the power module 300U is cut by the section D and viewed in the direction E similar to FIG. 12(b). FIG. 13(c) shows a sectional view before deforming a curved portion 304A by pressing a fin 305.

Figure 14B:
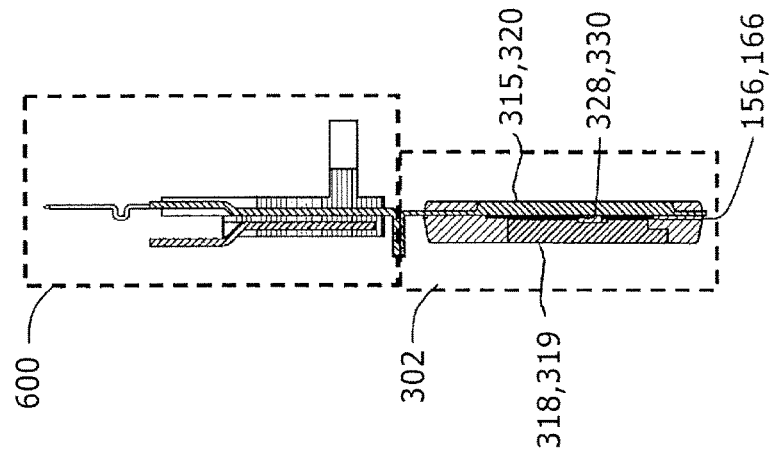
FIGS. 14(a) and 14(b) are views showing the power module further removing a case from a state shown in FIGS. 13(a) through 13(c).
Figure 14A:
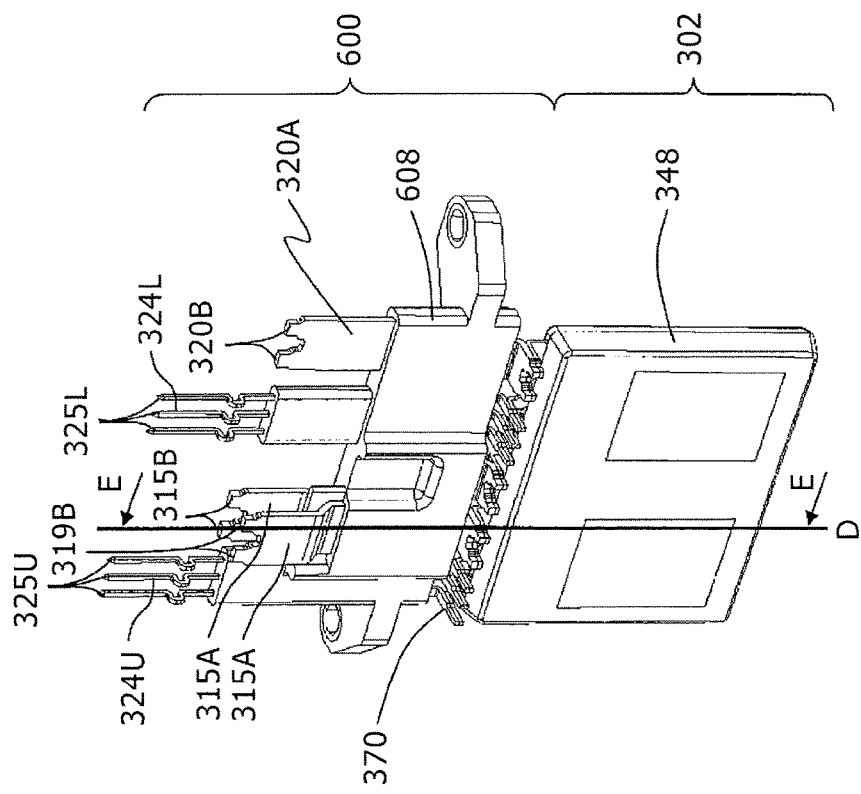

FIGS. 14(a) and 14(b) are views showing the power module 300U removing a module case 304 further from a state shown in FIGS. 13(a) through 13(c). FIG. 14(a) is a perspective view and FIG. 14(b) is a sectional view when the power module 300U is cut by the section D and viewed from the direction E similar to FIG. 12(b) and FIG. 13(b).

FIG. 15 is a perspective view of the power module 300U further removing a first seal resin 348 and a wiring insulting portion 608 from a state shown in FIGS. 14(a) and 14(b).

Figure 16B:
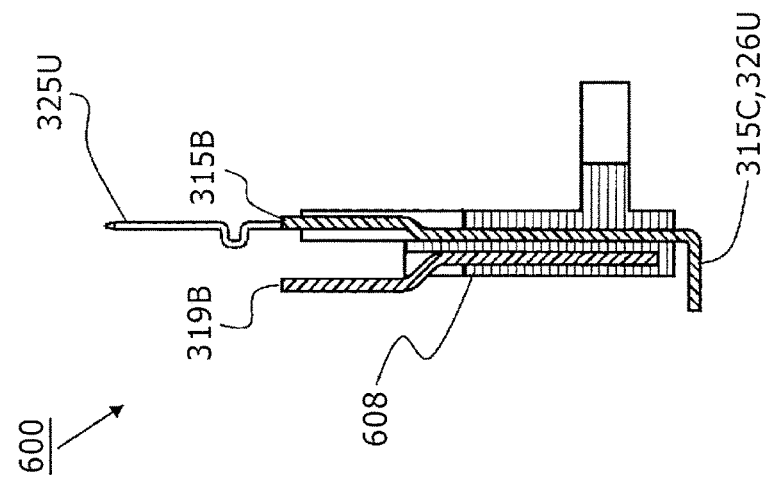
FIGS. 16(a) and 16(b) are views showing an auxiliary mold structure.
Figure 16A:
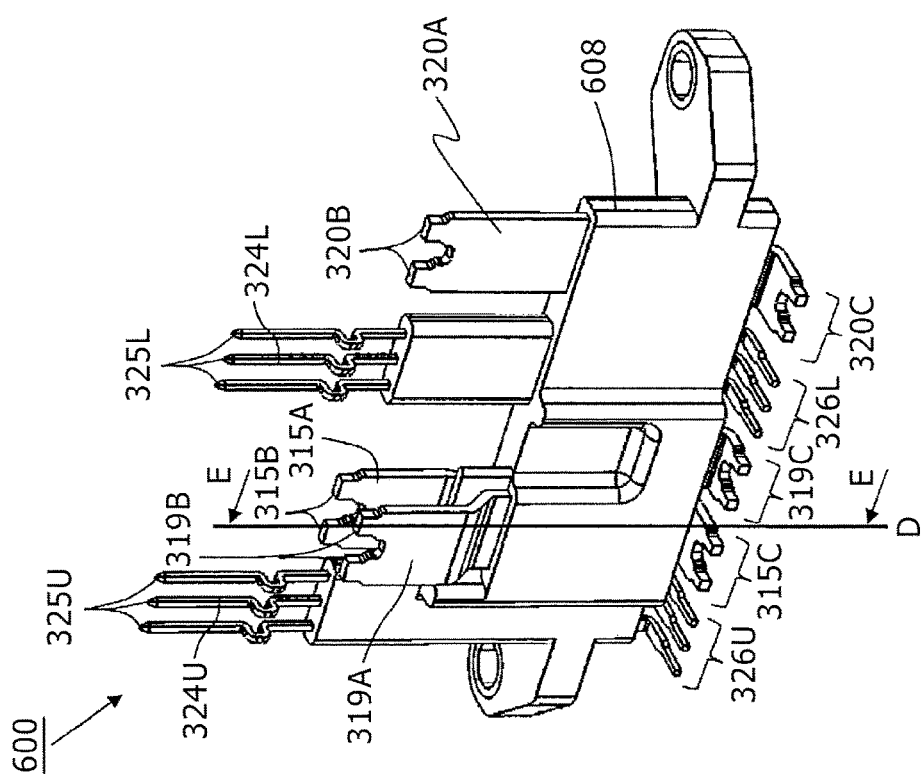

FIGS. 16(a) and 16(b) are views showing an auxiliary mold structure 600 in the power module 300U. FIG. 16(a) is a perspective view, and FIG. 16(b) is a sectional view when the power module 300U is cut by the section D and viewed from the direction E similar to FIG. 12(b), FIG. 13(b), and FIG. 14(b).

Power semiconductor elements (IGBT 328, IGBT 330, diode 156, diode 166) configuring the series circuit 150 of the upper and the lower arms are fixedly attached by squeezing the power semiconductor elements from both faces thereof by a conductor plate 315 and a conductor plate 318, or a conductor plate 320 and a conductor plate 319 as shown in FIGS. 14(a) and 14(b) and FIG. 15. The conductor plate 315 is sealed by the first seal resin 348 in a state of exposing a radiating face thereof, and an insulating sheet 333 is thermally pressure-bonded to the heat radiating face. The first seal resin 348 has a polyhedron shape (here, substantially rectangular prism shape) as shown in FIG. 14.

A module primary sealing structure 302 sealed by the first seal resin 348 is inserted into the module case 304 and is thermally pressure-bonded to an inner face of the module case 304 which is a CAN type cooler by interposing the insulating sheet 333. Here, the CAN type cooler is a cooler configuring a shape of a cylinder having an insertion port at one face thereof and a bottom at the other face. An air gap remaining at inside of the module case 304 is filled with the second seal resin 351.

The module case 304 is configured by a member having an electric conductivity, for example, aluminum alloy material (Al, AlSi, AlSiC, or Al—C) and is integrally formed in a seamless state. The module case 304 is configured by a structure which does not provide an opening other than the insertion port 306, and the insertion port 306 is surrounded by a flange 304B at an outer periphery thereof. As shown in FIG. 12(a), a first heat radiating face 307A and a second heat radiating face 307B having faces wider than the other face are arranged in a state of being opposed to each other, and the respective power semiconductor elements (IGBT 328, IGBT 330, diode 156, diode 166) are arranged to be opposed to the heat radiating faces. Three faces connecting the first heat radiating face 307A and the second heat radiating face 307B opposed to each other configure hermetically sealed faces with widths narrower than widths of the first radiating face 307A and the second heat radiating face 307B, and the insertion port 306 is formed at a face of a remaining one face. It is not necessary that a shape of the module case 304 is configured by an accurate rectangular prism, but a corner thereof may configure a curved face as shown in FIG. 12(a).

The coolant can be prevented from invading inside of the module case 304 by a simple configuration, since sealing against the coolant can be ensured by the flange 304B by using a case made of a metal having such a shape even when the module case 304 is inserted into the flow path 19 in which the coolant of water or oil flows. The fins 305 are formed uniformly respectively at the first heat radiating face 307A and the second heat radiating face 307B opposed to each other. There are formed the curved portions 304A thicknesses of which are extremely thinned at outer peripheries of the first radiating face 307A and the second heat radiating face 307B. The curved portion 304A is thinned extremely in the thickness to a degree of being deformed simply by pressing the fins 305, and therefore, the productivity after inserting the module primary seal structure 302 is improved.

An air gap between the conductor plate 315 and an inner wall of the module case 304 can be reduced by thermally pressure-bonding the conductor plate 315 to the inner wall of the module case 304 via the insulating sheet 333 as described above, and heat generated at the power semiconductor element can efficiently be transferred to the fin 305. An occurrence of a thermal stress can be absorbed by the insulating sheet 333 by providing the insulating sheet 333 with a thickness to some degree and a flexibility, which is excellent for being used in the power converter device for vehicle use having a significant temperature change.

There are provided a direct current positive pole wiring 315A and a direct current negative pole wiring 319A which are made of a metal for electrically connecting to the capacitor module 500 at outside of the module case 304, and front end portions thereof are respectively formed with the direct current positive pole terminal 315B (157) and the direct current negative pole terminal 319B (158). There is provided an alternating current wiring 320A made of a metal for supplying an alternating current power to the motor-generator MG1, and a front end thereof is formed with the alternating current terminal 320B (159). According to the present embodiment, as shown in FIG. 15, the direct current positive pole wiring 315A is connected to the conductor plate 315, the direct current negative pole wiring 319A is connected to the conductor plate 319, and the alternating current wiring 320A is connected to the conductor plate 320.

There are further provided signal wirings 324U and 324L which are made of a metal for electrically connecting to the driver circuit 174 at outside of the module case 304, and front end portions thereof are respectively formed with the signal terminal 325U (154, 155), and the signal terminal 325L (164, 165). According to the present embodiment, as shown in FIG. 15, the signal wiring 324U is connected to IGBT 328, and the signal wiring 324L is connected to IGBT 330.

The direct current positive pole wiring 315A and the direct current negative pole wiring 319A, the alternating current wiring 320A, and the signal wiring 324U and the signal wiring 324L are integrally molded as the auxiliary mold structure 600 in a state of being insulated from each other by the wiring insulating portion 608 molded by a resin material. The wiring insulating portion 608 is operated also as a support member for supporting the respective wirings, and as the resin material used therefor, a thermosetting resin or a thermoplastic resin having an insulating performance is suitable. Thereby, the insulating performance among the direct current positive pole wiring 315A, the direct current negative pole wiring 319A, the alternating current wiring 320A, the signal wiring 324U, and the signal wiring 324L can be ensured, and a high density wiring can be carried out. The auxiliary mold structure 600 is fixed to the module case 304 by the screw 309 penetrating a screw hole provided at the wiring insulating portion 608 after having been metal-bonded to the module primary sealing structure 302 and a connecting portion 370. For example, TIG welding can be used for metal-bonding of the module primary sealing structure 302 and the auxiliary mold structure 600 at the connecting portion 370.

The direct current positive pole wiring 315A and the direct current negative pole wiring 319A are laminated to each other in a state of being opposed to each other by interposing the wiring insulating portion 608 to configure a shape of being extended substantially in parallel. Currents flowing instantaneously in the switching operation of the power semiconductor elements flow opposedly and in directions opposed to each other by configuring such arrangement and shape. Thereby, magnetic fields produced by the currents are operated to cancel each other, and the low inductance formation is enabled by such operation. The alternating current wiring 320A and the signal terminals 325U and 325L are extended in directions similar to directions of the direct current positive pole wiring 315A and the direct current negative pole wiring 319A.

The connecting portion 370 in which the module primary sealing structure 302 and the auxiliary mold structure 600 are connected by metal-bonding is sealed in the module case 304 by the second seal resin 351. Thereby, an insulating distance which is necessary between the connecting portion 307 and the module case 304 can stably be ensured, and therefore, downsizing of the power module 30013 can be realized in comparison with the case where the connecting portion 307 is not sealed.

As shown in FIG. 15 and FIGS. 16(a) and 16(b), there are arranged an auxiliary module side direct current positive pole connecting terminal 315C, an auxiliary module side direct negative pole connecting terminal 319C, an auxiliary module side alternating current connecting terminal 320C, an auxiliary module side signal connecting terminal 326U, and an auxiliary module side signal connecting terminal 326L to align in one row on an auxiliary module 600 side of the connecting portion 307. On the other hand, there are arranged an element side direct current positive pole connecting terminal 315D, an element side direct current negative pole connecting terminal 319D, an element side alternating current connecting terminal 320D, an element side signal connecting terminal 327U, and an element side signal connecting terminal 327L to align in one row along one face of the first seal resin 348 having a polygonal shape on a module sealing structure 402 side of the connecting portion. Fabrication of the module primary sealing structure 302 by transfer molding is facilitated by configuring a structure of aligning the respective terminals in one row in the connecting portion 370 in this way.

The following will describe a positional relationship among the respective terminals when a portion of the module primary sealing structure 302 extended from the first seal resin 348 to an outer side is regarded as one terminal for each kind thereof. In the following explanation, a terminal configured by the direct current positive pole wiring 315A (inclusive of the direct current positive pole terminal 315B and the auxiliary module side direct current positive pole connecting terminal 315C) and the element side direct current positive pole connecting terminal 315D is referred to as a positive pole side terminal, a terminal configured by the direct current negative pole wiring 319A (inclusive of the direct current negative pole terminal 319B and the auxiliary module side direct current negative pole connecting terminal 319C) and the element side direct current negative pole connecting terminal 315D is referred to as a negative pole side terminal, a terminal configured by the alternating current wiring 320A (inclusive of the alternating current terminal 320B and the auxiliary module side alternating current connecting terminal 320C) and the element side alternating current connecting terminal 320D is referred to as an output terminal, a terminal configured by the signal wiring 324U (inclusive of the signal terminal 325U and the auxiliary module side signal connecting terminal 326U) and the element side signal connecting terminal 327U is referred to as a signal terminal for an upper arm, and a terminal configured by the signal wiring 324L (inclusive of the signal terminal 325L and the auxiliary module side signal connecting terminal 326L) and the element side signal connecting terminal 327L is referred to as a signal terminal for a lower arm. Here, the signal wiring 324U and the signal terminal 325U as well as the signal wiring 324L and the signal terminal 325L are respectively made to be control terminal portions.

All of the respective terminals described above are protruded by passing from the first seal resin 348 and the second seal resin 351 to the connecting portion 370. The respective protruded portions from the first seal resin 348 (the element side direct current positive pole connecting terminal 315D, the element side direct current negative pole connecting terminal 319D, the element side alternating current connecting terminal 320D, the element side signal connecting terminal 327U, and the element side signal connecting terminal 327L) are aligned in one row along one face of the first seal resin 348 having a polygonal shape as described above. The positive electrode side terminal and the negative electrode side terminal are protruded from the second seal resin 351 in a laminated layer state, and extended to outside of the module case 304. An excessively large stress and a gap of a mold can be prevented from being brought about at the power semiconductor element and a portion of connecting to the terminal in clamping the mold when the module primary sealing structure 302 is produced by sealing the power semiconductor element by the first seal resin 348 by constructing such a configuration. The low inductance formation can be achieved since magnetic fluxes in directions of canceling each other are generated by currents in directions opposed to each other flowing at the respective positive pole side terminal and the respective negative pole side terminal which are laminated.

The auxiliary module side direct current positive pole connecting terminal 315C, and the auxiliary module side direct current negative pole connecting terminal 319C are respectively formed at front end portions of the direct current positive pole wiring 315A, and the direct current negative pole wiring 319A on a side opposed to the direct current positive pole terminal 315B, and the direct current negative pole terminal 319B on the side of the auxiliary module 600. The auxiliary mold side alternating current connecting terminal 320C is formed at a front end portion of the alternating current wiring 320A on a side opposed to the alternating current terminal 320B. The auxiliary module side signal connecting terminals 326U and 326L are respectively formed at front end portions of the signal wirings 324U and 324L on a side opposed to the signal terminals 325U and 325L.

On the other hand, the element side direct current positive pole connecting terminal 315D, the element side direct current negative pole connecting terminal 319D, and the element side alternating current connecting terminal 320D are respectively formed on the conductor plates 315, 319, and 320 on the side of the module primary sealing structure 302. The element side signal connecting terminals 32713 and 327L are respectively connected to IGBT's 328 and 330 by bonding wires 371.

Next, an explanation will be given of steps of integrating the module primary sealing structure 302 in reference to FIG. 17 through FIG. 21.

Figure 17:
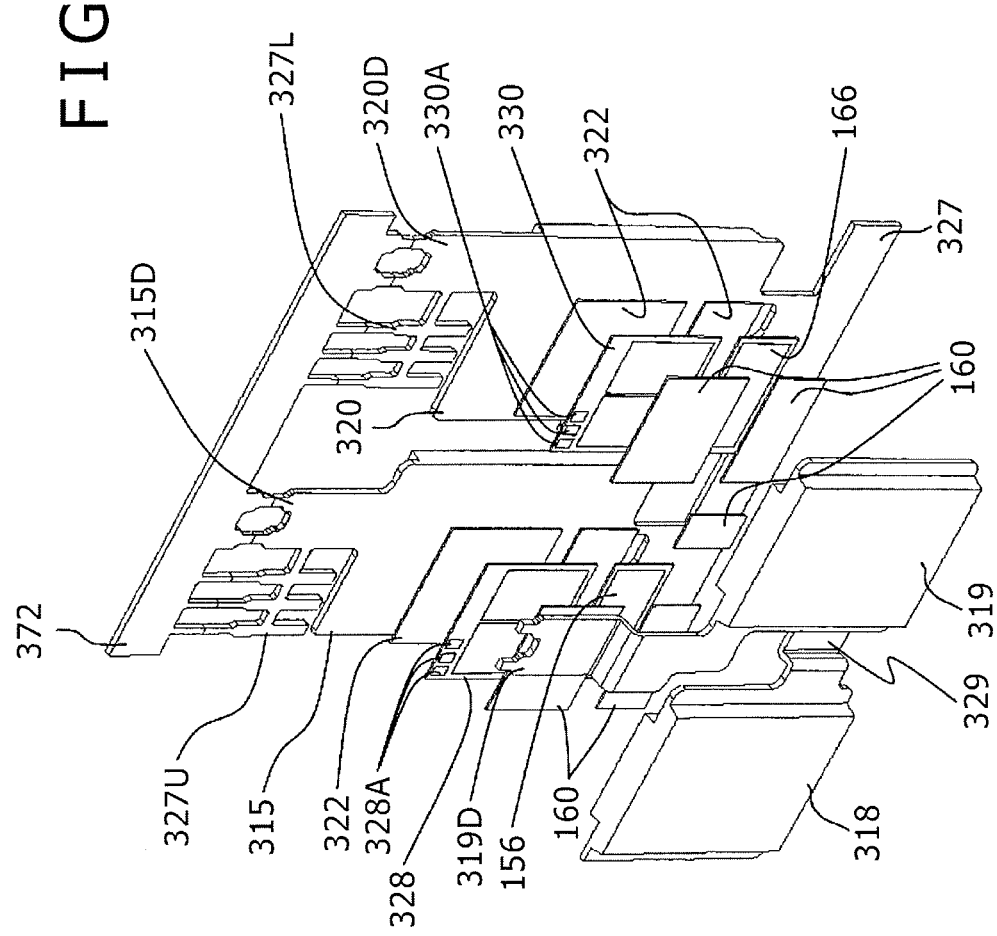
FIG. 17 is a view for explaining a step of integrating a module primary sealing structure.

As shown in FIG. 17, the conductor plate 315 on the direct current positive pole side and the conductor plate 320 on the alternating current output side, and the element side signal connecting terminals 327U and 327L are integrally worked to configure an arrangement substantially in the same plane state in a state of being connected by common tie bars 372. The conductor plate 315 is fixedly attached with the collector electrode of IGBT 328 on the upper arm side and the cathode electrode of the diode 156 on the upper arm side. The conductor plate 320 is fixedly attached with the collector electrode of IGBT 330 on the lower arm side and the cathode electrode of the diode 166 on the lower arm side. The conductor plate 318 and the conductor plate 319 are arranged substantially in the same plane state on IGBT's 328 and 330 and the diodes 155 and 166. The conductor plate 318 is fixedly attached with the emitter electrode of IGBT 328 on the upper arm side and the anode electrode of the diode 156 on the upper arm side. The conductor plate 318 is fixedly attached with the emitter electrode of IGBT 328 on the upper arm side and the anode electrode of the diode 156 on the upper arm side. The conductor plate 319 is fixedly attached with the emitter electrode of IGBT 330 on the lower arm side and the anode electrode of the diode 166 on the lower arm side. The respective power semiconductor elements are respectively fixed to element fixing portions 322 provided at the respective conductor plates via metal bonding materials 160. The metal bonding material 160 is a low temperature sintering bonding material including, for example, a solder, a silver sheet, and fine metal particles.

The respective power semiconductor elements are configured by a flat structure in a plate-like shape, and the respective electrodes of the power semiconductor elements are formed on a surface and a back face. As shown in FIG. 17, the respective electrodes of the power semiconductor element are interposed by the conductor plate 315 and the conductor plate 318, or the conductor plate 320 and the conductor plate 319. That is, the conductor plate 315 and the conductor plate 318 configure a laminated layer arrangement opposed to each other substantially in parallel via IGBT 328 and the diode 156. Similarly, the conductor plate 320 and the conductor plate 319 configure a laminated layer arrangement opposed to each other substantially in parallel via IGBT 330 and the diode 166. The conductor plate 320 and the conductor plate 318 are connected via an intermediate electrode 329. The upper arm circuit and the lower arm circuit are electrically connected by the connection, and the upper and lower arm series circuit is formed.

Figure 18:
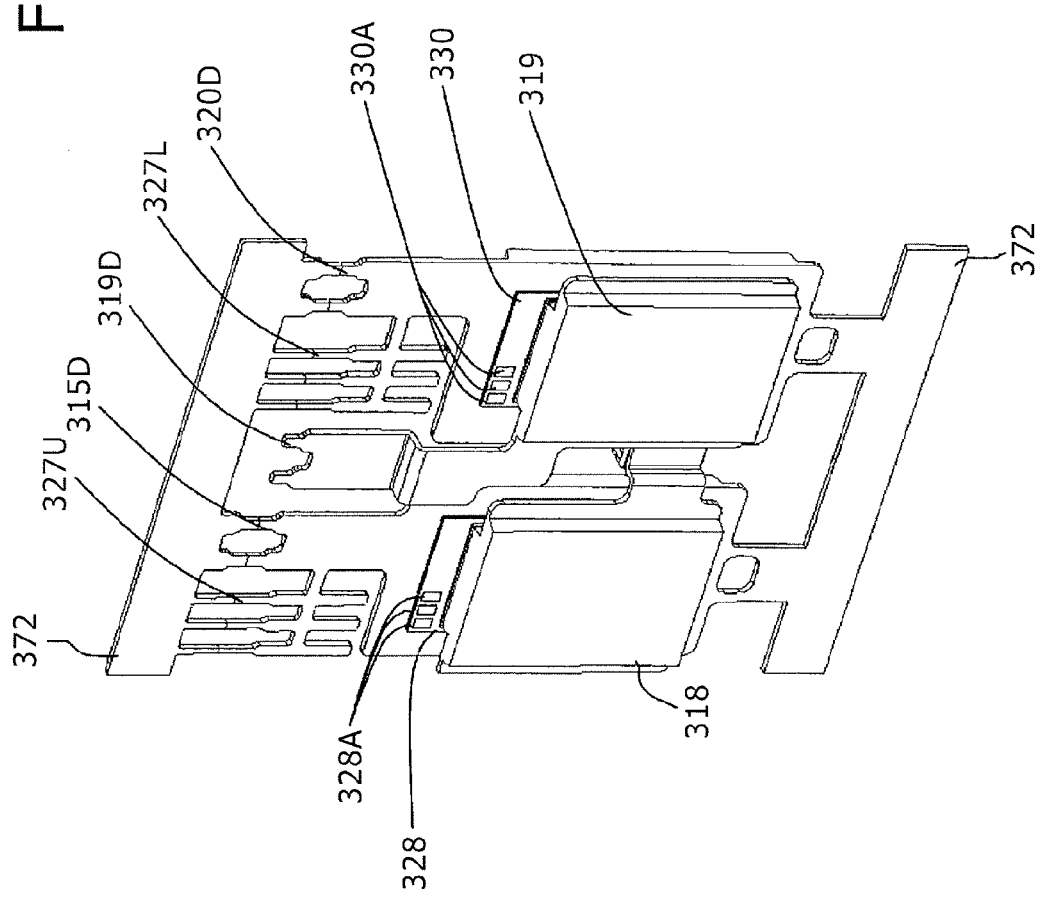
FIG. 18 is a view for explaining a step of integrating the module primary sealing structure.

A state shown in FIG. 18 is configured by interposing IGBT 328 and the diode 156 between the conductor plate 315 and the conductor plate 318, interposing IGBT 330 and the diode 166 between the conductor plate 320 and the conductor plate 319, and connecting the conductor plate 320 and the conductor plate 318 via the intermediate electrode 329 as described above. Thereafter, a state shown in FIG. 19 is configured by connecting the control electrode 328A of IGBT 328 and the element side signal connecting terminal 327U by the bonding wire 371, and connecting the control electrode 330A of IGBT 330 and the element side signal connecting terminal 327L by the bonding wire 371.

Figure 19:
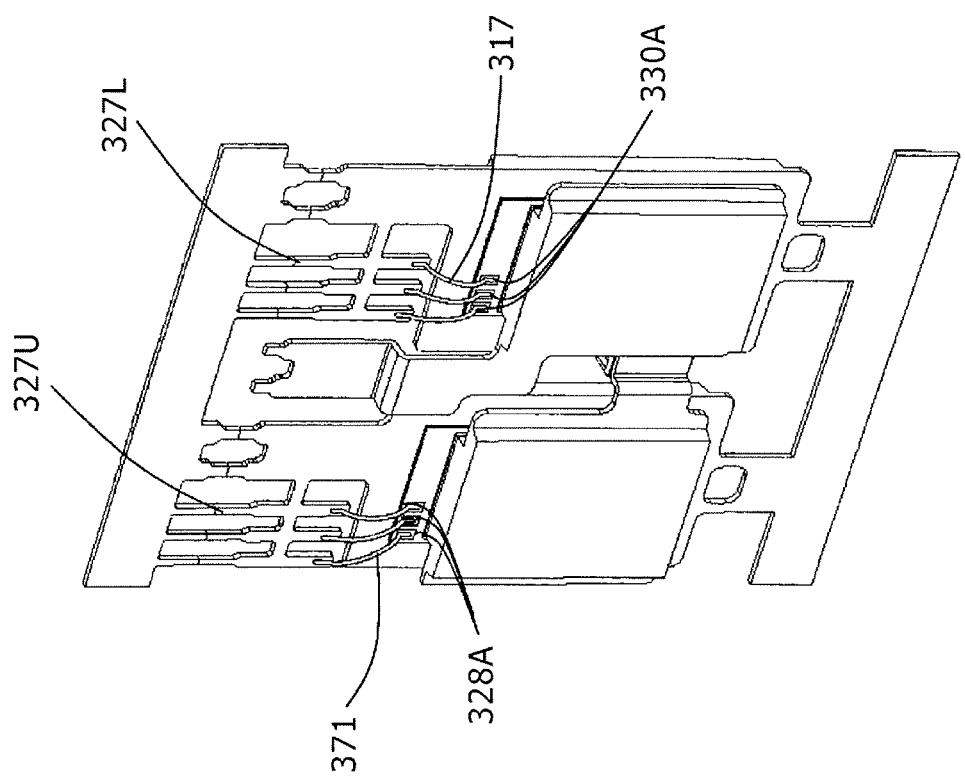
FIG. 19 is a view for explaining a step of integrating the module primary sealing structure.
Figure 20:
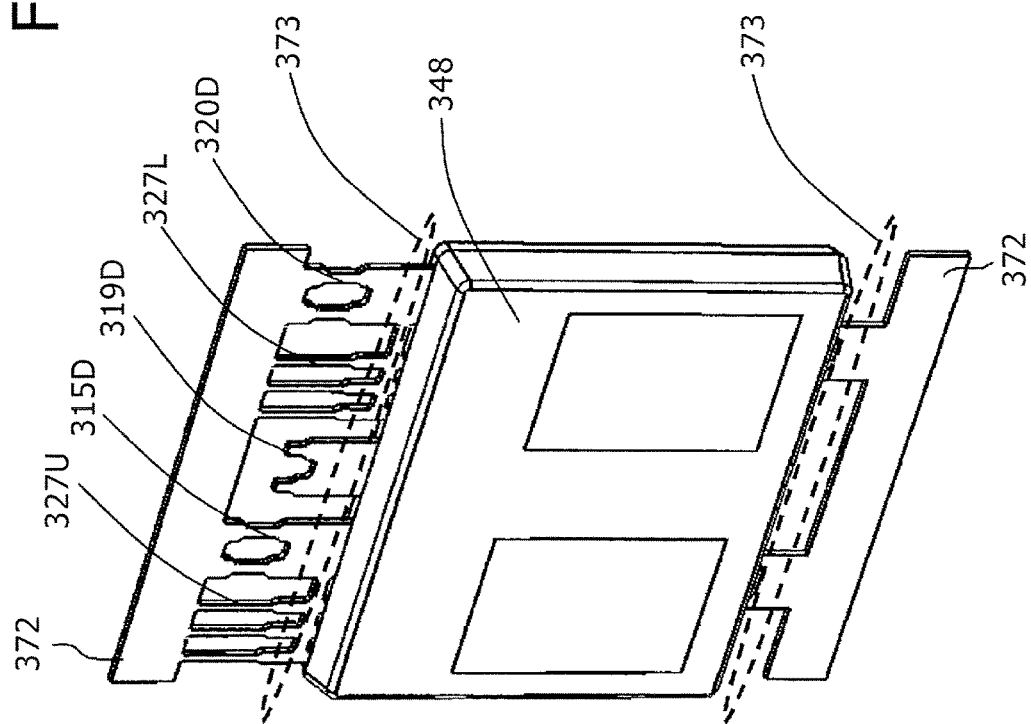
FIG. 20 is a view for explaining a step of integrating the module primary sealing structure.

When the module primary sealing structure 302 is integrated to a state shown in FIG. 19, a portion including the power semiconductor elements and the bonding wires 371 is sealed by the first seal resin 348 as shown in FIG. 20. At this occasion, the portion is pressed by the mold from upper and lower sides at a mold pressure face 373, and the portion is molded by filling the first seal resin 348 in the mold by transfer molding.

Figure 21:
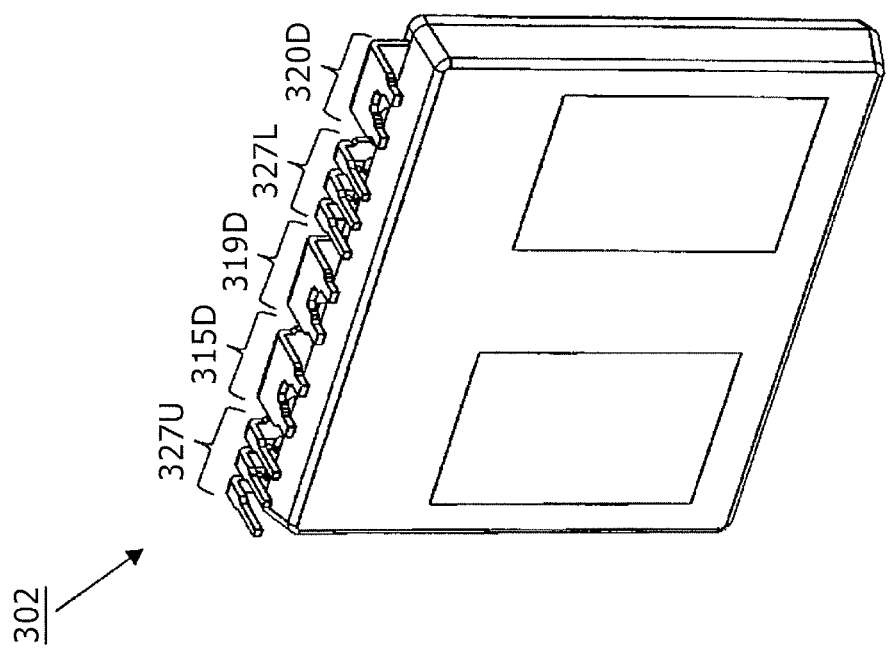
FIG. 21 is a view for explaining a step of integrating the module primary sealing structure.

When the portion is sealed by the first seal resin 348, the element side direct current positive pole connecting terminal 315D, the element side alternating current connecting terminal 320D, and the element side signal connecting terminals 327U and 327L are respectively separated by cutting to remove the tie bar 372. Respective end portions of the element side direct current positive pole connecting terminal 315D, the element side direct current negative pole connecting terminal 319D, the element side alternating current connecting terminal 320D, and the element side signal connecting terminals 327U and 327L aligned in one row on one side of the module primary sealing structure 302 are folded to bend respectively in the same direction as shown in FIG. 21. Thereby, the productivity is improved by facilitating the operation when the module primary sealing structure 302 and the auxiliary mold structure 600 are metal-bonded at the connecting portion 370, and the reliability of metal-bonding can be improved.

FIGS. 22(*a*) and 22(*b*) are views for explaining a transfer molding step of the first seal resin 348. FIG. 22(*a*) shows a vertical sectional view before clamping the module, and FIG. 22(*b*) shows a vertical sectional view after clamping the mold.

As shown in FIG. 22(*a*), the module primary sealing structure 302 before sealing shown in FIG. 19 is installed between an upper side mold 374A and a lower side mold 374B. A mold space 375 is formed in the mold as shown in FIG. 22(*b*) by squeezing the module primary seal structure 302 by the upper side mold 374A and the lower side mold 374B from upper and lower sides at the mold pressing face 373 and clamping the mold. The power semiconductor elements (IGBT's 328, 330 and diodes 155, 166) are sealed by the first seal resin 348 at the module primary seal structure 302 by filling the first seal resin 348 to the mold space 375 and molding the first seal resin 348.

As shown in FIG. 20, at the mold pressing face 373, the element side direct current positive pole connecting terminal 315D, the element side direct current negative pole connecting terminal 319D, the element side alternating current connecting terminal 320D, the element side signal connecting terminal 327U, and the element side signal connecting terminal 327L are arranged to align in one row. The mold can be clamped without generating an extraneous stress at the connecting portions of the respective terminals and the power semiconductor elements and tightly by using the upper side mold 374A and the lower side mold 374B by arranging the terminals in this way. Therefore, the power semiconductor elements can be sealed without destructing the power semiconductor elements, or leaking the first seal resin 348 from a gap.

Figure 23:
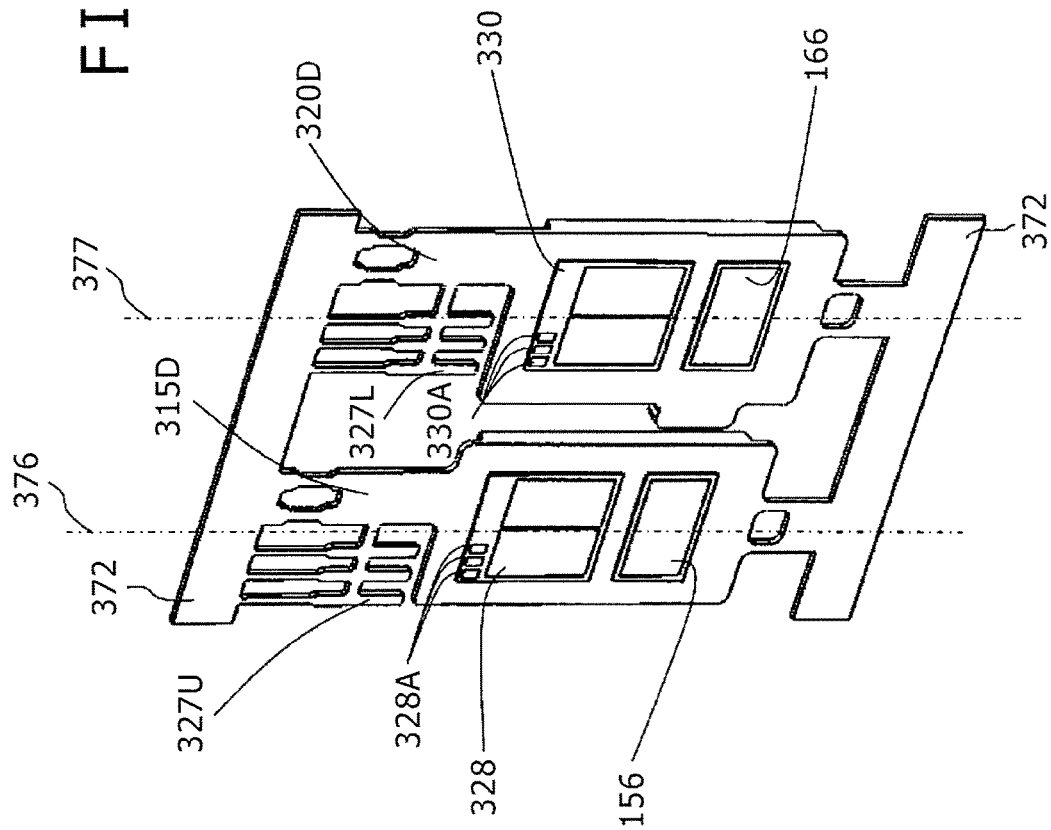
FIG. 23 is a view showing a relationship of arranging a control electrode and respective terminals of a power semiconductor element.

Next, an explanation will be given of a relationship of arranging the control electrodes and the respective terminals of the power semiconductor elements in the module primary seal structure 302 in reference to FIG. 23. FIG. 23 shows a state of removing the conductor plates 318 and 319 and the intermediate electrode 329 from the state of FIG. 18 for facilitating understanding. In FIG. 23, the control electrodes 328A and 330A are respectively arranged at positions biased to a left side of the drawing relative to center lines 376 and 377 on one sides (upper sides of the drawing) of IGBT 328 and IGBT 330. The center lines 376 and 377 are orthogonal to a direction of aligning the element side direct current positive pole connecting terminal 315D, the element side direct current negative pole connecting terminal 319D, the element side alternating current connecting terminal 320D, the element side signal connecting terminal 327U, and the element side signal connecting terminal 327L.

When it is considered to divide IGBT 328 into two at the center line 376, the element side signal connecting terminal 327U is arranged on one side of arranging the control electrode 328A, and the element side direct current positive pole connecting terminal 315D is arranged on the other side. Similarly, when it is considered to divide IGBT 330 into two at the center line 307, the element side signal connecting terminal 372L is arranged on one side of arranging the control electrode 330A, and the element side alternating current connecting terminal 320D is arranged on the other side. As shown in FIG. 18, the element side direct current negative pole connecting terminal 319D is arranged between the element side direct current positive pole connecting terminal 315D and the element side signal connecting terminal 327L. The reliability of the connection can be improved by minimizing lengths of the bonding wires 371 of respectively connecting the control electrodes 328A and 330A and the element side signal connecting terminals 327U and 327L by arranging the terminals in this way. The module primary seal structure 302, and therefore, the power module 300U can be downsized by concentrating the respective terminals.

As shown in FIG. 23, the element side direct current positive pole connecting terminal 315D, the element side alternating current connecting terminal 320D, the element side signal connecting terminal 327U, and the element side signal connecting terminal 327L are integrally worked in a state of being connected by the common tie bar 372. Thereby, dispersions in the flatness and the thickness can be restrained to be very small among the respective terminals. On the other hand, the element side direct current negative pole connecting terminal 319D which is worked separately from the respective terminals described above is combined, and therefore, the dispersions in the flatness and the thickness are larger than those of the other respective terminals, and there is a possibility of generating an extraneous stress at the connecting portion of the element side direct current negative pole connecting terminal 319D and the power semiconductor element when the mold is clamped.

Figure 24:
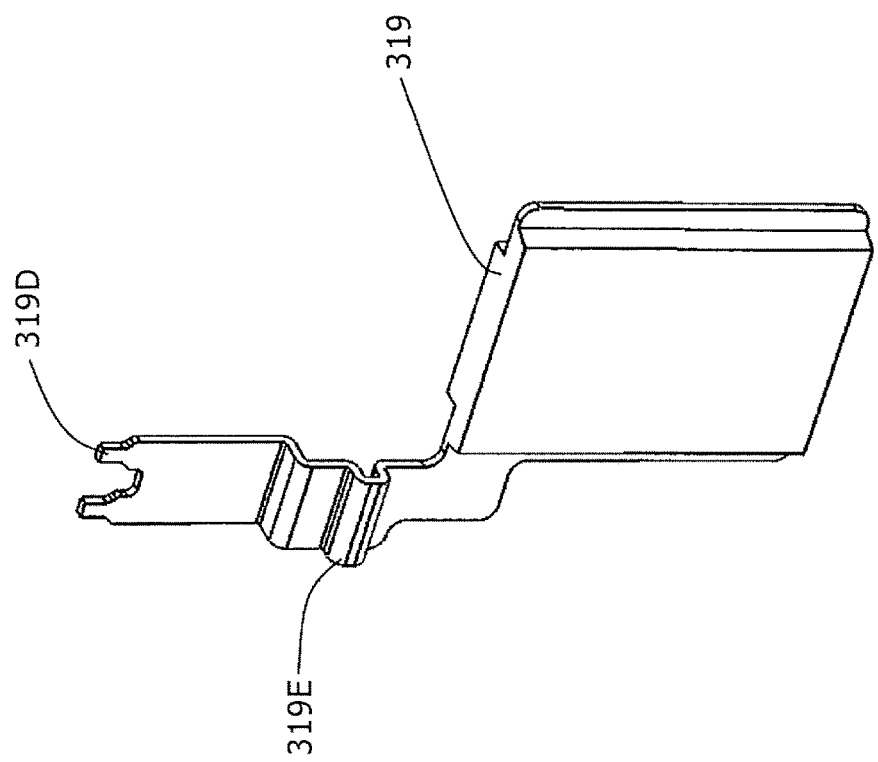
FIG. 24 is a view showing a modified example of providing a stress alleviating portion at a conductor plate on a side of a direct current wiring.

FIG. 24 is a view showing a modified example for avoiding the inconvenience described above. According to the modified example, there is provided a stress alleviating portion 319E for absorbing and alleviating a stress when the mold is clamped at the conductor plate 319 which is provided with the element side direct current negative pole connecting terminal 319D. It is preferable to dispose the position of the stress alleviating portion 319E between a portion (soldered portion) mounted with the power semiconductor element and the mold pressing face 373. Incidentally, although it is conceivable to simply thin a thickness of a portion of the conductor plate 319 more than the other portion as the stress alleviating portion 319E, in such a case, a current density is increased at the one portion, and therefore, there is a concern of lowering an electric performance. Therefore, it is preferable to configure the stress alleviating portion 319E by bending a portion of the conductor plate 319 as shown in FIG. 24. Thereby, the current density is not increased at the stress alleviating portion 319, directions of currents are opposed to each other at a folded portion by bending, and therefore, the stress alleviating portion 319 can also contribute to restrain an inductance.

Figure 25:
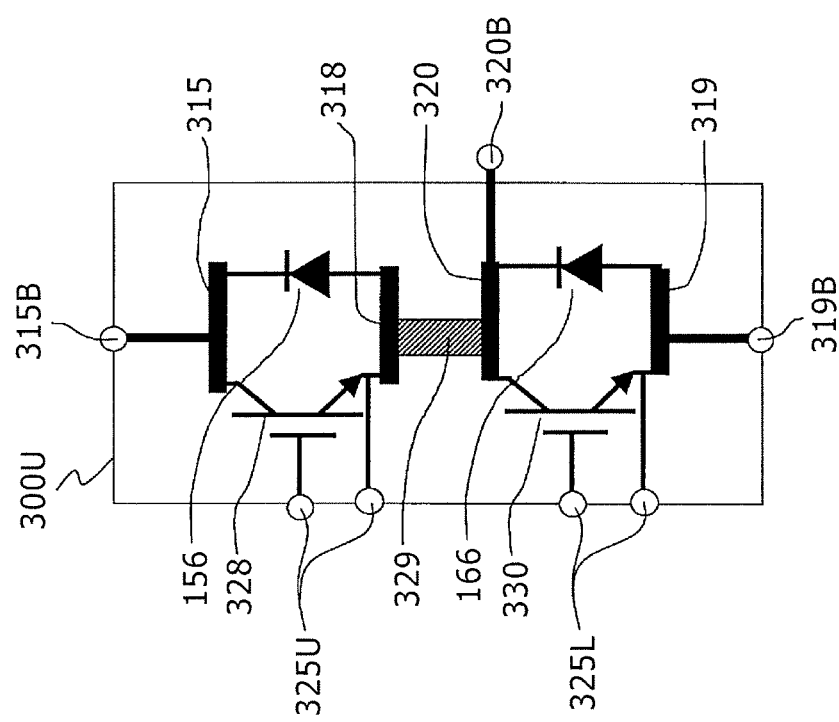
FIG. 25 is a diagram showing an incorporated circuit configuration of the power module.

FIG. 25 is a circuit diagram showing a circuit configuration of the power module 300U. The collector electrode IGBT 328 on the upper arm side and the cathode electrode of the diode 156 on the upper arm side are connected via the conductor plate 315. Similarly, the collector electrode of IGBT 330 on the lower arm side and the cathode electrode of the diode 166 on the lower arm side are connected via the conductor plate 320. The emitter electrode of IGBT on the upper arm side and the anode electrode of the diode 156 on the upper arm side are connected via the conductor plate 318. Similarly, the emitter electrode of IGBT 330 on the lower arm side and the anode electrode of the diode 166 on the lower arm side are connected via the conductor plate 319. The conductor plates 318 and 320 are connected by the intermediate electrode 329. The upper and lower arms series circuit is formed by the circuit configuration.

Figure 26A:
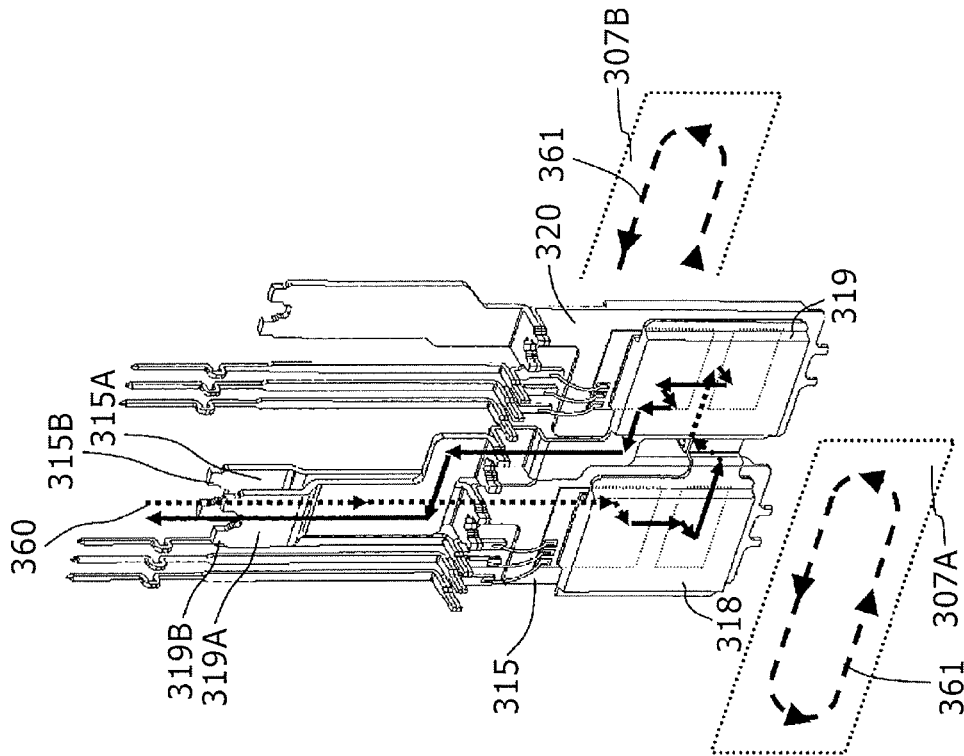
FIGS. 26(a) and 26(b) are views for explaining low inductance formation of the power module.
Figure 26B:
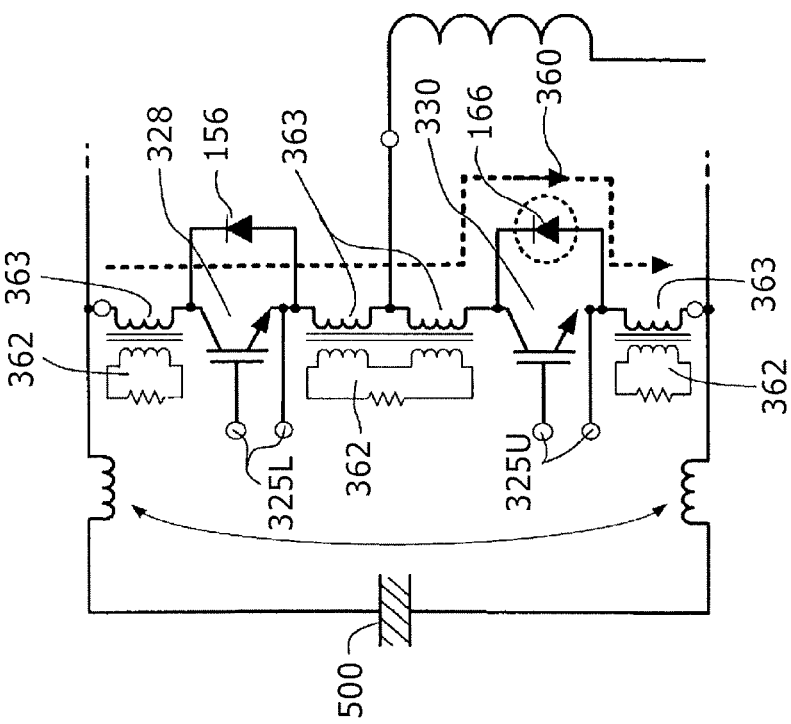

Next, an explanation will be given of an operation of bringing about low inductance formation in reference to FIGS. 26(*a*) and 26(*b*). FIG. 26(*a*) is a diagram showing an equivalent circuit when the recovery current flows, and FIG. 26(*b*) is a view showing a route of the recovery current.

In FIG. 26(*a*), there is configured a state where the diode 166 on the lower arm side is conducted in a forward direction biased state. When IGBT 328 on the upper arm side is brought into an ON state under the state, the diode 166 on the lower arm side is biased in a reverse direction and the recovery current caused by carrier movement penetrates the upper and the lower arms. At this occasion, the recovery current 360 shown in FIG. 26(*b*) flows in the respective conductor plates 315, 318, 319, and 320. The recovery current 360 is indicated by a dotted line, passes the direct current positive pole terminal 315B (157) arranged opposedly to the direct current negative pole terminal 319B (158), successively flows in a route in a loop shape formed by the respective conductor plates 315, 318, 319, and 320, and flows again as shown by a bold line via the direct current negative pole terminal 319B (158) arranged opposedly to the direct current positive pole terminal 315B (157). Eddy currents 361 flow in the first heat radiating face 307A and the second heat radiating face 307B of the module case 304 by making the current flow in the loop shape route. A wiring inductance 363 of the loop shape route is reduced by a magnetic field canceling effect generated by the equivalent circuit 362 at a current route of the eddy current 361.

The nearer the current route of the recovery current 360 to the loop shape, the more increased the inductance reducing operation. According to the present embodiment, the current route of the loop shape flows in a route near to a side of the direct current positive pole terminal 315B (157) of the conductor plate 315 as shown by the dotted line, and passes in IGBT 328 and the diode 156. The current route of the loop shape flows in a route remote from the side of the direct current positive pole terminal 315B (157) of the conductor plate 318 as shown by the bold line, thereafter, flows in the route remote from the side of the direct current positive pole terminal 315B (157) of the conductor plate 320 as shown by the dotted line, and passes in IGBT 330 and the diode 166. The current route of the loop shape flows in a route near to the side of the direct current negative pole wiring 319A of the conductor plate 319 as shown by the bold line. The current route nearer to the loop shape is formed by making the current route of the loop shape pass the routes on the side near to and the side remote from the direct current positive pole terminal 315B (157) and the direct current negative pole terminal 319B (158) in this way.

Figure 38:
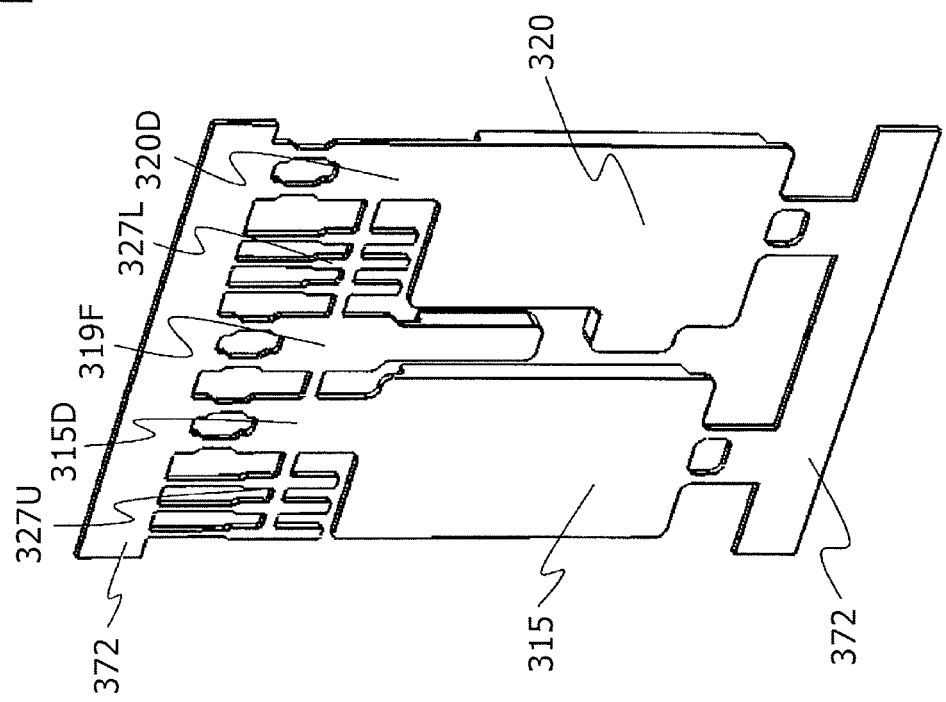
FIG. 38 is a view showing a modified example in a case of dividing a direct current negative pole wiring.

FIG. 38 is a view showing a modified example in a case of dividing the direct current negative pole wiring. Incidentally, a configuration of a notation the same as the notation described above has the same function. The element side direct current negative pole connecting terminal 319D shown in FIG. 18 is combined with portions worked separately from the respective terminals described above. Therefore, the dispersions of the flatness and thickness are larger than those of the other respective terminals, and there is a possibility of bringing about an extraneous stress at a connecting portion of the terminal and the power semiconductor terminal when the mode is clamped.

Hence, as shown in FIG. 38, the element side direct current negative pole connecting terminal 319D shown in FIG. 18 is divided and the negative pole side connecting terminal 319F is arranged on a face substantially the same as those of the element side alternating current connecting terminal 320D and the element side direct current positive pole connecting terminal 315D.

Figure 39:
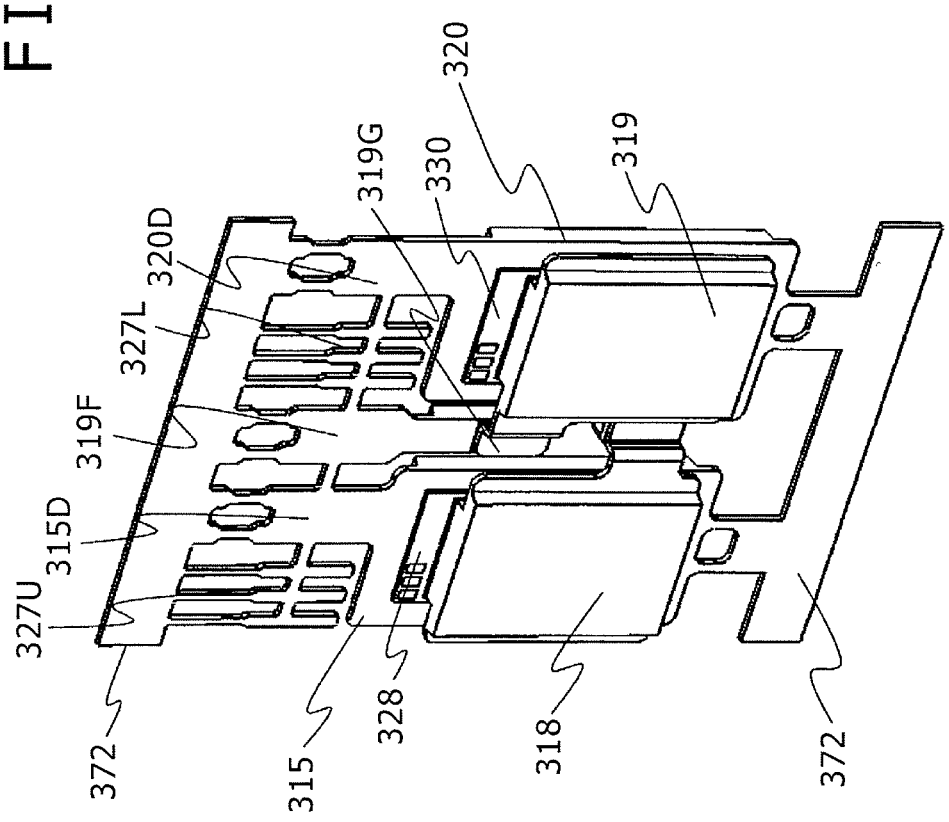
FIG. 39 is a view for explaining a step of integrating the module primary sealing member according to the modified example shown in FIG. 38.

Also, as shown in FIG. 39, an element side direct current negative pole connecting terminal 319G is extended from an edge side of the conductor 319 to a position of being opposed to a portion of the negative pole side connecting terminal 319F. Furthermore, an end portion of the element side direct current negative pole connecting terminal 319G is folded to bend to the side of the negative pole side connecting terminal 319F.

Furthermore, as shown in FIG. 40, an end portion of the element side direct current negative pole connecting terminal 319G is connected to the negative pole side connecting terminal 319F via a metal bonding member 161. A module primary sealing structure 303 shown in FIG. 41 is finished when the module structure shown in FIG. 40 is sealed by the first seal resin 348 by the producing method shown in FIGS. 22(*a*) and 22(*b*) after bonding various kinds of the semiconductor elements and the terminals by the metal bonding member. As shown in FIG. 41, the negative side connecting terminal 319F is integrally formed with the tie bar 372 along with the element side direct current positive pole connecting terminal 315D, the element side alternating current connecting terminal 320D, and the element side signal connecting terminal 327U. The tie bar 372 including the portion connecting with the negative pole side connecting terminal 319F can be cut together.

Thereby, the dispersions in the flatness and the thickness can be restrained to be very small among the respective terminals.

Figure 27:
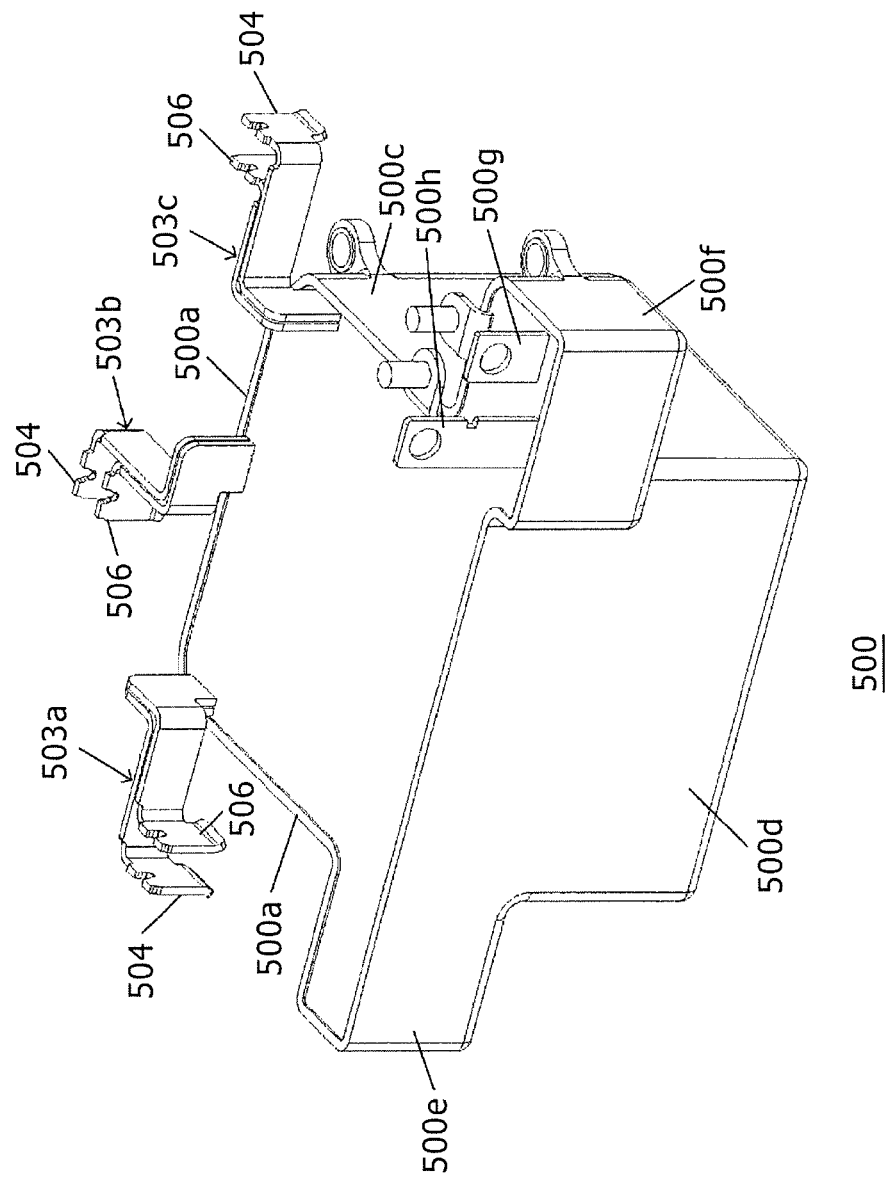
FIG. 27 is a perspective view of an outlook of the capacitor module.

FIG. 27 is a perspective view of an outlook of the capacitor module 500. Plural capacitor cells are provided in the capacitor module 500. Capacitor terminals 503*a* through 503*c* are provided to protrude at an upper face of the capacitor module 500 in proximity to a face of the capacitor module 500 opposed to the flow path 19. The capacitor terminals 503*a* through 503*c* are formed in correspondence with the positive pole terminals 157 and the negative pole terminals 158 of the respective power modules 300. The capacitor terminals 503*a* through 503*c* are configured by the same shape, insulating sheets are provided between the negative pole side capacitor terminals 504 and the positive pole side capacitor terminals 506 configuring the capacitor terminals 503*a* through 503*c*, and insulation between the terminals is ensured.

Protruded portions 500*e* and 500*f* are formed at an upper portion of the capacitor module 500 on a side of a side face 500*d*. A discharge resistor is mounted in the protruded portion 500*e*, and a Y capacitor for a countermeasure against common mode noise is mounted in the protruded portion 500*f*. The power source terminals 508 and 509 shown in FIG. 5 are attached to terminals 500*g* and 500*h* which are protruded from an upper face of the protruded portion 500*f*. As shown in FIG. 10, the recessed portions 405*a* and 405*b* are formed between the openings 402*b* and 402*c* and the side face 12*d*. When the capacitor module 500 is contained in the containing space of the flow path forming structure 12, the protruded portion 500*e* is contained in the recessed portion 405*a*, and the protruded portion 500*f* is contained in the recessed portion 405*b*.

The discharge resistor mounted in the protruded portion 500*e* is a resistor for discharging an electric charge stored in the capacitor cells in the capacitor module 500 when the inverter is stopped. The recessed portion 405a which contains the protruded portion 500e is provided directly above the flow path of cooling water flowing in from the inlet pipe 13, and therefore, a temperature rise of the discharge resistor in discharging can be restrained.

Figure 28:
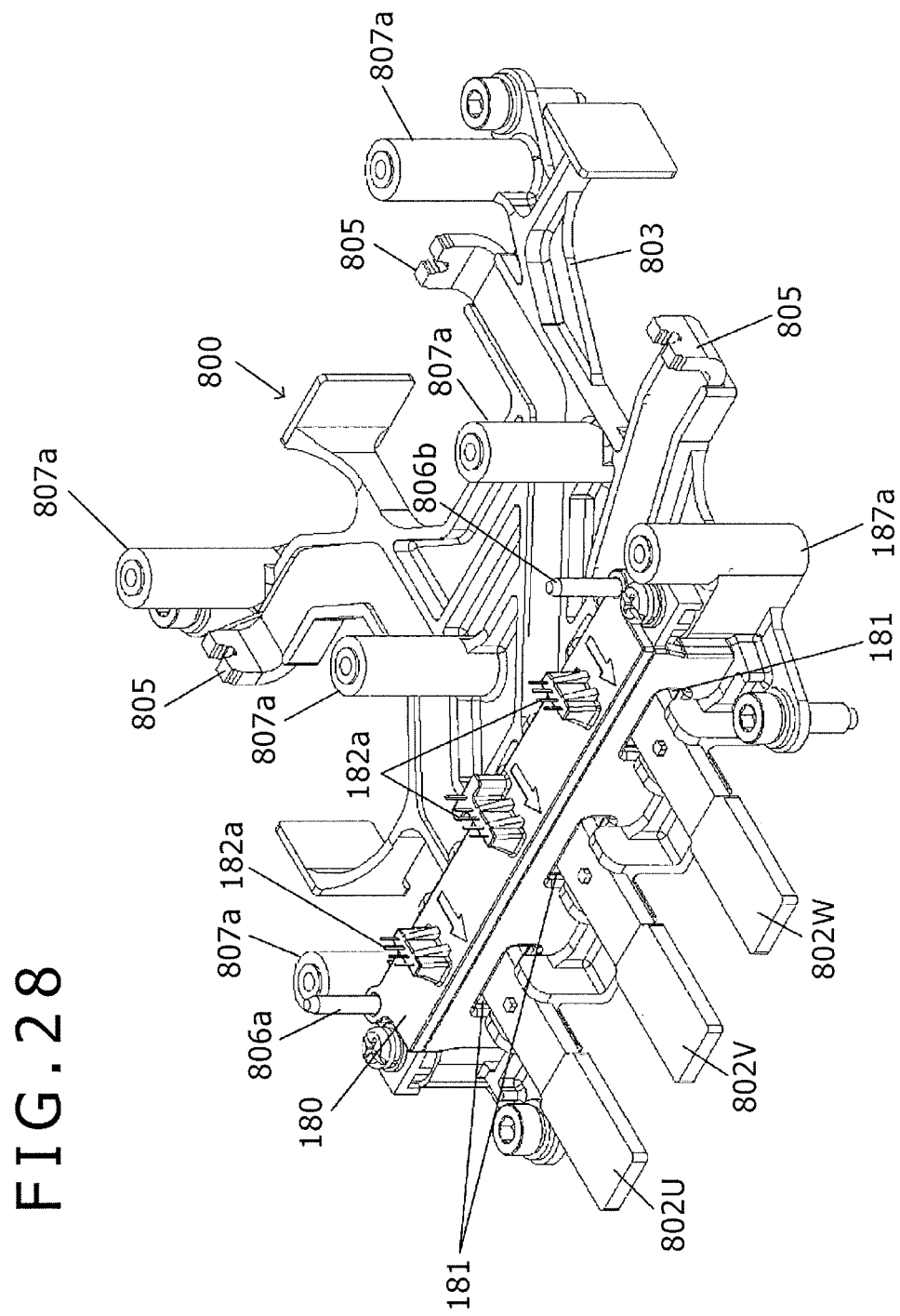
FIG. 28 is a perspective view of the bus bar assembly.

FIG. 28 is a perspective view of the bus bar assembly 800. The bus bar assembly 800 includes alternating current bus bars 802U, 802V, and 802W of U phase, V phase, and W phase, a holding member 803 for holding to fix the alternating current bus bars 802U through 802W, and the current sensor module 180 for detecting alternating currents flowing in the alternating current bus bars 802U through 802W. The alternating current bus bars 802U through 802W are respectively formed by wide width conductors. There are formed the plural support members 807a to protrude from the holding member 803 in an upper direction at the holding member 803 which is formed by an insulating material of resin or the like.

The current sensor module 180 is arranged at the bus bar assembly 800 in parallel with the side face 12d at a position in proximity with the side face 12d of the flow path forming structure 12 when the bus bar assembly 800 is loaded onto the flow path forming structure 12 as shown in FIG. 8 described above. As shown in FIG. 28, there are respectively formed through holes 181 for penetrating the alternating current bus bars 802U through 802W at the side face of the current sensor module 180. Sensor elements are provided at portions of the current sensor module 180 formed with the through holes 181, and signal lines 182a of the respective sensor elements are protruded from an upper face of the current sensor 180. The respective sensor elements are arranged to align in an extending direction of the current sensor module 180, that is, in an extending direction of the side face 12d of the flow path forming structure 12. The alternating current bus bars 802U through 802W penetrate the respective through holes 181 and front end portions thereof are protruded in parallel.

The holding member 803 is formed with protruded portions 806a and 806b for positioning to protrude in the upper direction. The current sensor module 180 is fixed to the holding member 803 by screw fastening. At that occasion, the current sensor module 180 is positioned by engaging the protruded portions 806a and 806b and positioning holes formed at a frame of the current sensor module 180. When the driver circuit board 22 is fixed to the support member 807a, the signal line 182a of the current sensor module 180 is positioned to a through hole of the driver circuit board 22 by engaging the protruded portions 806a and 806b for positioning to positioning holes formed on the side of the driver circuit board 22. The signal line 182a is bonded to a wiring pattern of the driver circuit board 22 by solder.

According to the present embodiment, the holding member 803, the support member 807a, and the protruded portions 807a and 806b are integrally molded by a resin. In this way, the holding member 803 is provided with a function of positioning the current sensor module 180 and the driver circuit board 22, and therefore, an integrating and solder connecting operation of the signal line 182a and the driver circuit board 22 is facilitated. A number of pieces of parts of a total of the power converter device can be reduced by providing a mechanism of holding the current sensor module 180 and the driver circuit board 22 at the holding member 803.

The alternating current bus bars 802U through 802W are fixed to the holding member 803 such that the wide width faces are horizontal, and connecting portions 805 connected to the alternating current terminals 159 of the power modules 300U through 300W are vertically erected. A front end of the connecting portion 805 is configured by a recessed and protruded shape to configure a shape by which heat is concentrated on the recessed and protruded portion in welding.

The current sensor module 180 is arranged in parallel with the side face 12d of the flow path forming structure 12 as described above, and therefore, the respective alternating current bus bars 802U through 802W protruded from the through holes 181 of the current sensor module 180 are arranged at the side face 12d of the flow path forming structure 12. The respective power modules 300U through 300W are arranged at the flow path sections 19b, 19a, and 19c formed along the side faces 12b, 12a, and 12c of the flow path forming structure 12. Therefore, the connecting portions 805 of the alternating current bus bars 802U through 802W are arranged at positions in correspondence with the side faces 12a through 12c of the bus bar assembly 800. As a result, as shown in FIG. 8, the U phase alternating current bus bar 802U is extended from the power module 300U arranged at a vicinity of the side face 12b to the side face 12d, the V phase alternating current bus bar 802V is extended from the power module 300V arranged at a vicinity of the side face 12a to the side face 12d, and the W phase alternating current bus bar 802W is extended from the power module 300V arranged at a vicinity of the side face 12c to the side face 12d.

Figure 29:
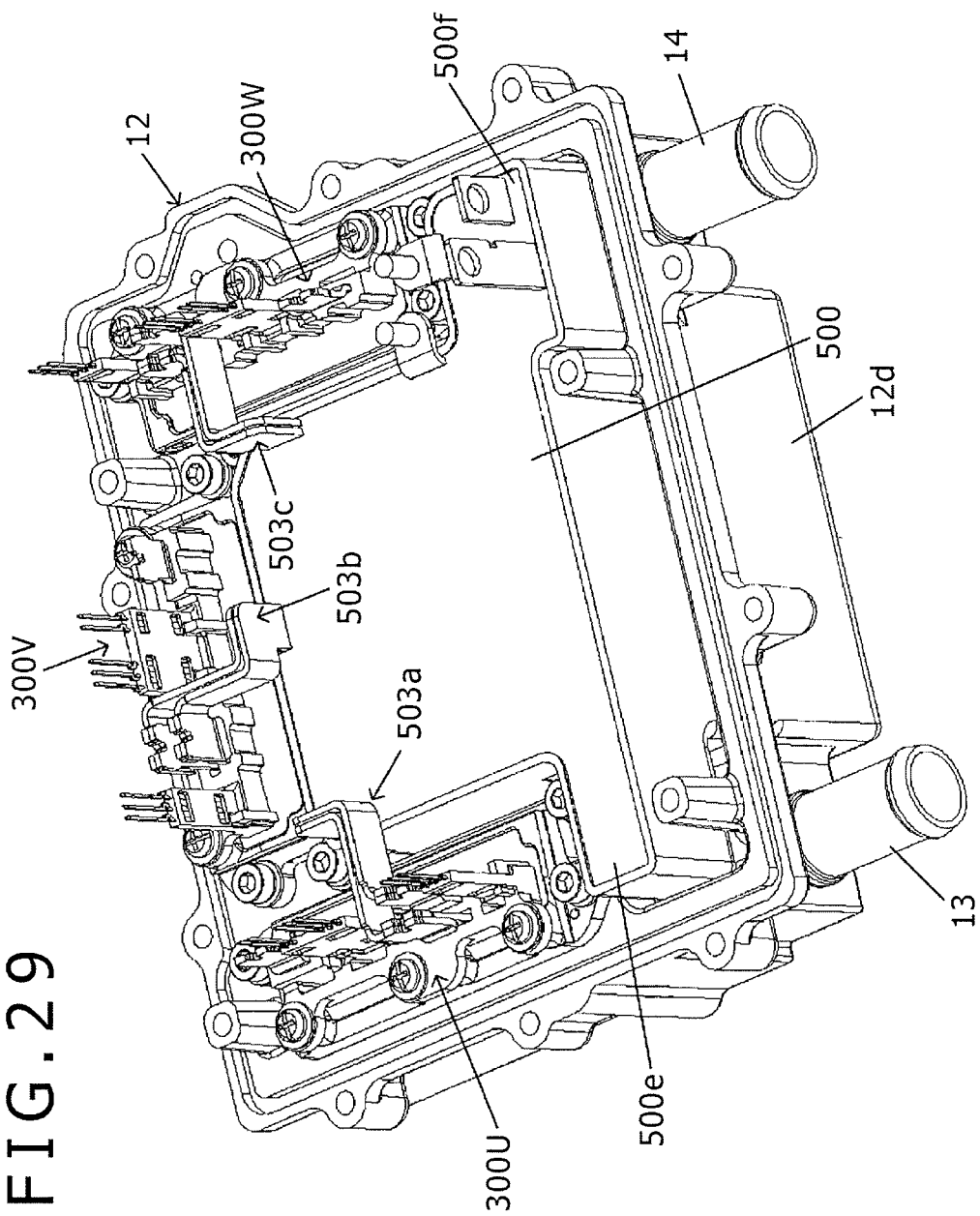
FIG. 29 is a view showing the flow path forming structure mounted with the power module and the capacitor module.

FIG. 29 is a view showing the flow path forming structure 12 in which the power modules 300U through 300W are fixed to the opening portions 402a through 402c, and the capacitor module 500 is contained in the containing space 405. In the example shown in FIG. 29, the power module 300U of U phase is fixed to the opening portion 402b, the power module 300V of V phase is fixed to the opening portion 402a, and the power module 300W of W phase is fixed to the opening portion 402c. Thereafter, the capacitor module 500 is contained in the containing space 405, and the terminals on the side of the capacitor and the terminals of the respective power modules are connected by welding. The respective terminals are protruded from an upper end face of the flow path forming structure 12, and a welding operation is carried out by making a welding machine approach from an upper side.

The positive pole and negative pole terminals 157 and 158 of the respective power modules 300U through 300W arranged in a channel-like shape are connected to the capacitor terminals 503a through 503c provided to protrude at an upper face of the capacitor module 500. 3 of the power modules 300U through 300W are provided to surround the capacitor module 500. Therefore, positional relationships of the respective power modules 300U through 300W and the capacitor module 500 are made to be equal, and the respective power modules 300U through 300W can be connected to the capacitor module 500 with an excellent balance by using the capacitor terminals 503a through 503c having the same shape. Therefore, there is configured a structure in which circuit constants of the capacitor module 500 and the power modules 300U through 300W are made to be easy to balance in respective phases of 3 phases, and inputs and outputs of currents are made to be easy.

Figure 30:
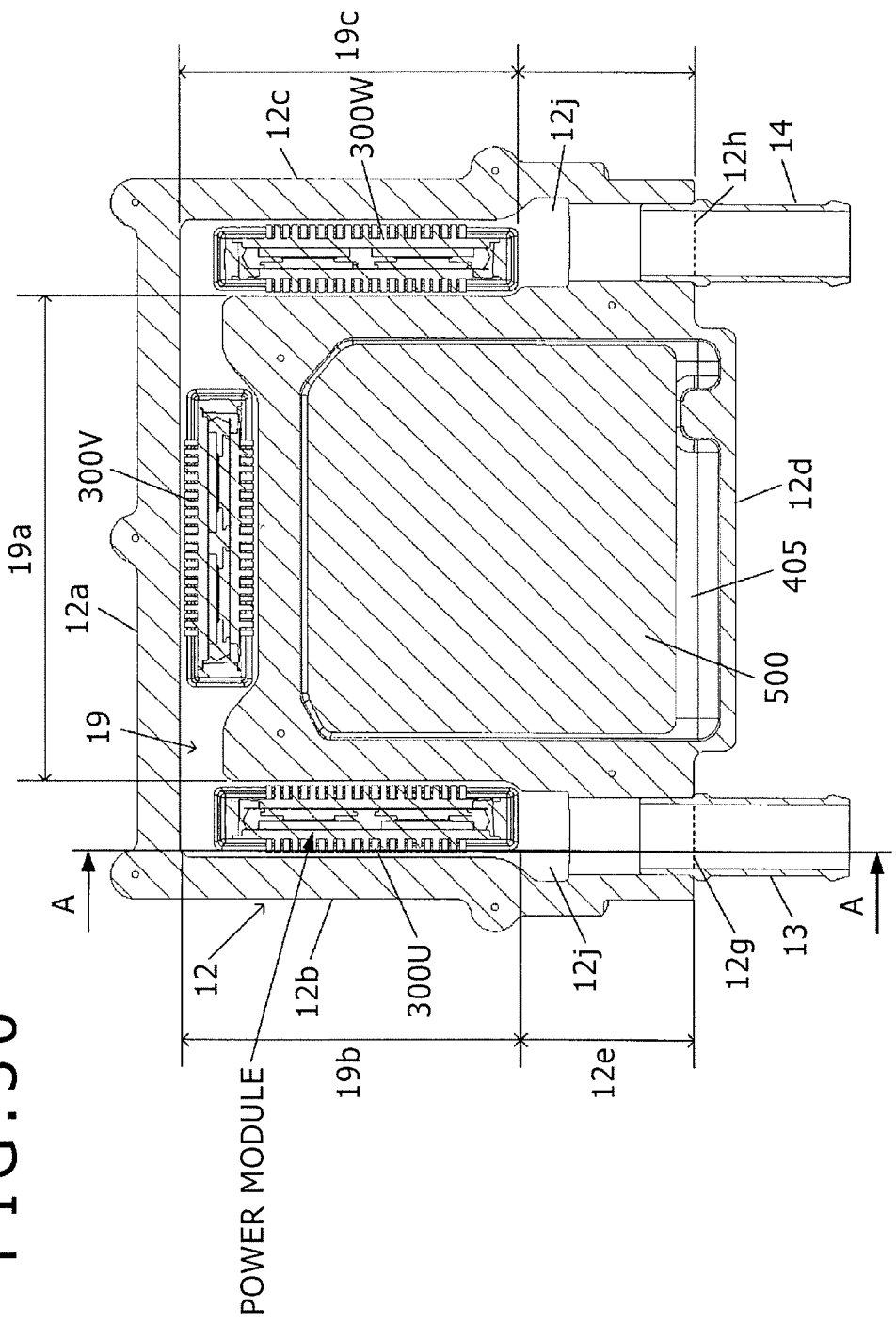
FIG. 30 is a horizontal sectional view of the flow path forming structure.

FIG. 30 is a view horizontally cutting the flow path forming structure 12 arranged with the power modules 300U through 300W and the capacitor module 500 as shown in FIG. 29. As described above, the flow path forming structure 12 is formed with the flow path 19 in the channel-like shape, and the U phase power module 300U is arranged at the flow path section 19*b* formed along the side face 12*b* on the left side of the illustration. Similarly, the V phase power module 300V is arranged at the flow path section 19*a* formed along the side face 12*a* on a side opposed to the side face 12*d* provided with the pipes 13 and 14, and the W phase power module 300W is arranged at the flow path section 19*c* formed along the side face 12 on the right side.

Openings 12*g* and 12*h* are formed at the side face 12*d* of the flow path forming structure 12. The opening 12*g* communicates with the flow path section 19*b* via a communicating path 12*e*. The opening 12*h* communicates with the flow path section 19*c* via a communicating path 12*f*. The pipes 13 and 14 arranged at the openings 12*g* and 12*h* are press-fitted to attach to the communicating paths 12*e* and 12*f*.

Figure 37:
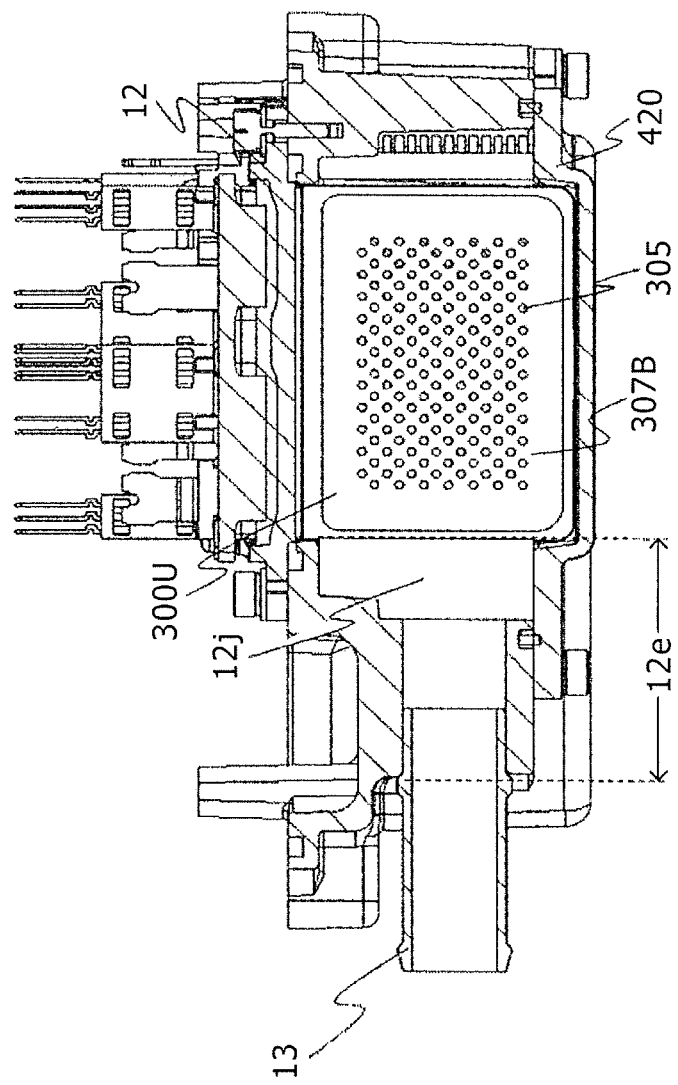
FIG. 37 is a sectional view of the flow path forming structure according to the present embodiment.

FIG. 37 shows a sectional view of the flow path forming structure 12 viewed from an arrow mark direction of A-A section of FIG. 30. Incidentally, FIG. 37 shows a state where left and right of A-A section is reversed. A shape of a flow path section of the communicating path 12*e* along a flow direction of cooling water is considerably changed. A flow of the cooling water according to the present invention is bifurcated by side faces of the power modules 300U. One flow proceeds to a side of the first heat radiating face 307A of the module case 304, and the other flow proceeds to a side of the second heat radiating face 300V of the module case 304. Incidentally, the first heat radiating face 307A is a heat radiating face on a side reverse to the second heat radiating face 307B and is not seen in FIG. 37. Therefore, a pressure loss for making the cooling water flow tends to be increased by impacting the cooling water according to the present invention to the side face of the power module 300U. It is necessary to regulate the flow of the cooling water at a vicinity of the side face portion of the power module 300U in order to restrain an increase in the pressure loss. Hence, an approach section 12*j* is formed such that a width in a height direction thereof is formed to increase in steps from the side of the inlet pipe 13 in a direction of proceeding to the power module 300U. Incidentally, the shape of the approach section 12*j* may not be formed in steps as in FIG. 37 but may be a smooth slope shape.

According to the present embodiment, the flat power modules 300U through 300W are arranged in parallel with the respective side faces 12*a* through 12*c* when the flow path 19 in the channel-like shape is formed along 3 of the side faces 12*a* through 12*c* of the flow path forming structure 12 having the plane shape substantially in the square shape, and the power modules 300U through 300W are arranged at the respective flow path sections 19*a* through 19*c*. The capacitor module 500 which is an electric equipment is contained in a center area (containing space 405) surrounded by the flow path 19. The flow path forming structure 12 containing the power modules 300U through 300W and the capacitor module 500 can be downsized by configuring such a module arrangement.

Further downsizing can be achieved by arranging at least a portion of the power module 300V arranged between a pair of the power modules 300U and 300W arranged in parallel to be brought into an area interposed by the power module 300U and 300W as shown in FIG. 30 in a case where 3 of the power modules 300U through 300W are arranged in the channel-like shape.

Figure 31:
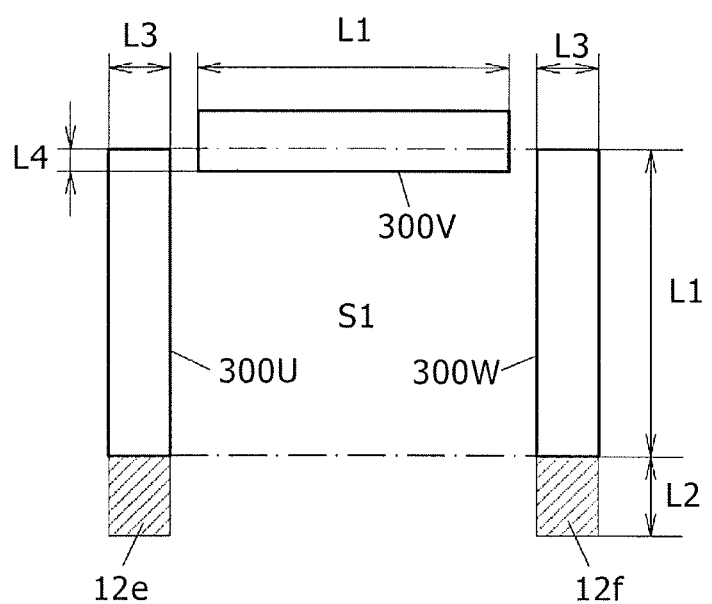
FIG. 31 is a schematic diagram for explaining an arrangement of the power module.

FIG. 31 is a schematic diagram for explaining an arrangement of 3 of the power modules 300U through 300W. Incidentally, the power modules 300U through 300W have the same structure and the same shape. As a width of the side face 12*b* or 12*c* of the flow path forming structure, there is needed at least about a total of a length L1 along the flow paths of the power modules 300U through 300W and a length L2 of the communicating path. On the other hand, with regard to the side face 12*a*, there is needed at least about the dimension L1. Naturally, actually, it is necessary to more or less adjust the dimension in consideration of a flow of the cooling water of the connecting portion of the flow path section as shown in FIG. 30.

For such purpose, it is conceivable to achieve downsizing of the power converter device 200 by making a shape when viewed in a plane view (plane shape) substantially a square shape in a case where an installation area of the power converter device 20 is intended to be as less as possible. The communicating path is needed with regard to a direction along the side face 12*b* or 12*c* as described above. Therefore, it is preferable to arrange the power module 300V such that a portion of the power module 300V is included in an area S1 between a pair of the power modules 300U and 300W as shown in FIG. 31 from a view point of downsizing.

A dimension in a horizontal direction of the illustration of the arrangement space in FIG. 31 (width dimension of side face 12*a*) is at least about L1+2·L3 when a thickness of the power module is designated by notation L3. Hence, when L3 and L4 are set such that a dimension L1+L2+(L3−L4) in a vertical direction is to a degree the same as L1+2·L3, an area in the plane view can further be reduced, and substantially a square shape can also be configured. At this occasion, the flow path section 19*a* is formed to pass an area between the power modules 300U and 300W as shown in FIG. 30. The dimension L4 of proceeding of the power module 300V to the area between the power modules 300U and 300W is set in accordance with the length L2 of the communicating path such that a ratio of width dimensions of the side faces 12*a* and 12*d* to the width dimensions of the side faces 12*b* and 12*c* becomes a prescribed value. In the example shown in FIG. 30, an interval between the power modules 300U and 300W is more or less larger than the dimension L1 of the power module 300V owing to a restriction by the dimension of the capacitor module 500.

A region upward from the pipes 13 and 14 and the hole 12*e* and the hole 12*f* to which the pipes 13 and 14 are press-fitted becomes a vacant space. Hence, an effective utilization of the vacant space is achieved, which contributes to downsizing of the power converter device 200 by forming the recessed portions 405*a* and 405*b* at the space as shown in FIG. 10, and arranging the protruded portion 500*e* which is the discharge resistor mounting portion and the protruded portion 500*f* which is a Y capacitor mounting portion of the capacitor module 500 as shown in FIG. 29. A flow of the cooling water from the inlet pipe 13 to the flow path section 19*b*, and from the flow path section 19*c* to the outlet pipe 14 becomes linear by summarizing the positions of the pipes 13 and 14 to the single side face 12*d*, and therefore, the pressure loss can be reduced. Also, an increase in the installation space of the device by protruding the pipes can be restrained and mounting performance can be improved. There is carried out a press-fitting operation at only one face of a cabinet when the pipes 13 and 14 are press-fitted to the holes 12*e* and 12*f*, and therefore, the operability and the productivity are improved.

The flow path 19 is provided to surround the three sides of the capacitor module 500, and therefore, the capacitor module 500 can effectively be cooled. Meanwhile, the power converter device 200 according to the present embodiment is for vehicle-mounting use and is generally frequently arranged in an engine room. A temperature in the engine room becomes comparatively high by heat from an engine or a running motor. Therefore, a problem is posed by an invasion of heat from surrounding to the power converter device 200. However, as shown in FIG. 30, the three sides of the capacitor module 500 is surrounded by the flow path 19 in which the cooling water flows, and therefore, the invasion of heat from the surrounding of the device can effectively be shielded.

When the power modules 300U through 300W and the capacitor module 500 are arranged at the flow path forming structure 12 as shown in FIG. 29, the bus bar assembly 800 is fixed to an upper side of the capacitor module 500 as shown in FIG. 8, and an operation of welding the terminals is carried out. According to the present embodiment, the bus bars 802U through 802W connected to the terminals of the power module 300U through 300W arranged in the channel-like shape are extended around to the upper side of the capacitor module 500 to be separated from the respective connecting portions and extended from the side of the side face 12d of the flow path forming structure 12. Therefore, the bus bars do not ride over the power modules, and the bus bars 802U through 802W can be summarized to one portion, that is, the area of the opening 10a of the housing 10 to which the alternating current interface 185 is attached (refer to FIG. 5) while ensuring sufficient insulating performance.

The power modules 300U through 300W can be made to be remote from the alternating current connector portion at which heat is generated and a temperature thereof is easy to rise, and heat can be restrained from transferring to the power modules 300U through 300W via the bus bars 802U through 802W by configuring such a bus bar structure. Even when water leaks from the flow path 19, a possibility of leaking electricity caused by leaking water can be lowered by arranging the bus bars 802U through 802W to avoid the upper side of the flow path 19.

There is configured a structure in which the bus bar assembly 800 is fixed to the flow path forming structure 12 in which cooling water flows. Therefore, not only a temperature rise of the bus bar assembly 800 can be restrained, but a temperature rise of the current sensor 180 held by the bus bar assembly 800 can be restrained. The sensor'element provided at the current sensor 180 has a property weak at heat and the reliability of the current sensor 180 can be improved by configuring such a structure described above.

After carrying out a terminal welding operation by fixing the bus bar assembly 800 to the flow path forming structure 12 as shown in FIG. 8, the driver circuit board 22 is fixed to the support member 807a formed at the holding member 803 of the bus bar assembly 800 as shown in FIG. 6. The power converter device 200 mounted on a vehicle is liable to be effected with an influence of a vibration from the vehicle. Therefore, the influence of the vibration applied to the driver circuit board 22 is reduced by constructing a configuration of supporting not only a peripheral portion but a vicinity of a center of the driver circuit board 22 by the plural support members 807a formed at the holding member 803.

For example, a resonance frequency of the driver circuit board 22 can be made to be higher than a frequency of the vibration transmitted from the vehicle side and an influence of the vibration to the driver circuit board 22 can be reduced by supporting the center portion of the driver circuit board 22 by the support member 807a. Incidentally, the driver circuit board 22 is fastened to the support member 807a by a screw.

After fixing the driver circuit board 22 to the upper side of the bus bar assembly 800, as shown in FIG. 6, the housing 10 is fixed to the flow path forming structure by a bolt, and the control circuit board 20 is fixed onto the partition wall 10c partitioning the upper containing space and the lower containing space of the housing 10. The driver circuit board 22 of the lower containing space and the control circuit board 20 of the upper containing space are connected by the flat cable 23 as shown in FIG. 7. As described above, the partition wall 10c is formed with the slid-like opening 10d for extending the flat cable 23 from the lower containing space to the upper containing space.

The power modules 300U through 300W are arranged in the channel-like shape along the three side faces 12b, 12a, and 12c of the flow path forming structure 12. Therefore, also the control terminals from the respective power modules 300U through 300W connected to the circuit board 22 are aligned in the channel-like shape along sides in correspondence with the side faces 12b, 12a and 12c of the driver circuit board 22 as shown in FIG. 6. Control signals for controlling to drive the power modules 300U through 300W are at high voltage, on the other hand, the sensor signal of the current sensor 180 and the signal by the flat cable 23 are at low voltage. Wirings of a high voltage system is preferably arranged separately from wirings of a low voltage system in order to reduce an influence of noise of the high voltage system effected to the low voltage system.

According to the present embodiment, the power modules 300U through 300W are arranged in the channel-like shape along the side faces 12b, 12a, and 12c. Therefore, an area at a vicinity of a side in correspondence with the side face 12d above the driver circuit board 22 can be used as a space remote from the control terminals. According to the present embodiment, the bus bars 802U through 802W which are detecting objects of the current sensor 180 are summarized on the side of the side face 12d. Therefore, the current sensor 180 is arranged in parallel with a vicinity of the side face 12d. Therefore, the signal terminal 182a is arranged at an area at a vicinity of the side in correspondence with the side face 12d of the driver circuit board 22 described above, and a sufficient distance can be kept from the control terminals of the high voltage system. Although in the driver circuit board 22, the flat cable 23 is arranged at a side of the driver circuit board 22 in correspondence with the side face 12c of the driver circuit board 22, the flat cable 23 is connected onto the board at a vicinity of the side face 12d remote from the control terminal such that the influence from the control terminal is reduced. Thereby, a pattern for a low voltage signal and a pattern for a high voltage signal can easily be separated on the driver circuit board 22.

An influence of noise effected on the control circuit board 20 is reduced by arranging the control circuit board 20 of the low voltage system at the upper containing space separated by the partition wall 10c, and extending the flat cable 23 from the lower containing space via the opening 10d in the slender slit-like shape. In this way, a measure against noise is sufficiently achieved in the power converter device 200 according to the present embodiment.

The power converter device 200 according to the present embodiment is constructed by a configuration to be able to carry out an operation of arranging the capacitor module 500 and the power modules 300U through 300W to the flow path forming structure 12, and fixing necessary parts of the bus bar assembly 800 and the boards successively from the lower side. Therefore, the productivity and the reliability are improved.

Figure 32:
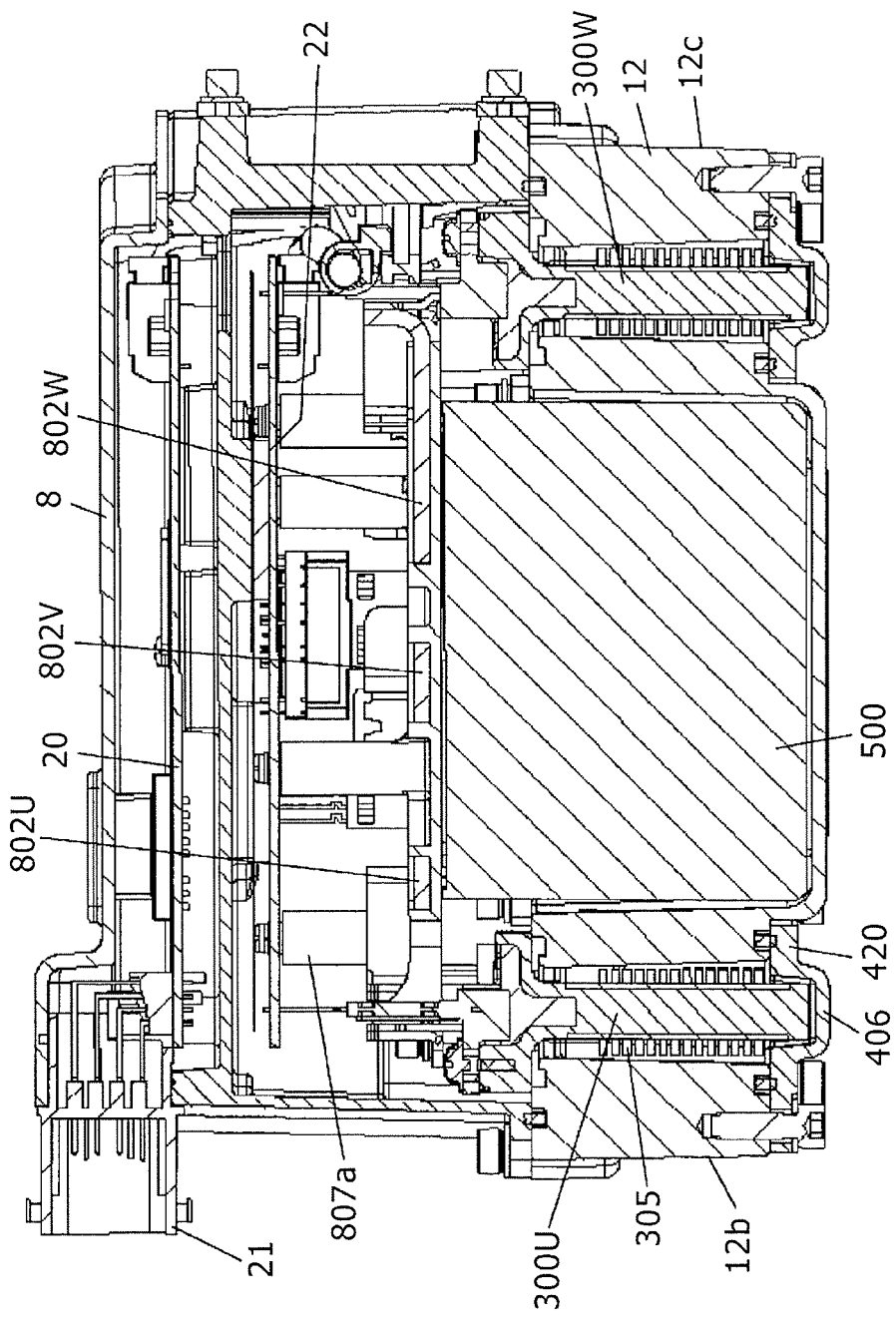
FIG. 32 is a view showing a section of the power converter device according to an embodiment of the present invention.

FIG. 32 is a view showing a section of the power converter device 200, and is a sectional view viewing the power converter device 200 from a direction of the pipes 13 and 14. The openings 402a through 402c formed at the flow path forming structure 12 are closed by the flange 304b provided at the module cases 304 of the power modules 300V, 300U, and 300W. A seal member is provided between the flange 304b and the flow path forming structure 12, and an airtightness is ensured although the illustration is omitted. According to the power modules 300U through 300W, a heat radiating face area provided with the fins 305 for radiating heat is arranged in the flow path 19, and a lower end portion which is not provided with the fins 305 is contained at an inner portion of an inner side recessed portion of the protruded portion 406 formed at the lower cover 420. Thereby, cooling water can be prevented from flowing to a space where the fins 305 are not formed. According to the power converter device 200 of the present embodiment, as shown in FIG. 32, the capacitor module 500 having a comparatively heavy weight is arranged at a center of a lower portion of the power converter device 200. Therefore, a gravity center balance of the power converter device 200 is excellent, and the power converter device 200 is difficult to act disorderly when the vibration is applied to the power converter device 200.

Figure 33:
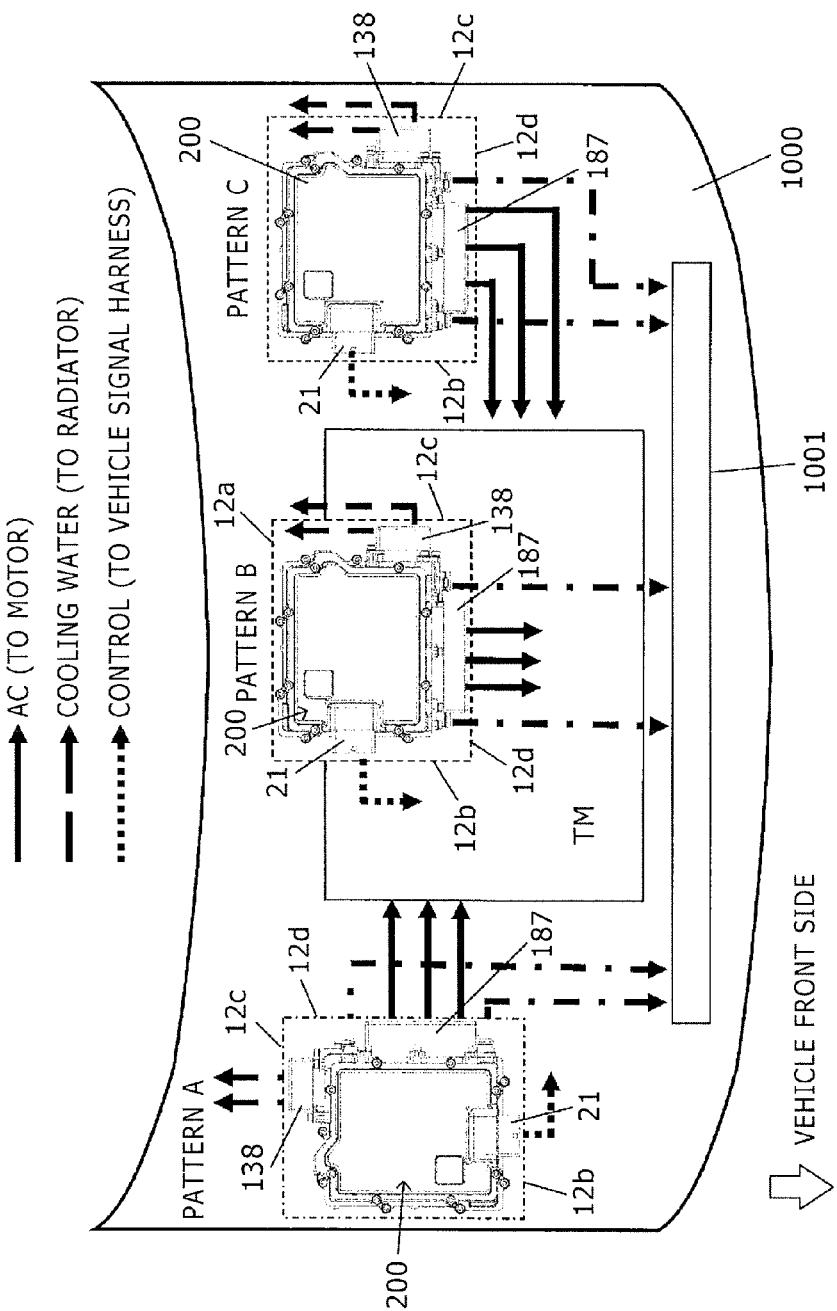
FIG. 33 is a view for explaining a layout when the power converter device according to an embodiment of the present invention is mounted on a vehicle.

FIG. 33 is a view for explaining an arrangement in a case where the power converter device 200 according to the present embodiment is mounted on a vehicle. FIG. 33 shows an arrangement in an engine room 1000 and shows three layout patterns A through C in the same view. A lower side of the illustration corresponds to a vehicle front side and a radiator 1001 is arranged on a front side of the engine room 1000. A transmission TM incorporating the motor-generator MG1 is arranged on a rear side of the radiator 1001. The connector 21 for signal is connected to a vehicle signal harness in the engine room 1000. Although the battery 136 is not illustrated in FIG. 33, the battery 136 is generally arranged at a vicinity of a center of a vehicle, that is, on a vehicle rear side of the engine room 1000 since the battery 136 is a heavy weight object.

The connection of the power converter device 200 and the vehicle side relates to an arrangement of the pipes 13 and 14 with regard to cooling water, the alternating current connector 187 for supplying an alternating current power to the motor-generator MG1, and the connector 21 for communication connected to the upper control circuit provided on the vehicle side. According to the present embodiment, the alternating current connector 187 and the pipes 13 and 14 are arranged on the side of the side face 12d of the flow path forming structure 12, the connector 21 for signal is arranged at the side face 12b, and the direct current connector 138 is arranged at the side face 12c. The alternating current wiring 187a extended from the alternating current connector 187 is extended to a lower side of the power converter device 200 by passing the interval between the pipes 13 and 14. Similarly, also the direct current wiring 138a of the direct current connector 138 is extended to the lower side of the power converter device 200.

In any case of the layout patterns A through C of FIG. 33, the power converter device 200 is arranged on an upper side of the transmission TM. The flow path 19 of the flow path forming structure 12 is supplied with cooling water of the radiator 1001. Therefore, when the arrangement of the power converter device 200 is considered, it is preferable to arrange the side face 12d provided with the pipes 13 and 14 and the alternating current connector 187 to direct in a direction of the radiator 1001 or the transmission TM in consideration of an operability of the cooling pipes and the alternating current wiring 187a. The battery 136 which is the direct current power source is arranged on a rear side of the engine room 1000, and therefore, it is preferable to arrange the side face 12c mounted with the direct current connector 138 to direct in a rear direction in consideration of extending of the direct current wiring 138a.

In a case of arranging the power converter device 200 in the engine room 1000, there are conceivable three layout patterns A through C shown in FIG. 33. It is preferable to arrange the side face 12d to direct in a direction of the transmission TM in layout pattern A, and it is preferable to arrange the side face 12d to direct in the direction of the radiator 1001 in layout patterns B and C in consideration of a connecting relationship among the radiator 1001, the battery 136, and the transmission TM described above.

In layout pattern A, the direct current connector 138, the alternating current connector 187, and the connector 21 for signal are directed in directions preferable in view of wiring layout. The pipes 13 and 14 are directed in the direction of the transmission TM. Therefore, it is necessary to bend the cooling pipe in the direction of the radiator 1001. However, the alternating current wiring 187a is extended from the alternating current connector 187 to the lower side, and therefore, an interference of the cooling pipes and the alternating current wiring 187a can be avoided, and a deterioration in an operability can also be prevented.

In a case of layout pattern B, the pipes 13 and 14, the alternating current connector 187, and the connector 21 for signal are directed in preferable directions. Although the direct current connector 138 is directed in the side direction of the vehicle, the direct current wiring 138a extended from the direct current connector 138 to a lower side may only be extended to a rear side, and therefore, the deterioration in the operability can be avoided.

In a case of layout pattern C, the layout of the cooling pipe is made to be predominant, and the side face 12d is arranged to direct in the direction of the radiator 1001. In this case, although the alternating current wiring 187a is extended in the direction of the transmission TM, the alternating current wiring 187a is extended to a lower side by passing the interval between the pipes 13 and 14, and therefore, the alternating current wiring 187a and the cooling pipe do not interfere with each other. Therefore, there is not a hazard in a piping operation and a wiring operation.

In this way, according to the power converter device 200 of the present embodiment, the arrangement of the pipes 13 and 14, the direct current connector 138, the alternating current connector 187, and the connector 21 for signal becomes a preferable arrangement in view of arranging to the engine room 1000. Therefore, there can be provided the power converter device 200 capable of dealing with various situations of layout patterns A through C and excellent in mounting performance.

The embodiment described above is constructed by a configuration in which a unit interposing the power semiconductor elements by the conductor plates is contained in the module case 304 having radiating faces formed with the fins 305 on both of a surface and a rear face in the power modules 300U through 300W. Therefore, when the power modules 300U through 300W are provided at the flow path 19, the power modules are arranged at the center of the flow path. However, the method of arranging the power module is not limited to the above-described but various arrangements thereof can be carried out.

Figure 34:
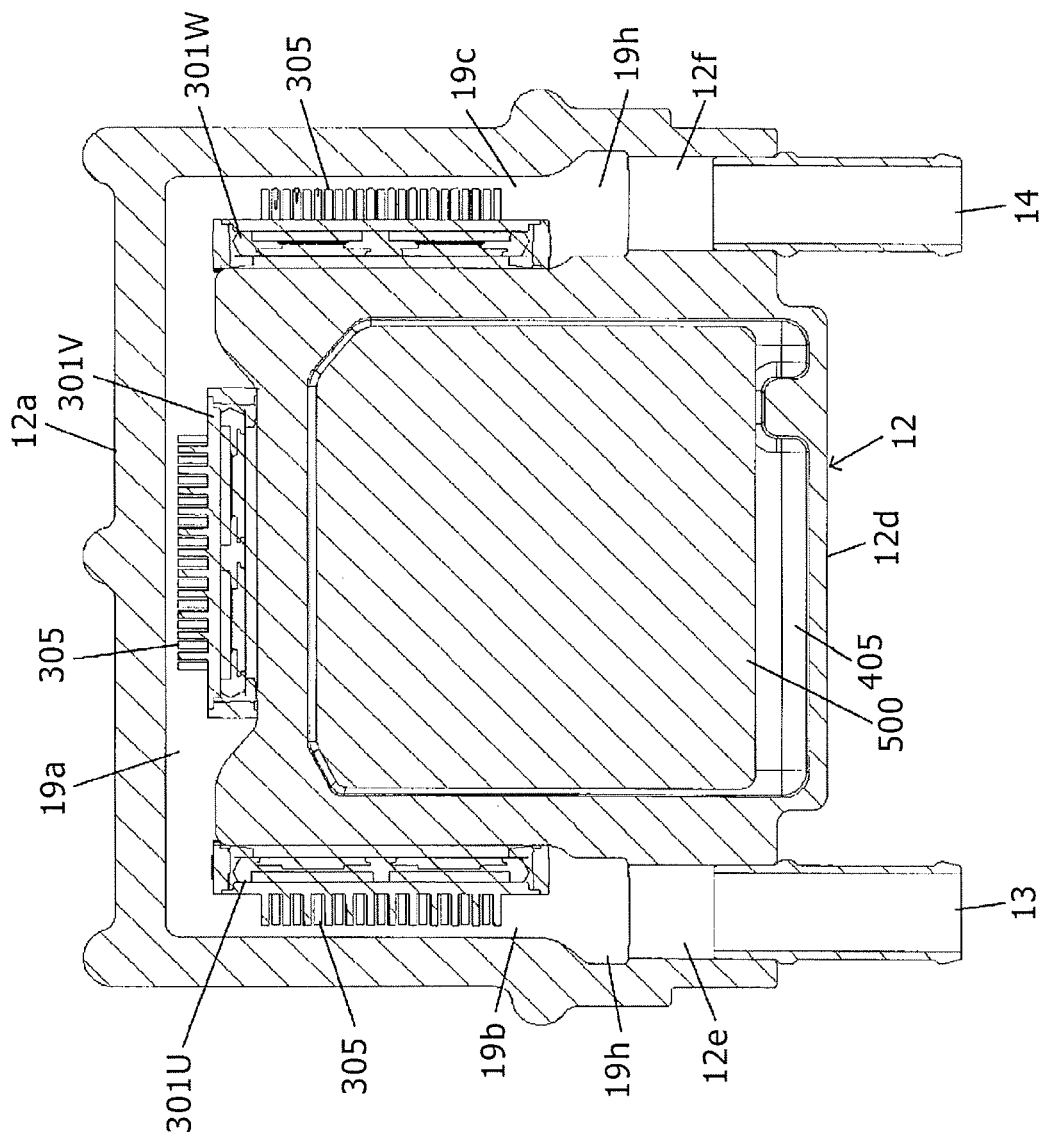
FIG. 34 is view showing a modified example of an arrangement of the power module according to the present embodiment.
Figure 35:
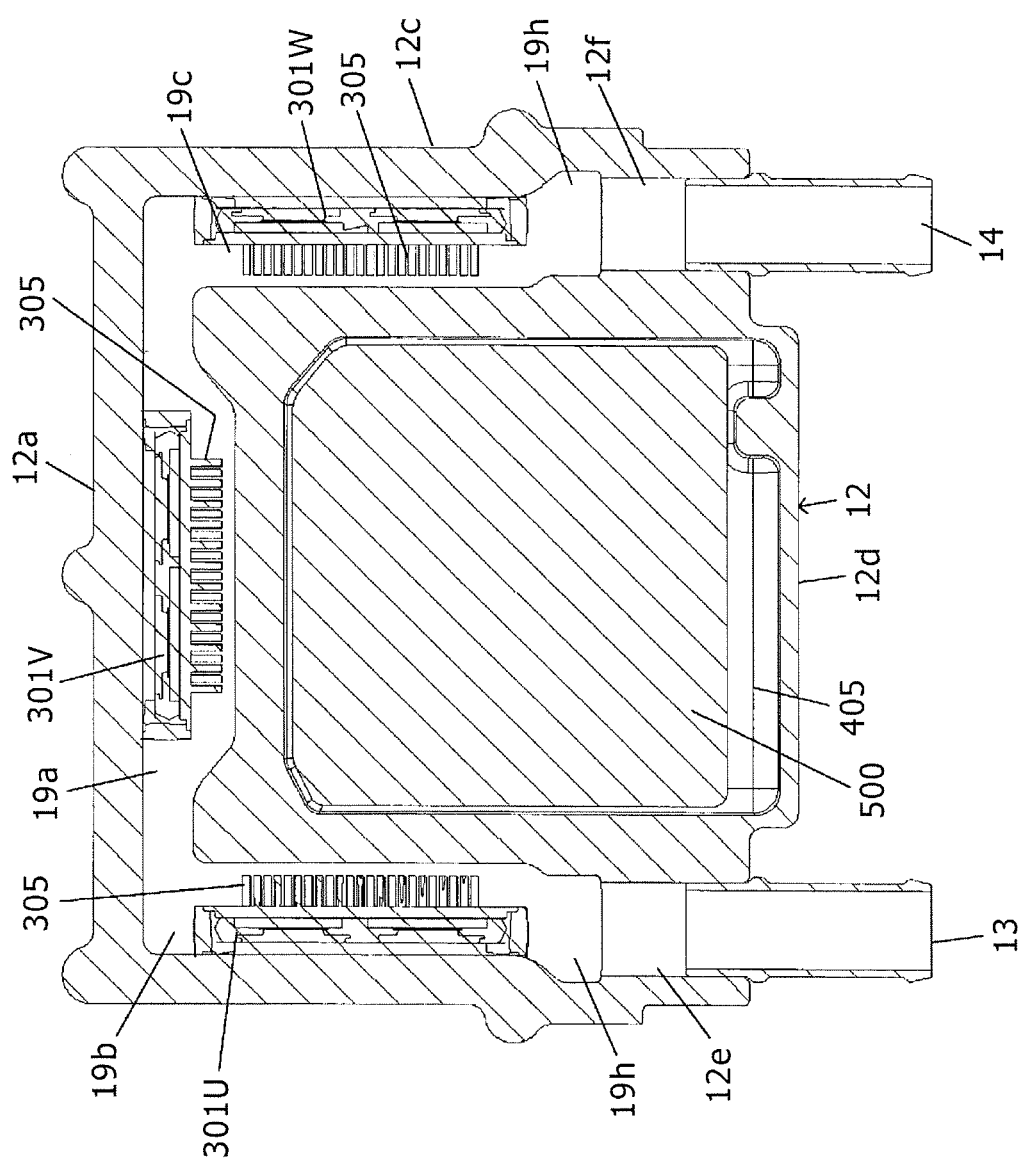
FIG. 35 is view showing a modified example of the arrangement of the power module according to the present embodiment.

Modified examples shown in FIG. 34 and FIG. 35 show arrangement methods in a case of a power module configuring the heat radiating face only by one face of the module case. Power modules 301U through 301W correspond to the power modules 300U through 300W described above, and the fins 305 for radiating heat are formed only at one face of the power module in a flat shape.

In a case of FIG. 34, the power modules 301V, 301U, and 301W are respectively arranged to be brought into close contact with inner peripheral faces of the flow path sections 19a through 19c, that is, a wall face surrounding the capacitor module 500. The cooling water flows along a heat radiating face formed with the fin 305. On the other hand, in an example shown in FIG. 35, contrary to the case of FIG. 34, the power module 301V, 301U, and 301W are respectively arranged to be brought into close contact with outer peripheral faces of the flow path sections 19a through 19c.

Figure 36:
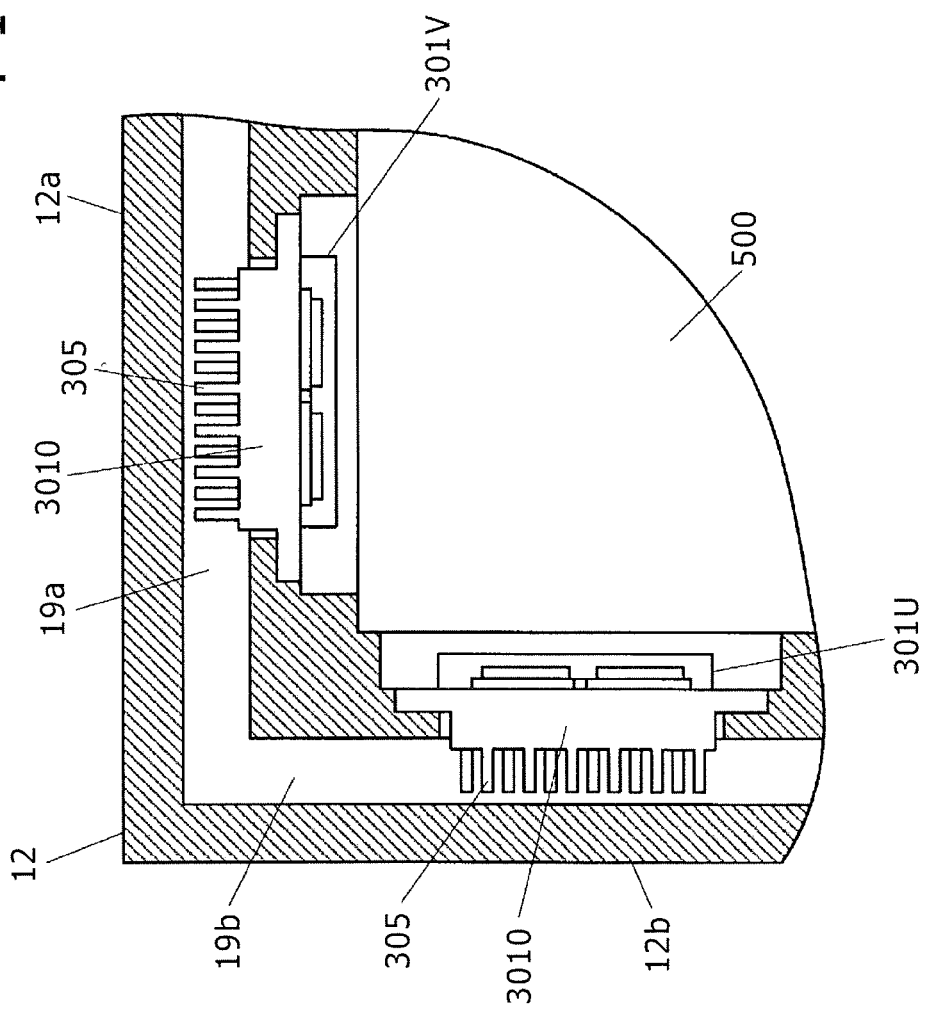
FIG. 36 is a view showing a modified example of the arrangement of the power module according to the present embodiment.

Although in the modified examples shown in FIGS. 34 and 35, a total of the power modules 301U through 301W is arranged in the flow path 19, the power modules 301U through 301W may be arranged such that only heat radiating faces thereof are exposed in the flow path 19 as in a modified example shown in FIG. 36. Although the example shown in FIG. 36 is constructed by a configuration in which a power semiconductor element is provided on a heat radiating plate 3010, and the fin 305 is formed on a back face side of the heat radiating plate 3010, the power modules 301U through 301W can be arranged similarly even in a configuration of being covered by casings as shown in FIGS. 34 and 35.

As has been explained above, the power converter device 200 described in the present embodiment achieves an operation and an effect as follows.

The power converter device 200 includes the power modules 300U through 300W which are the semiconductor modules in the flat shape respectively provided for respective three phases of the 3 phase inverter circuit 140 and incorporating the series circuits 150, the containing space 405 containing the electric equipment, and the flow path forming structure 12 in the rectangular prism shape having the coolant flow path formed to surround the containing space 405. The flow path 19 which is the coolant flow path includes the flow path section 19a provided along the side face 12a of the flow path forming structure 12, the flow path section 19b provided along the side face 12b contiguous to one side of the side face 12a, and connected to one end of the flow path section 19a, and the side face 12c provided along the side face 12c contiguous to the other side of the side face 12a, and connected to the other end of the flow path section 19a. The power module 300V is arranged at the flow path section 19a in parallel with the side face 12a, the power module 300U is arranged at the flow path section 19b in parallel with the side face 12b, and the power module 300W is arranged at the flow path section 19c in parallel with the side face 12c.

Therefore, the three power modules 300U through 300W surround the containing space 405 in the channel-like shape, and the plane view shape of the flow path forming structure 12 can be made to be substantially the square shape. Thereby, the flow path forming structure 12 can further be downsized, and downsizing of the power converter device 200 can be achieved.

As described above, in a hybrid automobile, the power converter device is frequently mounted in an engine room, and an environmental temperature of the power converter device is considerably elevated by heat generated from an engine or a running motor. Therefore, in the power converter device for vehicle mounting use, there is a case where it is necessary to cool not only a power module incorporating a semiconductor element, but other electric equipment included in the power converter device.

According to the present embodiment, not only heat generated by an electric equipment per se can efficiently be radiated, but invasion of heat from a surrounding environment to the electric equipment can be prevented by containing the electric equipment of, for example, the capacitor module 500 into the containing space 405 three faces of which are surrounded by the flow path 19.

An operation of press-fitting the pipes 13 and 14 is made to be easy to carry out, and an operation of connecting to a cooling pipe on the vehicle side is made to be easy to carry out by providing the pipes 13 and 14 at the one face 12d. The flow path from the flow in opening 12g to the flow path section 19b, and the flow path from the flow path section 19c to the flow out opening 12h are made to be linear, and therefore, the pressure loss at the sections can be reduced.

There are provided the bus bars 802U through 802W which are connected to the alternating current output terminals of the power modules 300U through 300W, and extended to the side face 12d of the flow path forming structure 12 by passing the upper side of the containing space 405. Thereby, members which are provided by being protruded from the side face of the flow path forming structure 12, that is, the alternating current connectors 807 connected to the bus bars 802U through 802W and the pipes 13 and 14 are summarized to the single face 12d, and therefore, the power converter device 200 can be downsized. Also, layout of a cooling pipe and an alternating current wiring in being mounted to a vehicle is made to be easy to carry out, and the mounting performance is improved. The bus bars 802U through 802W are extended around to the side face 12d which is a vacant space without riding over the flow path 19, and therefore, insulating performance of the bus bars 802U through 802W is improved. Distances between the connector portions of the bus bars 802U through 802W and the power modules 300U through 300W are made to be long, and therefore, transfer or heat generated at the connector portions to the power modules 300U through 300W can be reduced.

Invasion of heat from outside to the capacitor module 500 can be prevented by containing the capacitor module 500 which is a heavy weight object to the containing space 405 which is formed substantially at a center of the flow path forming structure 12 and three faces of which are surrounded by the flow path 19. Also, a gravity center balance is improved since the heavy weight object is arranged at the flow path forming structure 12, and the power converter device 200 can be prevented from acting disorderly in a case where a vibration is applied from outside. Connecting relationships between the capacitor module 500 and the three power modules 300U through 300W can be made to be equal, and currents are made to be easy to be outputted and inputted.

The alternating current interface 185 connected to the three bus bars 802U through 802W is provided on the side of the side face 12d, and therefore, the cooling pipe connecting portion and the alternating current wiring connecting portion are summarized to the same face, and can be summarized compactly. The mounting performance is improved by extending the alternating current wiring 187a from the alternating current connector 187 connected to the alternating current interface 185 in a direction of a bottom face of the flow path forming structure 12 by passing the interval between the coolant flow inlet (opening 12g) and the coolant flow outlet (opening 12h). The alternating current connector 187 and the pipes 13 and 14 are arranged at the same side face 12d. The alternating current wiring 187a is extended in the direction of the bottom face by passing the interval between the pipes 13 and 14. Therefore, the operability is improved, and the cooling pipe and the alternating current wiring are made to be easy to be extended around.

The current sensor module 180 is arranged such that the sensor elements of detecting currents flowing in the bus bars 802U through 802W are arranged along the extending direction of the side face 12d. Therefore, the sensor signal line of a weak electricity system can be wired remotely from the power modules 300U through 300W of a strong electricity system, and an influence of noise can be reduced.

The respective embodiments described above may be used respectively by themselves, or in combination. This is because effects of the respective embodiments can be achieved by themselves or synergetically. The present invention is not limited to the embodiments described above at all so far as the features of the present invention are not deteriorated. Also other modes which are conceivable within the range of the technical thought of the present invention are included in the range of the present invention.

The present application is on the basis of Japanese Unexamined Patent Application No. 2010-14072 (filed on Jun. 21, 2010), and the content is incorporated herein as a citation.

The invention claimed is:

1. A power converter device comprising:
    first through third semiconductor modules respectively provided for three phases of a 3 phase inverter circuit, and incorporating upper and lower arm series circuits;
    a flow path forming cabinet in a rectangular prism shape having an electric equipment containing space and a coolant flow path formed to surround the electric equipment containing space; and
    first through third bus bars connected to respective alternating current output terminals of the first through the third semiconductor modules, and extended to a side of a fourth side face of the flow path forming cabinet by passing an upper side of the electric equipment containing space, and
    wherein the coolant flow path includes a first flow path provided along a first side face of the flow path forming cabinet, a second flow path provided along a second side face contiguous to one side of the first side face, and connected to one end of the first flow path, and a third flow path provided along a third side face contiguous to the other side of the first side face, and connected to the other end of the first flow path,
    wherein the first semiconductor module is arranged at the first flow path in parallel with the first side face,
    wherein the second semiconductor module is arranged at the second flow path in parallel with the second side face,
    wherein the third semiconductor module is arranged at the third flow path in parallel with the third side face, and
    wherein the first flow path is formed such that at least one portion of the first semiconductor module is arranged at an area interposed by the second and the third semiconductor modules.

2. The power converter device according to claim 1, further comprising:
    a coolant flow inlet and a coolant flow outlet formed at a fourth side face of the flow path forming cabinet;
    a first communicating path communicating the coolant flow inlet and the second flow path; and
    a second communicating path communicating the coolant flow outlet and the third flow path;
    wherein a coolant supplied from the coolant flow inlet is configured to flow in an order of the second flow path, the first flow path, and the third flow path, and to be discharged from the coolant flow outlet.

3. The power converter device according to claim 1, further comprising:
    a smoothing capacitor provided on a direct current input side of the 3 phase inverter circuit,
    wherein the smoothing capacitor is arranged at the electric equipment containing space.

4. The power converter device according to claim 1,
    wherein approach sections for adjusting a flow of a coolant are respectively formed on a side of the second flow path of the first communicating path and on a side of the third flow path of the second communicating path; and
    wherein a dimension of making the first semiconductor module proceed to the area is set in accordance with a length of the communicating paths such that a ratio of a width dimension of the first and the fourth side faces to a width dimension of the second and the third side faces becomes a prescribed value.

5. The power converter device according to claim 1, wherein a connector connecting portion for connecting an alternating current connector to the first through the third bus bars is arranged on the side of the fourth side face.

6. The power converter device according to claim 5, further comprising:
    an alternating current connector having an alternating current wiring connected to the connector connecting portion and extended in a direction of a bottom face of the flow path forming cabinet by passing an interval between the coolant flow inlet and the coolant flow outlet.

7. The power converter device according to claim 1, wherein first through third current sensors for respectively detecting currents flowing in the first through the third bus bars are arranged along an extending direction of the fourth side face.

8. The power converter device according to claim 1, further comprising:
    a driver circuit board outputting a drive signal of driving the first through the third power modules and arranged on upper sides of the first through the third bus bars,
    wherein the first through the third power modules include a control terminal of transmitting the drive signal of the driver circuit board, and
    wherein the control terminal is extended to the driver circuit board, and connected to the driver circuit board.

* * * * *